(12) United States Patent
Jang et al.

(10) Patent No.: US 12,347,819 B2
(45) Date of Patent: Jul. 1, 2025

(54) SEMICONDUCTOR PACKAGE HAVING STACKED SEMICONDUCTOR CHIPS

(71) Applicant: SAMSUNG ELECTRONICS CO., LTD., Suwon-si (KR)

(72) Inventors: Aenee Jang, Seoul (KR); Seungduk Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 414 days.

(21) Appl. No.: 17/819,231

(22) Filed: Aug. 11, 2022

(65) Prior Publication Data

US 2023/0133116 A1 May 4, 2023

(30) Foreign Application Priority Data

Nov. 3, 2021 (KR) .................. 10-2021-0149953

(51) Int. Cl.
*H01L 25/18* (2023.01)
*H01L 23/00* (2006.01)
*H01L 23/48* (2006.01)
*H01L 23/498* (2006.01)

(52) U.S. Cl.
CPC ............ *H01L 25/18* (2013.01); *H01L 23/481* (2013.01); *H01L 23/49822* (2013.01); *H01L 24/05* (2013.01); *H01L 24/08* (2013.01); *H01L 2224/05647* (2013.01); *H01L 2224/08146* (2013.01)

(58) Field of Classification Search
None
See application file for complete search history.

(56) References Cited

U.S. PATENT DOCUMENTS

| | | |
|---|---|---|
| 8,552,567 B2 | 10/2013 | England et al. |
| 9,349,714 B2 | 5/2016 | Nakamura et al. |
| 9,978,694 B2 | 5/2018 | Cho et al. |
| 10,770,366 B2 | 9/2020 | Yu et al. |
| 10,770,430 B1 | 9/2020 | Kim et al. |
| 10,770,445 B2 | 9/2020 | Han |

(Continued)

FOREIGN PATENT DOCUMENTS

CN 106910736 6/2017

*Primary Examiner* — William C Trapanese
(74) *Attorney, Agent, or Firm* — MORGAN, LEWIS & BOCKIUS LLP

(57) ABSTRACT

A semiconductor package includes a first semiconductor chip including a first semiconductor substrate having an active surface and an inactive surface and a plurality of first through electrodes passing through the first semiconductor substrate. A plurality of second semiconductor chips each includes a second semiconductor substrate having an active surface and an inactive surface. A plurality of second through electrodes passes through the second semiconductor substrate. A plurality of coupling pads is disposed between the first semiconductor chip and the second semiconductor chips. A plurality of chip coupling insulation layers is disposed between the first semiconductor chip and the second semiconductor chips and at least partially surrounds the coupling pads. At least one supporting dummy substrate is stacked on the second semiconductor chips. At least one supporting coupling insulation layer is disposed on a bottom surface of the at least one supporting dummy substrate.

20 Claims, 54 Drawing Sheets

(56) References Cited

U.S. PATENT DOCUMENTS

| | | |
|---|---|---|
| 2017/0179078 A1 | 6/2017 | Jung et al. |
| 2021/0118756 A1 | 4/2021 | Wan et al. |
| 2021/0167040 A1 | 6/2021 | You et al. |
| 2023/0074933 A1* | 3/2023 | Jee .......................... H01L 24/80 |

* cited by examiner

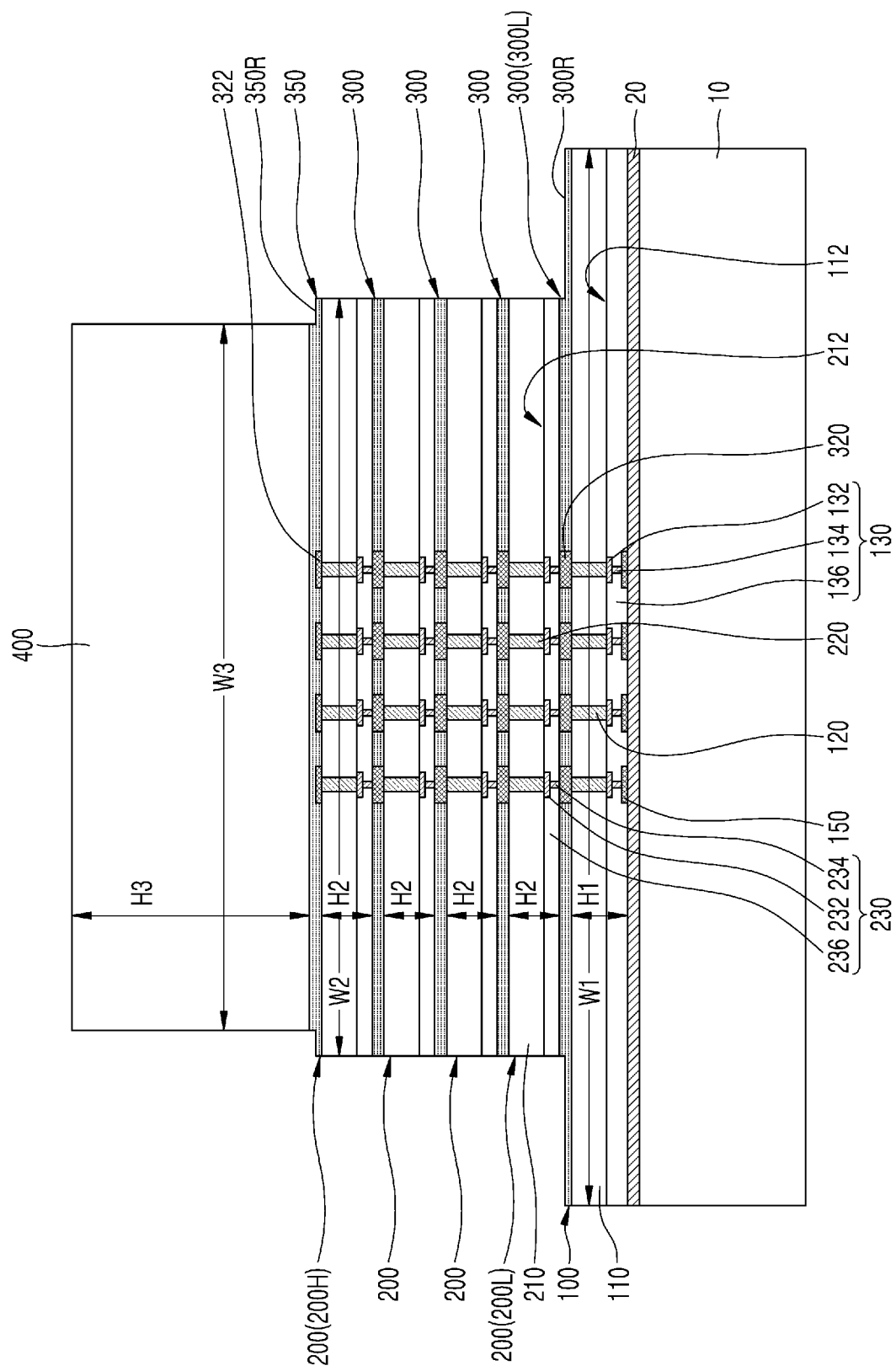

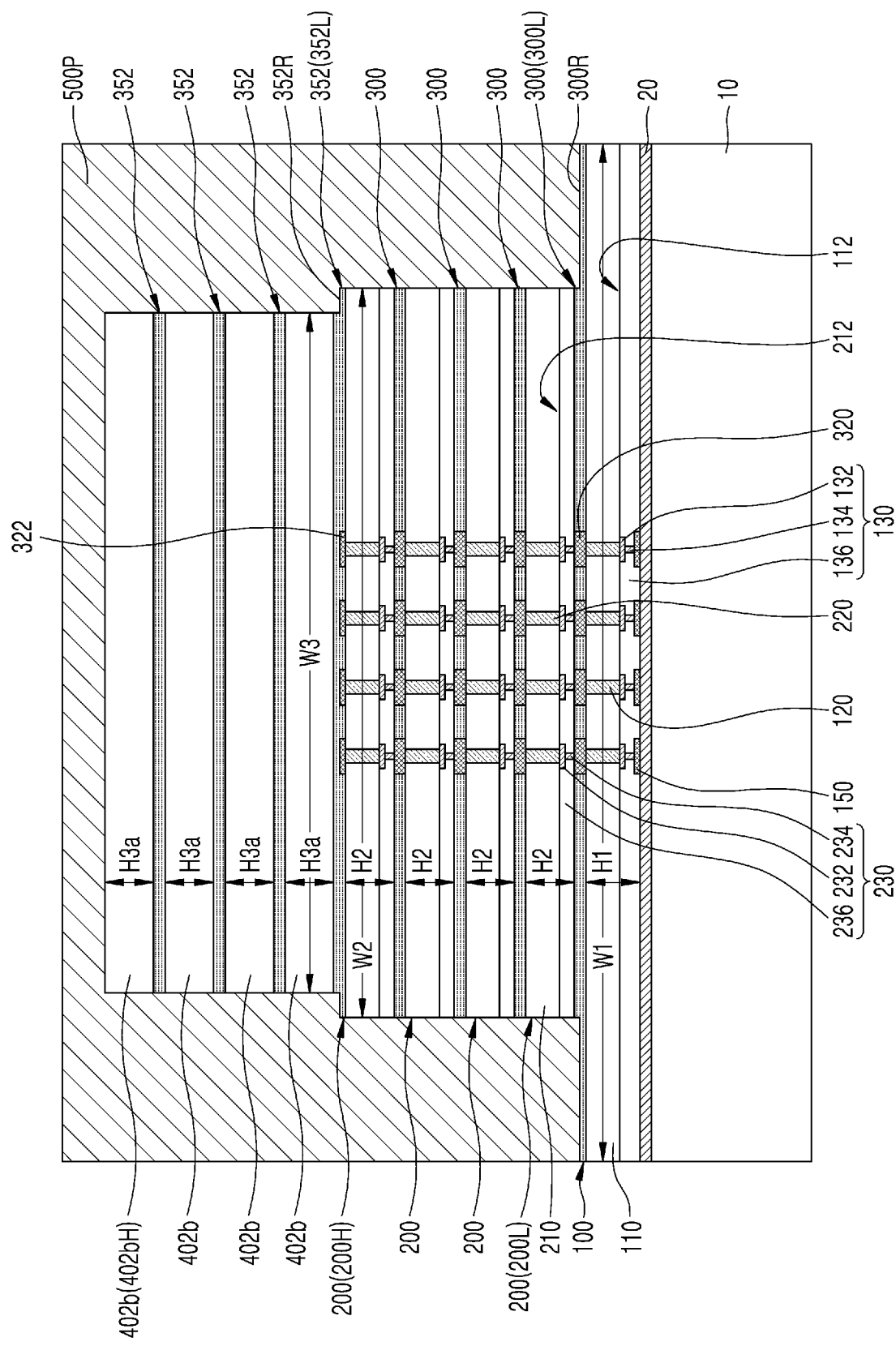

SEMICONDUCTOR PACKAGE HAVING STACKED SEMICONDUCTOR CHIPS

CROSS-REFERENCE TO RELATED APPLICATION

This application is based on and claims priority under 35 U.S.C. § 119 to Korean Patent Application No. 10-2021-0149953, filed on Nov. 3, 2021, in the Korean Intellectual Property Office, the disclosure of which is incorporated by reference herein in its entirety.

TECHNICAL FIELD

The inventive concept relates to a semiconductor package, and more particularly, to a semiconductor package having stacked semiconductor chips.

DISCUSSION OF THE RELATED ART

Semiconductor packages are becoming more compact while at the same time, performance such as capacity and speed are increasing. One approach for increasing the performance of packaged semiconductor chips while reducing package size is to stack multiple semiconductor chips within a single semiconductor package.

SUMMARY

The semiconductor package includes a first semiconductor chip including a first semiconductor substrate and a plurality of first through electrodes. The first semiconductor substrate has an active surface and an inactive surface. The plurality of first through electrodes pass through the first semiconductor substrate. A plurality of second semiconductor chips each include a second semiconductor substrate and a plurality of second through electrodes. The second semiconductor substrate has an active surface and an inactive surface. The plurality of second through electrodes pass through the second semiconductor substrate. The plurality of second semiconductor chips is stacked on the first semiconductor chip and each of the plurality of second semiconductor chips has a same vertical height. The active surface of the second semiconductor substrate faces the inactive surface of the first semiconductor substrate. A plurality of coupling pads is disposed between the first semiconductor chip and the plurality of second semiconductor chips and is configured to electrically connect the plurality of first through electrodes to the plurality of second through electrodes. A plurality of chip coupling insulation layers is disposed between the first semiconductor chip and the plurality of second semiconductor chips and at least partially surrounds the plurality of coupling pads. At least one supporting dummy substrate is stacked on the plurality of second semiconductor chips. At least one supporting coupling insulation layer is disposed on a bottom surface of the at least one supporting dummy substrate. Each of the plurality of second semiconductor chips has a same warpage shape bulging in one direction.

A semiconductor package includes a high-bandwidth memory (HBM) controller die including a first semiconductor substrate and a plurality of first through electrodes. The first semiconductor substrate has an active surface and an inactive surface. The plurality of first through electrodes pass through at least a portion of the first semiconductor substrate. A plurality of dynamic random access memory (DRAM) dies each include a second semiconductor substrate and a plurality of second through electrodes. The second semiconductor substrate has an active surface and an inactive surface. The plurality of second through electrodes pass through the second semiconductor substrate. The plurality of DRAM dies is stacked on the HBM controller die and each of the plurality of DRAM dies has a same vertical height. The active surface of the second semiconductor substrate faces the inactive surface of the first semiconductor substrate. A plurality of coupling pads is disposed between the HBM controller die and the plurality of DRAM dies and is configured to electrically connect the plurality of first through electrodes to the plurality of second through electrodes. A plurality of chip coupling insulation layers is disposed between the HBM controller die and the plurality of DRAM dies and at least partially surround the plurality of coupling pads. A supporting dummy substrate is stacked on the plurality of DRAM dies. A supporting coupling insulation layer is disposed on a bottom surface of the supporting dummy substrate. A plurality of top chip connection pads is disposed on a top surface of an uppermost DRAM die among the plurality of DRAM dies. The plurality of top chip connection pads is in contact with the plurality of second through electrodes of the uppermost DRAM die and is at least partially surrounded by the supporting coupling insulation layer covering the top surface of the uppermost DRAM die.

A semiconductor package includes a base redistribution layer including a plurality of package redistribution line patterns. A plurality of package redistribution vias are respectively in contact with and are connected to some of the plurality of package redistribution line patterns. A package redistribution insulation layer at least partially surrounds the plurality of package redistribution line patterns and the plurality of package redistribution vias. An HBM controller die includes a first semiconductor substrate and a plurality of first through electrodes. The first semiconductor substrate has a first active surface and a first inactive surface. The plurality of first through electrodes pass through the first semiconductor substrate. The HBM controller die is disposed on the base redistribution layer. The first active surface faces the base redistribution layer. A plurality of DRAM dies each include a second semiconductor substrate and a plurality of second through electrodes. The second semiconductor substrate has a second active surface and a second inactive surface. The plurality of second through electrodes pass through the second semiconductor substrate. The plurality of DRAM dies are stacked on the HBM controller die and have a same vertical height as each other and a horizontal width that is less than a horizontal width of the HBM controller die. The second active surface of the second semiconductor substrate faces the first inactive surface of the first semiconductor substrate. A plurality of coupling pads are disposed between the HBM controller die and the plurality of DRAM dies and are configured to electrically connect the plurality of first through electrodes to the plurality of second through electrodes. A plurality of chip coupling insulation layers are disposed between the HBM controller die and the plurality of DRAM dies and at least partially surround the plurality of coupling pads. A supporting dummy substrate is stacked on an uppermost DRAM die among the plurality of DRAM dies. A plurality of top chip connection pads are disposed on a top surface of the uppermost DRAM die among the plurality of DRAM dies. The plurality of top chip connection pads are in contact with the plurality of second through electrodes of the uppermost DRAM die. A supporting coupling insulation layer covers the top surface of the uppermost DRAM die, side and top surfaces of the plurality of top chip connection pads, and a bottom surface of the supporting dummy substrate and fills between the uppermost DRAM die and the supporting dummy substrate. A package molding layer is disposed on the HBM controller die. The package molding layer covers a top surface of the HBM controller die, side surfaces of the plurality of DRAM dies, and side surfaces of the supporting dummy substrate and exposes a top surface of the supporting dummy substrate. The HBM controller die and the plurality of DRAM dies have a same warpage shape bulging in one direction.

BRIEF DESCRIPTION OF THE DRAWINGS

Embodiments of the inventive concept will be more clearly understood from the following detailed description taken in conjunction with the accompanying drawings, in which:

FIGS. 5A to 5I are cross-sectional views of a method of manufacturing a semiconductor package, according to embodiments;

FIGS. 11A and 11B are cross-sectional views of a method of manufacturing a semiconductor package, according to embodiments;

DETAILED DESCRIPTION OF THE EMBODIMENTS

Figure 1A:
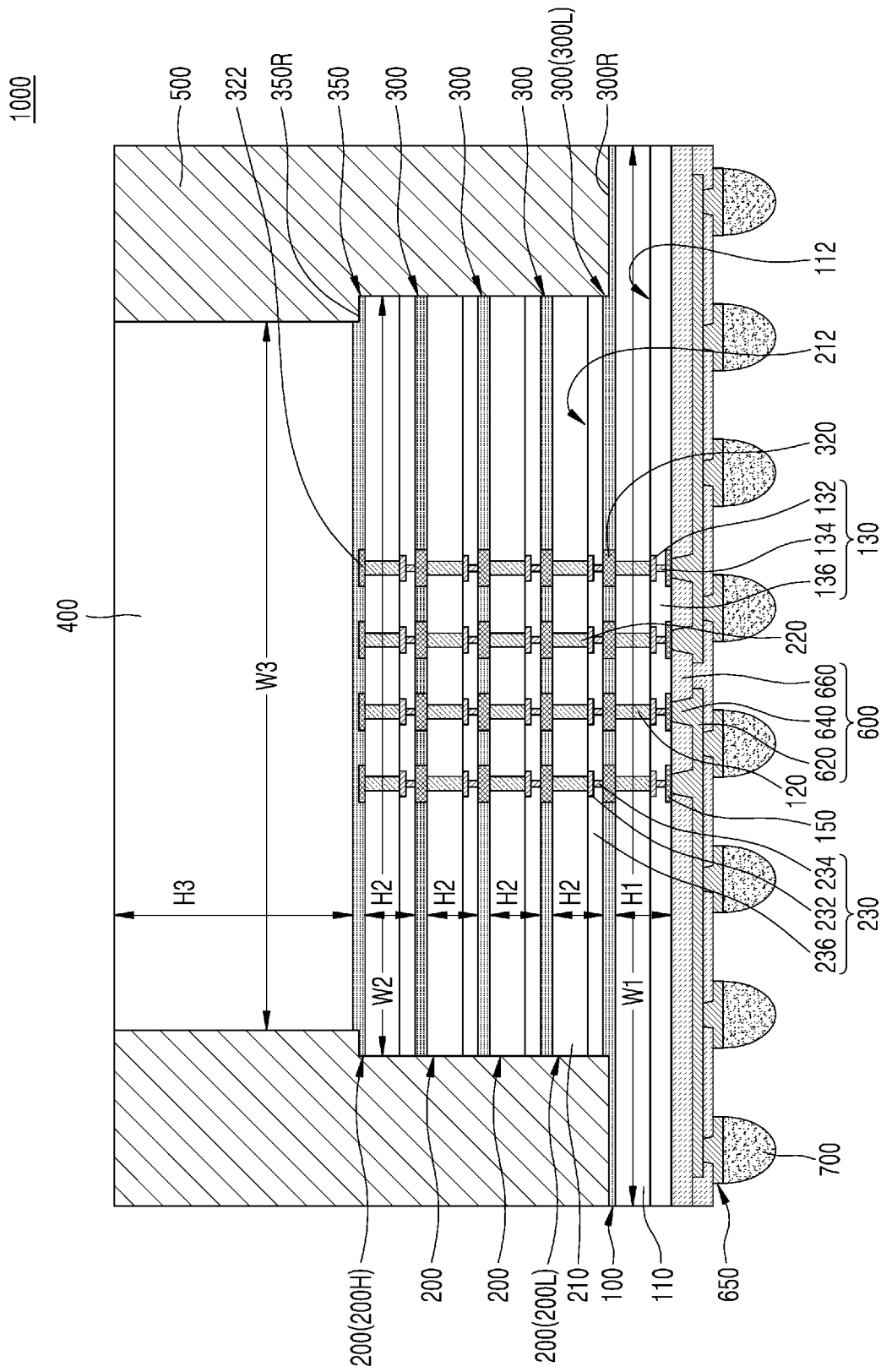
FIGS. 1A, 1B, 1C, 1D, 2A, 2B, 2C, 2D, 2E, 2F, 2G, 2H, 3A, 3B, 3C, 3D, 3E, 3F, 4A, 4B, 4C, 4D, 4E, 4F, 4G, and 4H are cross-sectional views of a method of manufacturing a semiconductor package, according to embodiments.

FIGS. 1A, 1B, 1C, 1D, 2A, 2B, 2C, 2D, 2E, 2F, 2G, 2H, 3A, 3B, 3C, 3D, 3E, 3F, 4A, 4B, 4C, 4D, 4E, 4F, 4G, and 4H are cross-sectional views of a method of manufacturing a semiconductor package, according to embodiments. In FIGS. 1A to 4H, like reference numerals may denote like elements throughout the specification and disclosure, and to the extent that a description of an element is omitted, it may be assumed that the element is at least similar to corresponding elements that have been described elsewhere within the specification.

Referring to FIG. 1A, a semiconductor package 1000 may include a first semiconductor chip 100 and a plurality of second semiconductor chips 200. Although it is illustrated in FIG. 1A that the semiconductor package 1000 includes four second semiconductor chips 200, the present invention is not necessarily limited thereto. For example, the semiconductor package 1000 may include two or more second semiconductor chips 200. In some embodiments, the semiconductor package 1000 may include a multiple of 4 second semiconductor chips 200. The second semiconductor chips 200 may be sequentially stacked on the first semiconductor chip 100. For convenience of description, the second semiconductor chip 200 at the bottom, among the second semiconductor chips 200, may be referred to as a lowermost second semiconductor chip 200L, and the second semiconductor chip 200 at the top, among the second semiconductor chips 200, may be referred to as an uppermost second semiconductor chip 200H.

The first semiconductor chip 100 and the second semiconductor chips 200 of the semiconductor package 1000 may be electrically connected to each other through a plurality of coupling pads 320 and may thus exchange signals with each other and provide power and ground. For example, the coupling pads 320 may be disposed between the first semiconductor chip 100 and the lowermost second semiconductor chip 200L and between two adjacent second semiconductor chips 200.

For example, the coupling pads 320 may include a material including copper (Cu). A coupling pad 320 disposed between the first semiconductor chip 100 and the lowermost second semiconductor chip 200L may be referred to as a first coupling pad, and a coupling pad 320 disposed between two adjacent second semiconductor chips 200 may be referred to as a second coupling pad.

The first semiconductor chip 100 may include a first semiconductor substrate 110 having an active surface and an inactive surface, a first semiconductor device 112 disposed on the active surface of the first semiconductor substrate 110, a first wiring structure 130 disposed on the active surface of the first semiconductor substrate 110, and a plurality of first through electrodes 120 connected to the first wiring structure 130 and passing through at least a portion of the first semiconductor chip 100. The first semiconductor chip 100 may further include a plurality of chip pads 150 disposed in the bottom surface of the first semiconductor chip 100. The chip pads 150 are electrically connected to a first wiring pattern 132 and/or a first wiring via 134. The chip pads 150 may be electrically connected to the first semiconductor device 112 and the first wiring structure 130 through the first wiring pattern 132 and/or the first wiring via 134.

The first semiconductor chip 100 of the semiconductor package 1000 may be arranged such that the active surface of the first semiconductor substrate 110 faces downwards and the inactive surface of the first semiconductor substrate 110 faces upwards. Accordingly, unless particularly mentioned, the top surface of the first semiconductor chip 100 of the semiconductor package 1000 refers to a side that the inactive surface of the first semiconductor substrate 110 faces, and the bottom surface of the first semiconductor chip 100 refers to a side that the active surface of the first semiconductor substrate 110 faces. However, in the descriptions based on the first semiconductor chip 100, the bottom surface of the first semiconductor chip 100 that the active surface of the first semiconductor substrate 110 faces may be referred to as a front surface of the first semiconductor chip 100, and the top surface of the first semiconductor chip 100 that the inactive surface of the first semiconductor substrate 110 faces may be referred to as a back surface of the first semiconductor chip 100.

Each of the second semiconductor chips 200 may include a second semiconductor substrate 210 having an active surface and an inactive surface, a second semiconductor device 212 on the active surface of the second semiconductor substrate 210, and a second wiring structure 230 on the active surface of the second semiconductor substrate 210.

Each second semiconductor chip 200 may further include a plurality of second through electrodes 220 connected to the second wiring structure 230 and passing through at least a portion of the second semiconductor chip 200. Among the second semiconductor chips 200, the uppermost second semiconductor chip 200H, which is the farthest from the first semiconductor chip 100 and is at the top of the semiconductor package 1000, may also include a plurality of second through electrodes 220.

In some embodiments, a plurality of top chip connection pads 322 may be disposed on the top surface of the uppermost second semiconductor chip 200H. The top chip connection pads 322 may be arranged on the top surface of the uppermost second semiconductor chip 200H and may be connected to the second through electrodes 220. In some embodiments, a plurality of top chip connection pads 322 might not be disposed on the top surface of the uppermost second semiconductor chip 200H.

In some embodiments, the vertical height, i.e., the thickness, of the uppermost second semiconductor chip 200H, may be substantially the same as that of the other second semiconductor chips 200.

In the semiconductor package 1000, the second semiconductor chips 200 may be sequentially stacked on the first semiconductor chip 100 in a vertical direction such that the active surface of each of the second semiconductor chips 200 faces downwards, i.e., the first semiconductor chip 100. Accordingly, unless particularly mentioned, the top surface of each second semiconductor chip 200 of the semiconductor package 1000 refers to a side that the inactive surface of the second semiconductor substrate 210 faces, and the bottom surface of the second semiconductor chip 200 refers to a side that the active surface of the second semiconductor substrate 210 faces. However, in the descriptions based on the second semiconductor chip 200, the bottom surface of the second semiconductor chip 200 that the active surface of the second semiconductor substrate 210 faces may be referred to as a front surface of the second semiconductor chip 200, and the top surface of the second semiconductor chip 200 that the inactive surface of the second semiconductor substrate 210 faces may be referred to as a back surface of the second semiconductor chip 200.

For example, the first semiconductor substrate 110 and the second semiconductor substrate 210 may each include a semiconductor material such as silicon (Si). Alternatively, the first semiconductor substrate 110 and the second semiconductor substrate 210 may each include a semiconductor material such as germanium (Ge). The first semiconductor substrate 110 and the second semiconductor substrate 210 may each have an active surface and an inactive surface. The first semiconductor substrate 110 and the second semiconductor substrate 210 may each include a conductive region, e.g., an impurity-doped well. The first semiconductor substrate 110 and the second semiconductor substrate 210 may each have various isolation structures including a shallow trench isolation (STI) structure.

The first semiconductor device 112 and the second semiconductor device 212 may each include various kinds of individual devices. The individual devices may include various microelectronic devices, e.g., a metal-oxide-semiconductor field effect transistor (MOSFET) such as complementary metal-oxide-semiconductor (CMOS) transistor, a system large scale integration (LSI), an image sensor such as a CMOS image sensor (CIS), a micro-electro-mechanical system (MEMS), an active element, and a passive element. The individual devices may be electrically connected to the conductive region of the first semiconductor substrate 110 or the second semiconductor substrate 210. Each of the first semiconductor device 112 and the second semiconductor device 212 may further include a conductive wiring or plug, which electrically connects the individual devices or at least two individual devices to the conductive region of the first semiconductor substrate 110 or the second semiconductor substrate 210. Each of the individual devices may be electrically isolated from other individual devices by an insulation film.

At least one of the first and second semiconductor chips 100 and 200 may include a memory semiconductor chip. In some embodiments, the first semiconductor chip 100 may include a buffer chip, which includes a serial-parallel conversion circuit and controls the second semiconductor chips 200, and the second semiconductor chips 200 may include a memory chip including memory cells. For example, the semiconductor package 1000 including the first semiconductor chip 100 and the second semiconductor chips 200 may correspond to high-bandwidth memory (HBM). The first semiconductor chip 100 may be referred to as an HBM controller die, and each of the second semiconductor chips 200 may be referred to as a dynamic random access memory (DRAM) die.

The first wiring structure 130 may include a plurality of first wiring patterns 132, a plurality of first wiring vias 134 respectively connected to the first wiring patterns 132, and a first inter-wiring insulation layer 136 at least partially surrounding the first wiring patterns 132 and the first wiring vias 134. In some embodiments, the first wiring patterns 132 may have a thickness of about 0.5 μm or less. In some embodiments, the first wiring structure 130 may have a multi-layer wiring structure including the first wiring patterns 132 and the first wiring vias 134 at different vertical levels.

The second wiring structure 230 may include a plurality of second wiring patterns 232, a plurality of second wiring vias 234 respectively connected to the second wiring patterns 232, and a second inter-wiring insulation layer 236 at least partially surrounding the second wiring patterns 232 and the second wiring vias 234. In some embodiments, the second wiring patterns 232 may have a thickness of about 0.5 μm or less. In some embodiments, the second wiring structure 230 may have a multi-layer wiring structure including the second wiring patterns 232 and the second wiring vias 234 at different vertical levels.

For example, the first wiring patterns 132, the first wiring vias 134, the second wiring patterns 232, and the second wiring vias 234 may include a metal material such as aluminum, copper, or tungsten. In some embodiments, the first wiring patterns 132, the first wiring vias 134, the second wiring patterns 232, and the second wiring vias 234 may include a wiring barrier film and a wiring metal layer. The wiring barrier film may include a metal, a metal nitride, or an alloy. The wiring metal layer may include tungsten (W), aluminum (Al), titanium (Ti), tantalum (Ta), ruthenium (Ru), manganese (Mn), and/or copper (Cu).

When the first wiring structure 130 and the second wiring structure 230 have a multi-layer wiring structure, each of the first inter-wiring insulation layer 136 and the second inter-wiring insulation layer 236 may have a multi-layer structure, in which a plurality of insulation layers are stacked in correspondence to the multi-layer wiring structure of the first or second wiring structure 130 or 230. For example, the first inter-wiring insulation layer 136 and the second inter-wiring insulation layer 236 may each include silicon oxide, silicon nitride, silicon oxynitride, an insulation material having a lower permittivity than silicon oxide, or a combination thereof. In some embodiments, the first inter-wiring insulation layer 136 and the second inter-wiring insulation layer 236 may each include a tetraethyl orthosilicate (TEOS) film or an ultra low-k (ULK) film having an ultra-low dielectric constant of about 2.2 to about 2.4. The ULK film may include an SiOC film or an SiCOH film.

The first through electrodes 120 and the second through electrodes 220 may include a through silicon via (TSV). Each of the first through electrodes 120 may include a conductive plug, which passes through the first semiconductor substrate 110, and a conductive barrier film at least partially surrounding the conductive plug. Each of the second through electrodes 220 may include a conductive plug, which passes through the second semiconductor substrate 210, and a conductive barrier film at least partially surrounding the conductive plug. The conductive plug may have a pillar shape, and the conductive barrier film may have a cylindrical shape at least partially surrounding the side wall of the conductive plug. A via insulation film may be disposed between each first through electrode 120 and the first semiconductor substrate 110 may at least partially surround the side wall of the first through electrode 120. A via insulation film may be disposed between each second through electrode 220 and the second semiconductor substrate 210 and may at least partially surround the side wall of the second through electrode 220. The first through electrode 120 and the second through electrode 220 may have a via-first structure, a via-middle structure, or a via-last structure.

The first semiconductor chip 100 may have a first horizontal width W1 and a first vertical height H1. Each of the second semiconductor chips 200 may have a second horizontal width W2 and a second vertical height H2. In some embodiments, the first horizontal width W1 may be greater than the second horizontal width W2. In some embodiments, the first vertical height H1 may be substantially equal to the second vertical height H2. For example, the first vertical height H1 and the second vertical height H2 may be about 50 µm to about 90 µm.

A plurality of coupling pads 320 may electrically connect the second wiring patterns 232 and/or the second wiring vias 234 of the second wiring structure 230 to the first through electrodes 120 or the second through electrodes 220 therebelow.

For example, the second wiring patterns 232 and/or the second wiring vias 234 of the second wiring structure 230 of the lowermost second semiconductor chip 200L may be electrically connected to the first through electrodes 120 of the first semiconductor chip 100 therebelow through a plurality of coupling pads 320, i.e., a plurality of first coupling pads. The second wiring patterns 232 and/or the second wiring vias 234 of the second wiring structure 230 of each of the second semiconductor chips 200, except for the lowermost second semiconductor chip 200L, may be electrically connected to the second through electrodes 220 of each second semiconductor chip 200 therebelow through a plurality of coupling pads 320, i.e., a plurality of second coupling pads.

The coupling pads 320 disposed between the first semiconductor chip 100 and the lowermost second semiconductor chip 200L or between two adjacent second semiconductor chips 200 may be at least partially surrounded by a chip coupling insulation layer 300. The coupling pads 320 may pass through the chip coupling insulation layer 300. A plurality of chip coupling insulation layers 300 may be respectively disposed between the first semiconductor chip 100 and the lowermost second semiconductor chip 200L and between two adjacent second semiconductor chips 200.

Figure 5A:
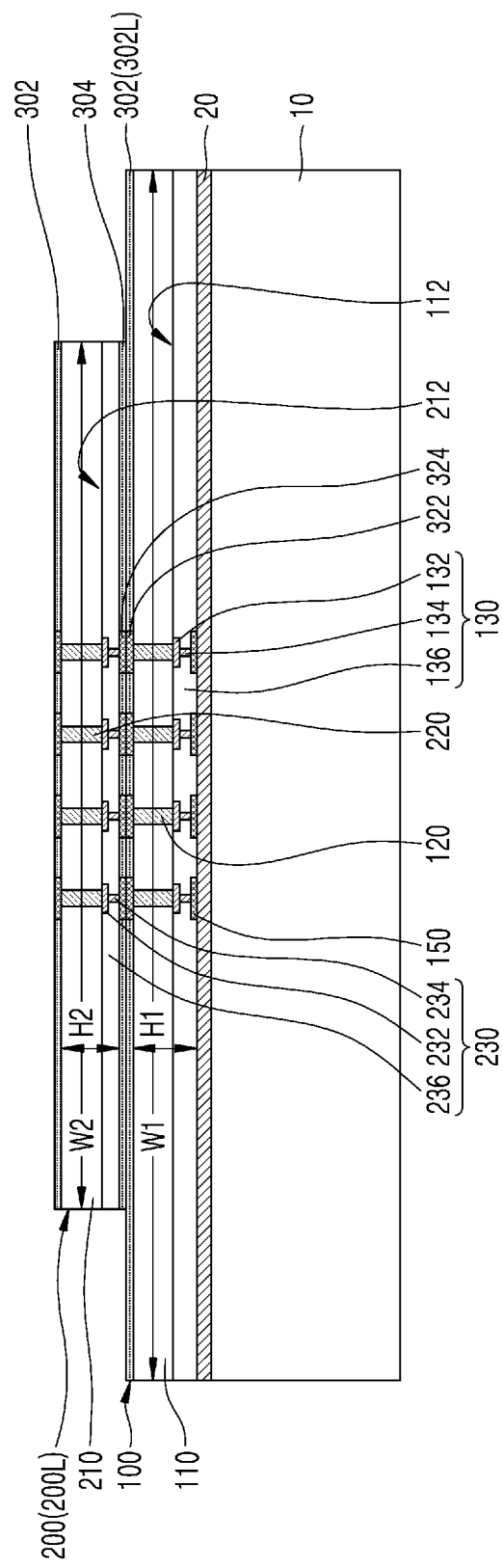

Each of the coupling pads 320 may be formed by respectively forming conductive material layers, e.g., a top chip connection pad 322 and a bottom chip connection pad 324 in FIG. 5A, on facing surfaces of respective two adjacent semiconductor chips among the first semiconductor chip 100 and the second semiconductor chips 200 and performing diffusion bonding such that the conductive material layers facing each other are expanded by heat to contact each other and integrated with each other through the diffusion of metal atoms.

Figure 5B:
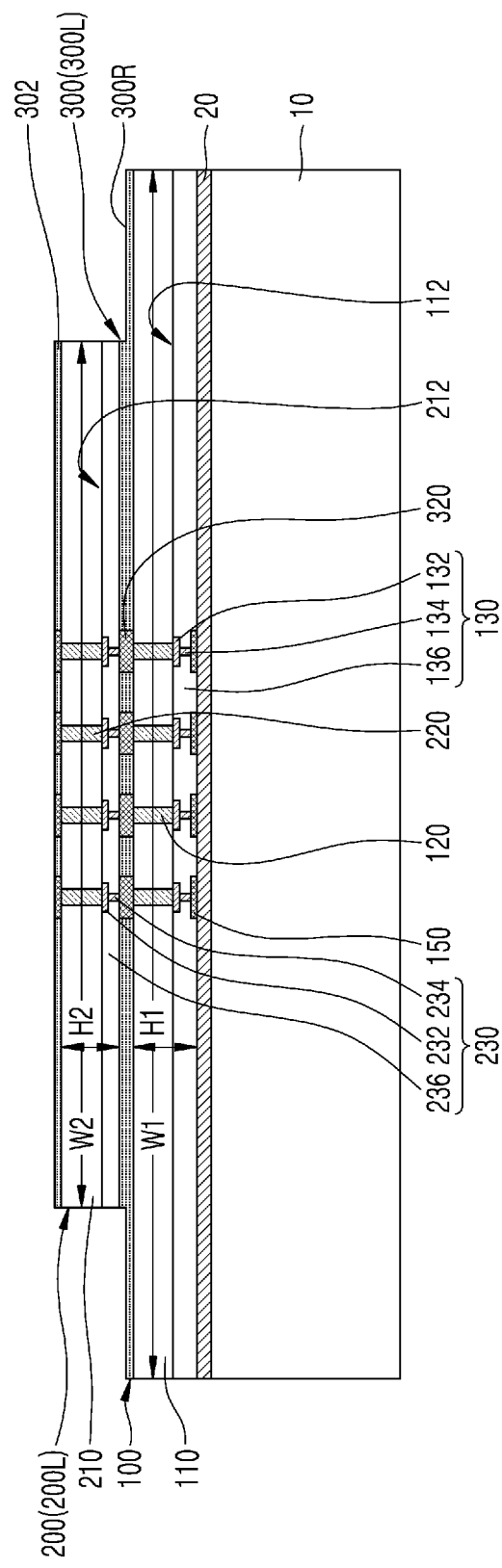
Figure 5C:
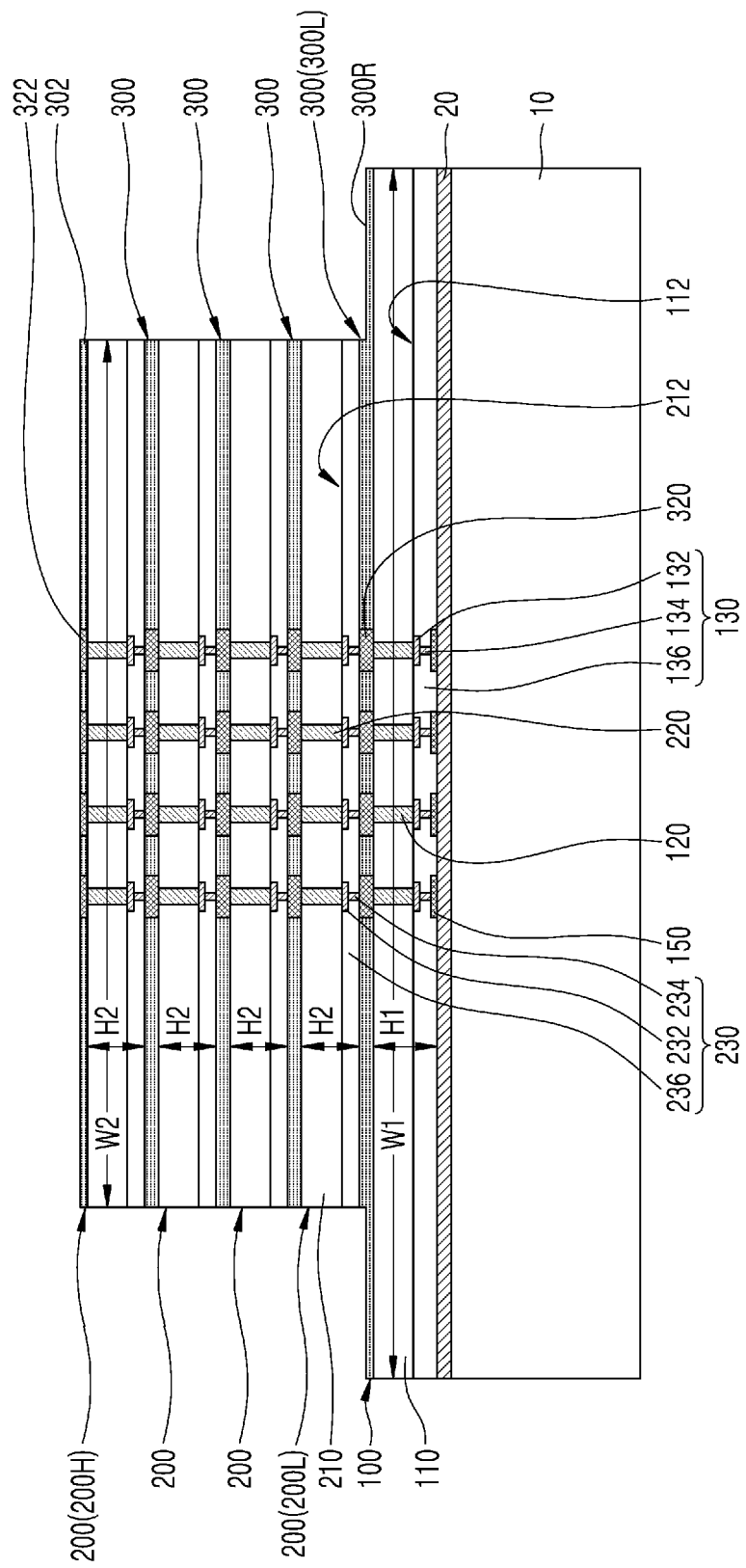

Each of the chip coupling insulation layers 300 may be formed by respectively forming insulation material layers, e.g., a top chip coupling insulation material layer 302 and a bottom chip coupling insulation material layer 304 in FIGS. 5A to 5C, on facing surfaces of respective two adjacent semiconductor chips among the first semiconductor chip 100 and the second semiconductor chips 200 and performing diffusion bonding, during the formation of the coupling pads 320, such that the insulation material layers facing each other are expanded by heat to contact each other and are then integrated with each other through the diffusion of atoms.

Among the chip coupling insulation layers 300, a lowermost chip coupling insulation layer 300L disposed between the first semiconductor chip 100 and the lowermost second semiconductor chip 200L may be formed when an insulation material layer, e.g., a lowermost top chip coupling insulation material layer 302L in FIG. 5A, covering the top surface of the first semiconductor chip 100 and an insulation material layer, e.g., the bottom chip coupling insulation material layer 304, covering the bottom surface of the lowermost second semiconductor chip 200L are diffusion bonded.

The lowermost chip coupling insulation layer 300L may have a first recess 300R in an upper portion such that the thickness of a portion of the lowermost chip coupling insulation layer 300L, which overlaps with the lowermost second semiconductor chip 200L in the vertical direction, is greater than the thickness of a portion of the lowermost chip coupling insulation layer 300L, which does not overlap with the lowermost second semiconductor chip 200L. The first recess 300R may be disposed in the portion of the lowermost chip coupling insulation layer 300L, which does not overlap with the lowermost second semiconductor chip 200L in the vertical direction. A central portion of the lowermost chip coupling insulation layer 300L, i.e., the portion of the lowermost chip coupling insulation layer 300L which overlaps with the lowermost second semiconductor chip 200L in the vertical direction, may protrude upwards from an edge portion of the lowermost chip coupling insulation layer 300L, i.e., the portion of the lowermost chip coupling insulation layer 300L which does not overlap with the lowermost second semiconductor chip 200L in the vertical direction, and the lowermost chip coupling insulation layer 300L may have a flat/planar bottom surface.

The lowermost chip coupling insulation layer 300L may completely cover a top surface of the first semiconductor chip 100, which does not overlap with the lowermost second semiconductor chip 200L in the vertical direction. A portion of the top surface of the first semiconductor chip 100, which overlaps with the lowermost second semiconductor chip 200L in the vertical direction, and a portion of the bottom surface of the lowermost second semiconductor chip 200L may be covered with the coupling pads 320, and the other portions thereof may be covered with the lowermost chip coupling insulation layer 300L.

Each of the chip coupling insulation layers 300, except for the lowermost chip coupling insulation layer 300L and the coupling pads 320, may completely cover the top and bottom surfaces of respective two adjacent second semiconductor chips 200, wherein the top and bottom surfaces thereof face each other. The chip coupling insulation layers 300, except for the lowermost chip coupling insulation layer 300L, may have flat top and bottom surfaces and may thus have substantially the same thickness as each other.

A supporting dummy substrate 400 may be stacked on the uppermost second semiconductor chip 200H. For example, the supporting dummy substrate 400 may include a semiconductor material such as silicon (Si). In some embodiments, the supporting dummy substrate 400 may include only a semiconductor material. For example, the supporting dummy substrate 400 may be a part of a bare wafer.

The supporting dummy substrate 400 may have a third horizontal width W3 and a third vertical height H3. In some embodiments, the third horizontal width W3 may be less than each of the first and second horizontal widths W1 and W2. In some embodiments, the third vertical height H3 may be greater than each of the first and second vertical heights H1 and H2. For example, the third vertical height H3 may be about 100 μm to about 500 μm.

A supporting coupling insulation layer 350 may be disposed between the uppermost second semiconductor chip 200H and the supporting dummy substrate 400. The supporting coupling insulation layer 350 may be formed by respectively forming insulation material layers, e.g., the top chip coupling insulation material layer 302 and a bottom dummy coupling insulation material layer 364 in FIG. 5D, on the top surface of the uppermost second semiconductor chip 200H and the bottom surface of the supporting dummy substrate 400, which face each other, and performing diffusion bonding such that the insulation material layers facing each other are expanded by heat to contact each other and are integrated with each other through the diffusion of atoms.

Only a semiconductor material may be exposed on the bottom surface of the supporting dummy substrate 400. Accordingly, the top surface of the supporting coupling insulation layer 350 may be in contact with only the semiconductor material. The supporting coupling insulation layer 350 may completely cover the bottom surface of the supporting dummy substrate 400. In some embodiments, when a plurality of top chip connection pads 322 are arranged on the top surface of the uppermost second semiconductor chip 200H, the supporting coupling insulation layer 350 may at least partially surround the top chip connection pads 322. For example, the supporting coupling insulation layer 350 may cover the top surface, i.e., the inactive surface, of the second semiconductor substrate 210 of the uppermost second semiconductor chip 200H and the side and top surfaces of the top chip connection pads 322. The top chip connection pads 322 may have the supporting coupling insulation layer 350 therebetween and may be separated from the supporting dummy substrate 400. In some embodiments, when the top chip connection pads 322 are omitted from the top surface of the uppermost second semiconductor chip 200H, the supporting coupling insulation layer 350 may cover the top surface of the second semiconductor substrate 210 of the uppermost second semiconductor chip 200H and a plurality of second through electrodes 220 exposed on the top surface of the second semiconductor substrate 210 of the uppermost second semiconductor chip 200H.

The supporting coupling insulation layer 350 may have a second recess 350R in an upper portion thereof such that the thickness of a portion of the supporting coupling insulation layer 350, which overlaps with the supporting dummy substrate 400 in the vertical direction, is greater than the thickness of a portion of the supporting coupling insulation layer 350, which does not overlap with the supporting dummy substrate 400 in the vertical direction. The second recess 350R may be disposed in the portion of the supporting coupling insulation layer 350, which does not overlap with the supporting dummy substrate 400 in the vertical direction. A central portion of the supporting coupling insulation layer 350, i.e., the portion of the supporting coupling insulation layer 350 which overlaps with the supporting dummy substrate 400 in the vertical direction, may protrude upwards from an edge portion of the supporting coupling insulation layer 350, i.e., the portion of the supporting coupling insulation layer 350 which does not overlap with the supporting dummy substrate 400 in the vertical direction, and the supporting coupling insulation layer 350 may have a flat bottom surface.

The lowermost chip coupling insulation layer 300L may have the first horizontal width W1. The chip coupling insulation layers 300, except for the lowermost chip coupling insulation layer 300L, may have the second horizontal width W2. The supporting coupling insulation layer 350 may have the second horizontal width W2. The chip coupling insulation layers 300, except for the lowermost chip coupling insulation layer 300L, may overlap with the second semiconductor chips 200 in the vertical direction. Side surfaces of the chip coupling insulation layers 300, except for the lowermost chip coupling insulation layer 300L, may be aligned and coplanar in the vertical direction with side surfaces of the second semiconductor chips 200.

The chip coupling insulation layers 300 and the supporting coupling insulation layer 350 may include SiO, SiN, SiCN, SiCO, or a polymeric material. The polymeric material may include benzocyclobutene (BCB), polyimide (PI), polybenzoxazole (PBO), Si, acrylate, or epoxy. For example, the chip coupling insulation layers 300 and the supporting coupling insulation layer 350 may include silicon oxide. In some embodiments, the chip coupling insulation layers 300 and the supporting coupling insulation layer 350 may include the same material as each other. For example, the chip coupling insulation layers 300 and the supporting coupling insulation layer 350 may have a thickness of about 100 nm to about 1 μm.

The semiconductor package 1000 may further include a package molding layer 500 disposed on the first semiconductor chip 100. The package molding layer 500 may cover the top surface of the first semiconductor chip 100 and at least partially surround the side surfaces of the second semiconductor chips 200 and the side surfaces of the supporting dummy substrate 400. For example, the package molding layer 500 may include an epoxy mold compound (EMC). In some embodiments, the package molding layer 500 may cover the top surface of the supporting dummy substrate 400. In some embodiments, the package molding layer 500 might not cover the top surface of the supporting dummy substrate 400. For example, a heat dissipation unit may be attached to the supporting dummy substrate 400 with a thermal interface material (TIM) disposed between the heat dissipation unit and the supporting dummy substrate 400.

In some embodiments, the semiconductor package 1000 may further include a base redistribution layer 600 disposed on the bottom surface of the first semiconductor chip 100. The base redistribution layer 600 may include a plurality of package redistribution line patterns 620, a plurality of package redistribution vias 640, and a package redistribution insulation layer 660. In some embodiments, a plurality of package redistribution insulation layers 660 may be stacked. For example, the package redistribution insulation layer 660 may be formed from photo imagable dielectric (PID) or photosensitive polyimide (PSPI). For example, the package redistribution line patterns 620 and the package redistribution vias 640 may include a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof but are not necessarily limited thereto. In some embodiments, the package redistribution line patterns 620 and the package redistribution vias 640 may be formed by stacking a metal or a metal alloy on a seed layer including titanium, titanium nitride, or titanium tungsten.

The package redistribution line patterns 620 may be disposed on at least one of the top and bottom surfaces of the package redistribution insulation layer 660. The package redistribution vias 640 may pass through the package redistribution insulation layer 660 and may be in contact with some of the package redistribution line patterns 620. In some embodiments, at least some of the package redistribution line patterns 620 may be formed together and integrated with some of the package redistribution vias 640. For example, a package redistribution line pattern 620 may be integrated with a package redistribution via 640 that is in contact with the top surface of the package redistribution line pattern 620. The package redistribution insulation layer 660 may at least partially surround the package redistribution line patterns 620 and the package redistribution vias 640.

The package redistribution line patterns 620 and the package redistribution vias 640 may be electrically connected to the chip pads 150. In some embodiments, at least some of the package redistribution vias 640 may be in contact with the chip pads 150. For example, when the base redistribution layer 600 includes a stack of a plurality of package redistribution insulation layers 660, a package redistribution via 640 that passes through an uppermost package redistribution insulation layer 660 may be in contact with and electrically connected to a chip pad 150.

In some embodiments, the package redistribution vias 640 may have a tapered shape having a horizontal width decreasing upwards. For example, the horizontal width of the package redistribution vias 640 may increase away from the first semiconductor chip 100.

Among the package redistribution line patterns 620, package redistribution line patterns 620 on the bottom surface of the base redistribution layer 600 may be referred to as package pads 650. A plurality of package connection terminals 700 may be respectively attached to the package pads 650. For example, the package connection terminals 700 may include a solder ball or a bump.

In some embodiments, the semiconductor package 1000 might not include the base redistribution layer 600. For example, the package connection terminals 700 may be respectively attached to the chip pads 150.

The horizontal width and area of the base redistribution layer 600 may be equal to the horizontal width and area of the first semiconductor chip 100. The base redistribution layer 600 may overlap with the first semiconductor chip 100 in the vertical direction.

For example, the base redistribution layer 600, the first semiconductor chip 100, and the package molding layer 500 may have substantially the same horizontal width and area as one another. The side surfaces of the base redistribution layer 600, the first semiconductor chip 100, and the package molding layer 500 may be aligned and coplanar with one another in the vertical direction.

Due to hybrid bonding in which the coupling pads 320 and the chip coupling insulation layers 300 are formed using diffusion bonding, the first semiconductor chip 100 and the second semiconductor chips 200 may be stacked in the semiconductor package 1000. Because of the first semiconductor chip 100 and the second semiconductor chips 200 have substantially the same thickness (vertical height) and are relatively thin, there may be flexible bending during hybrid bonding, and therefore, a bonding failure may be prevented from occurring among the first semiconductor chip 100 and the second semiconductor chips 200, and stress is prevented from concentrating on the first semiconductor chip 100 and the second semiconductor chips 200, which are bonded to one another, during a subsequent thermal process.

Because the thickness (vertical height) of the supporting dummy substrate 400 of the semiconductor package 1000 is relatively great, the structural reliability of the semiconductor package 1000 may be increased, and heat may be effectively released to the outside of the semiconductor package 1000 through the supporting dummy substrate 400. The supporting dummy substrate 400 may be bonded to the uppermost second semiconductor chip 200H by the supporting coupling insulation layer 350. The top and bottom surfaces of the supporting coupling insulation layer 350 may be in contact with only semiconductor materials of the supporting dummy substrate 400 and the uppermost second semiconductor chip 200H. Accordingly, even when a bonding failure occurs between the supporting dummy substrate 400 and the uppermost second semiconductor chip 200H because the supporting dummy substrate 400 is sufficiently thick to resist bending, the bonding failure might not affect the operational reliability of the semiconductor package 1000.

The second semiconductor chips 200 of the semiconductor package 1000 may be formed by the same process, and accordingly, manufacturing processes may be simplified and manufacturing cost may be reduced.

Figure 1B:
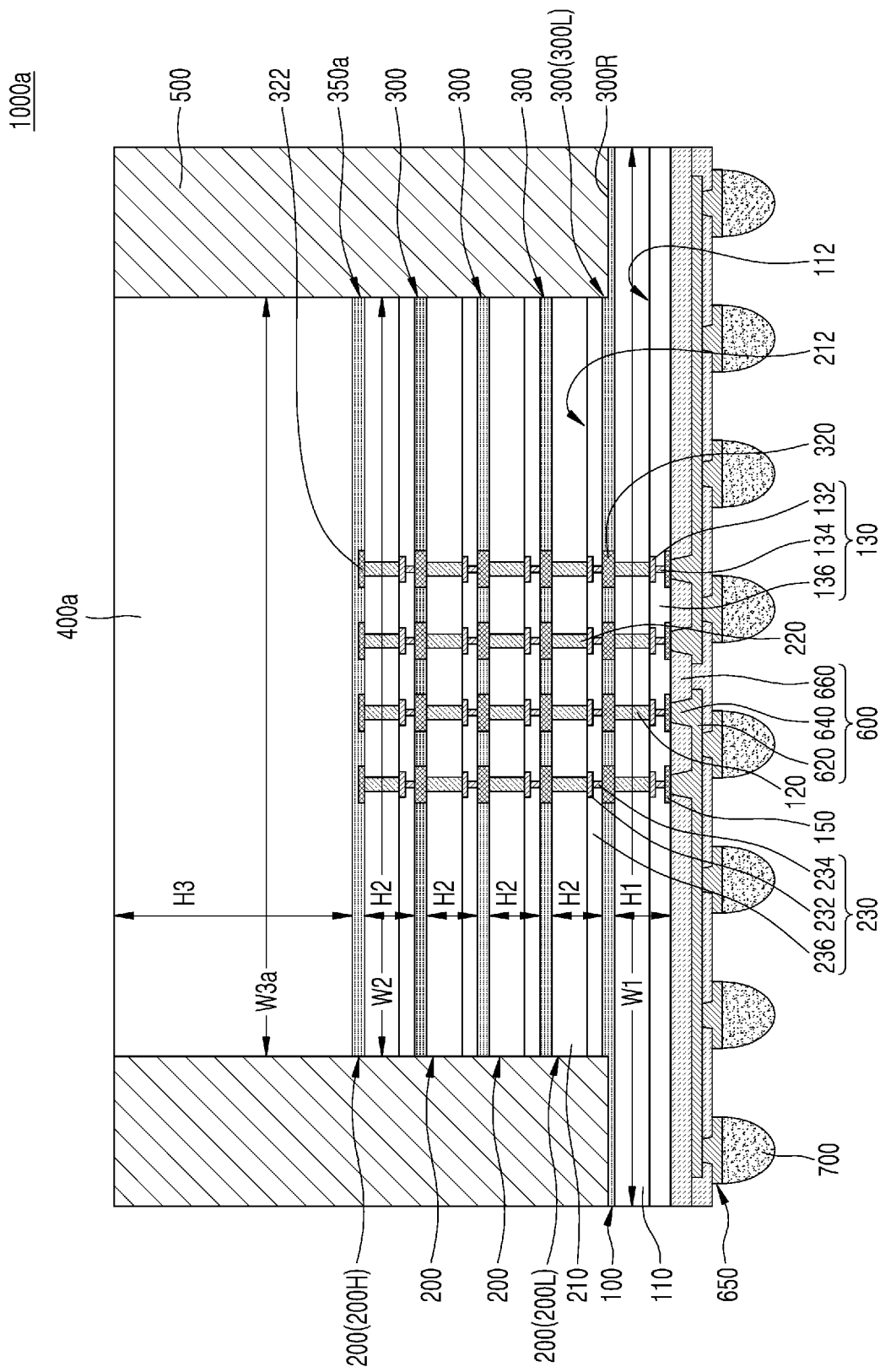

Referring to FIG. 1B, a semiconductor package 1000a may include the first semiconductor chip 100 and the second semiconductor chips 200. The first semiconductor chip 100 may have the first horizontal width W1 and the first vertical height H1, and each of the second semiconductor chips 200 may have the second horizontal width W2 and the second vertical height H2. A supporting dummy substrate 400a may be stacked on the uppermost second semiconductor chip 200H. For example, the supporting dummy substrate 400a may include a semiconductor material such as silicon (Si). In some embodiments, the supporting dummy substrate 400a may include only a semiconductor material. For example, the supporting dummy substrate 400a may be a part of a bare wafer.

The supporting dummy substrate 400a may have a third horizontal width W3a and the third vertical height H3. In some embodiments, the third horizontal width W3a may be substantially equal to the second horizontal width W2. In some embodiments, the third vertical height H3 may be greater than each of the first and second vertical heights H1 and H2.

A supporting coupling insulation layer 350a may be disposed between the uppermost second semiconductor chip 200H and the supporting dummy substrate 400a. The supporting coupling insulation layer 350a may be formed by respectively forming insulation material layers on the top surface of the uppermost second semiconductor chip 200H and the bottom surface of the supporting dummy substrate 400a, which face each other, and performing diffusion bonding such that the insulation material layers facing each other are expanded by heat to contact each other and integrated with each other through the diffusion of atoms.

Only a semiconductor material may be exposed on the bottom surface of the supporting dummy substrate 400a. Accordingly, the top surface of the supporting coupling insulation layer 350a may be in contact with only the semiconductor material. The supporting coupling insulation layer 350a may completely cover the bottom surface of the supporting dummy substrate 400a. Because the top chip connection pads 322 are arranged on the top surface of the uppermost second semiconductor chip 200H, the supporting coupling insulation layer 350a may at least partially surround the top chip connection pads 322. For example, the supporting coupling insulation layer 350a may cover the top surface, i.e., the inactive surface, of the second semiconductor substrate 210 of the uppermost second semiconductor chip 200H and the side and top surfaces of the top chip connection pads 322.

The lowermost chip coupling insulation layer 300L may have the first horizontal width W1. The chip coupling insulation layers 300, except for the lowermost chip coupling insulation layer 300L, may have the second horizontal width W2. The supporting coupling insulation layer 350a may have the second horizontal width W2. The chip coupling insulation layers 300, except for the lowermost chip coupling insulation layer 300L, may overlap with the second semiconductor chips 200, the supporting coupling insulation layer 350a, and the supporting dummy substrate 400a in the vertical direction. Side surfaces of the chip coupling insulation layers 300, except for the lowermost chip coupling insulation layer 300L, side surfaces of the second semiconductor chips 200, a side surface of the supporting coupling insulation layer 350a, and a side surface of the supporting dummy substrate 400a may be aligned and coplanar with one another in the vertical direction.

The semiconductor package 1000a may further include a package molding layer 500 on the first semiconductor chip 100. The package molding layer 500 may cover the top surface of the first semiconductor chip 100 and at least partially surround the side surfaces of the second semiconductor chips 200 and the side surfaces of the supporting dummy substrate 400a. In some embodiments, the package molding layer 500 may cover the top surface of the supporting dummy substrate 400a. In some embodiments, the package molding layer 500 might not cover the top surface of the supporting dummy substrate 400a.

Figure 1C:
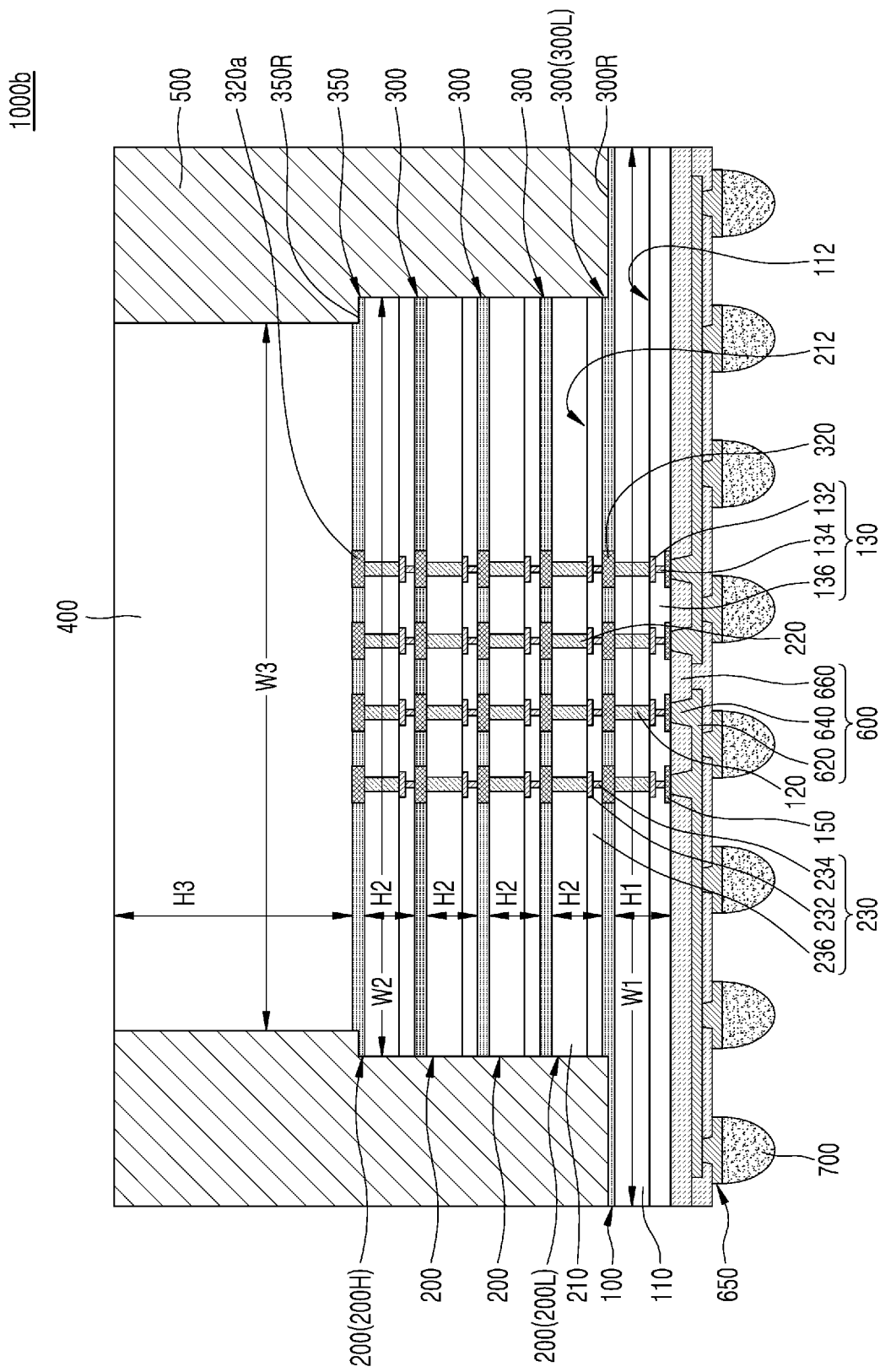

Referring to FIG. 1C, a semiconductor package 1000b may include the first semiconductor chip 100 and the second semiconductor chips 200. The semiconductor package 1000b may include a plurality of thermal coupling pads 320a instead of the top chip connection pads 322 of the semiconductor package 1000 of FIG. 1A. The thermal coupling pads 320a may be disposed between the top surface of the uppermost second semiconductor chip 200H and the bottom surface of the supporting dummy substrate 400. Each of the thermal coupling pads 320a may be formed by respectively forming conductive material layers, e.g., a top chip connection pad 322 and a bottom dummy pad 328 in FIG. 7A, on respective facing surfaces of the uppermost second semiconductor chip 200H and the supporting dummy substrate 400 and performing diffusion bonding such that the conductive material layers facing each other are expanded by heat to contact each other and integrated with each other through diffusion of metal atoms. For example, the thermal coupling pads 320a may include a material including copper (Cu).

The top surface of each of the thermal coupling pads 320a may be in contact with the bottom surface of the supporting dummy substrate 400, and the bottom surface of each of the thermal coupling pads 320a may be in contact with a second through electrode 220 of the uppermost second semiconductor chip 200H. In some embodiments, the bottom surface of each of the thermal coupling pads 320a may cover the top surface of a second through electrode 220 of the uppermost second semiconductor chip 200H and a portion of the top surface of the second semiconductor substrate 210 of the uppermost second semiconductor chip 200H, which is adjacent to the top surface of the second through electrode 220. The supporting coupling insulation layer 350 may at least partially surround the thermal coupling pads 320a. For example, the supporting coupling insulation layer 350 may cover the side surfaces of the thermal coupling pads 320a and may fill a space between the uppermost second semiconductor chip 200H and the supporting dummy substrate 400.

Because the semiconductor package 1000b includes the thermal coupling pads 320a and the supporting coupling insulation layer 350 disposed between the uppermost second semiconductor chip 200H and the supporting dummy substrate 400, an adhesive strength between the uppermost second semiconductor chip 200H and the supporting dummy substrate 400 may increase, thereby increasing structural reliability, and heat transmission from the uppermost second semiconductor chip 200H to the supporting dummy substrate 400 may increase, thereby increasing the ability of the semiconductor package 1000b to release heat.

Figure 1D:
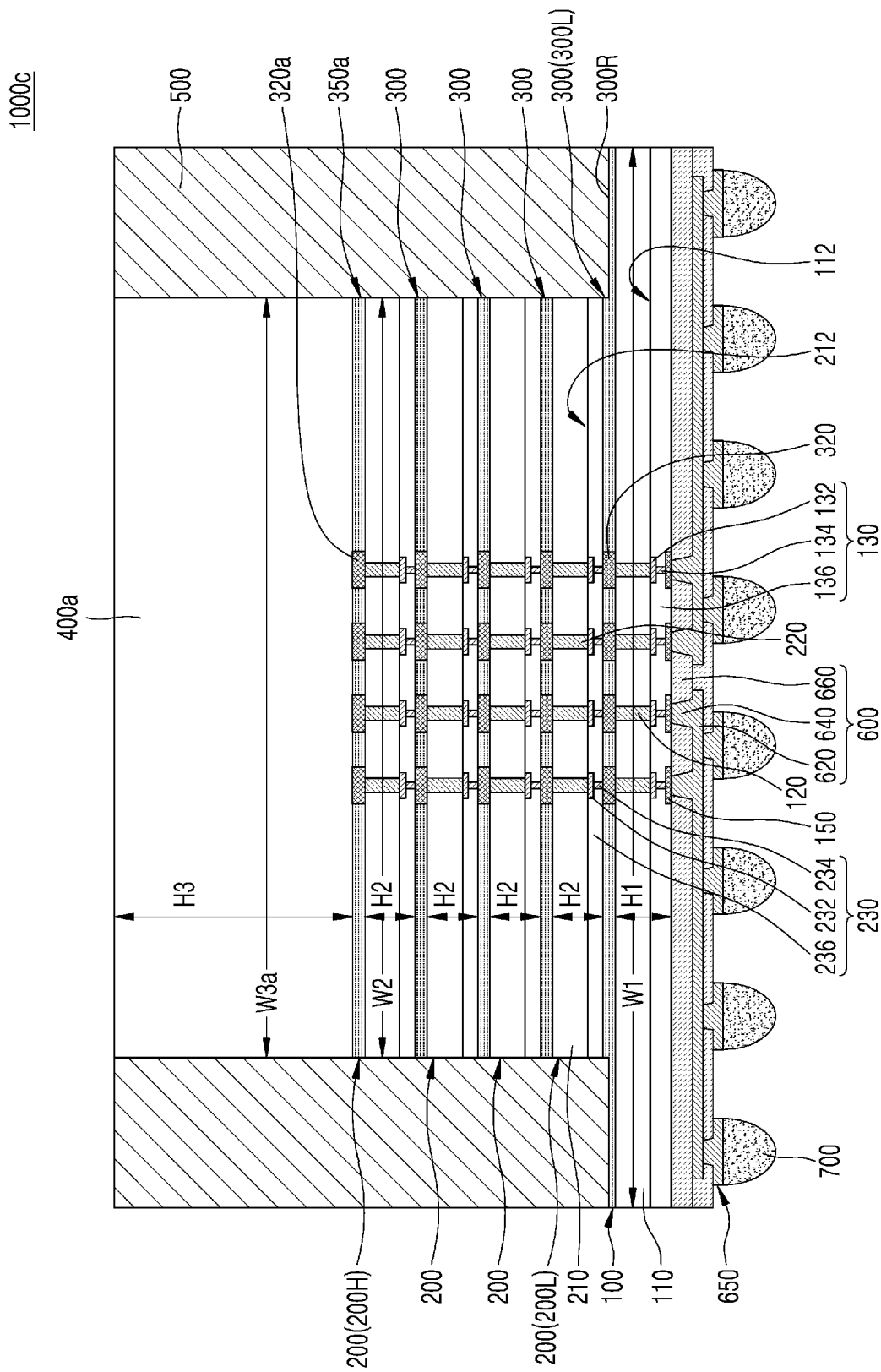

Referring to FIG. 1D, a semiconductor package 1000c may include the first semiconductor chip 100 and the second semiconductor chips 200. The semiconductor package 1000c may include a plurality of thermal coupling pads 320a instead of the top chip connection pads 322 of the semiconductor package 1000a of FIG. 1B. The supporting coupling insulation layer 350a may at least partially surround the thermal coupling pads 320a. For example, the supporting coupling insulation layer 350a may cover the side surfaces of the thermal coupling pads 320a and may fill a space between the uppermost second semiconductor chip 200H and the supporting dummy substrate 400.

Figure 2A:
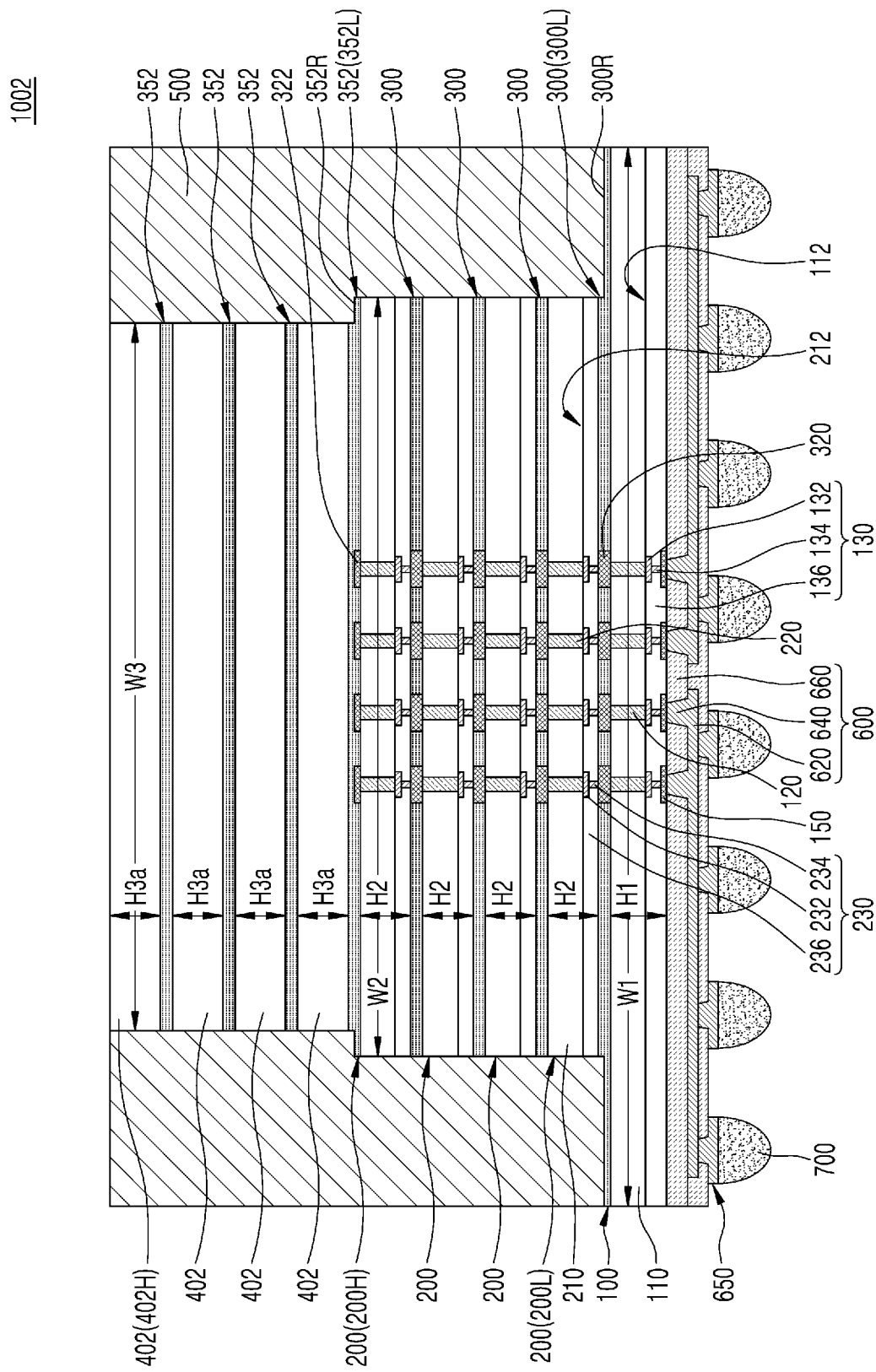

Referring to FIG. 2A, a semiconductor package 1002 may include the first semiconductor chip 100 and the second semiconductor chips 200. The first semiconductor chip 100 and the second semiconductor chips 200 of the semiconductor package 1002 may be electrically connected to each other through the coupling pads 320 and may thus exchange signals with each other and provide power and ground.

The first semiconductor chip 100 may have the first horizontal width W1 and the first vertical height H1, and each of the second semiconductor chips 200 may have the second horizontal width W2 and the second vertical height H2.

A plurality of supporting dummy substrates 402 may be sequentially stacked on the uppermost second semiconductor chip 200H. For example, the supporting dummy substrates 402 may include a semiconductor material such as silicon (Si). In some embodiments, the supporting dummy substrates 402 may include only a semiconductor material. For example, each of the supporting dummy substrates 402 may be a part of a bare wafer. The total vertical height of the stack of the supporting dummy substrates 402 may be greater than the second vertical height H2. For example, the total vertical height of the stack of the supporting dummy substrates 402 may be about 100 μm to about 500 μm.

Each of the supporting dummy substrates 402 may have the third horizontal width W3 and a third vertical height H3a. In some embodiments, the third horizontal width W3 may be less than each of the first and second horizontal widths W1 and W2. In some embodiments, the third vertical height H3a may be substantially equal to each of the first and second vertical heights H1 and H2. For example, the third vertical height H3a may be about 50 μm to about 90 μm. In some embodiments, the third vertical height H3a may be less than each of the first and second vertical heights H1 and H2. For example, the third vertical height H3a may be substantially equal to the vertical height of each of the first and second semiconductor substrates 110 and 210 and may be several μm less than each of the first and second vertical heights H1 and H2.

In some embodiments, the vertical height of an uppermost supporting dummy substrate 402H among the supporting dummy substrates 402 may be substantially equal to the vertical height of the other supporting dummy substrates 402. In some embodiments, the vertical height of an uppermost supporting dummy substrate 402H among the supporting dummy substrates 402 may be less than the vertical height of the other supporting dummy substrates 402.

A supporting coupling insulation layer 352 may be disposed between the uppermost second semiconductor chip 200H and a lowermost supporting dummy substrate 402 at the bottom of the stack of the supporting dummy substrates 402, and a supporting coupling insulation layer 352 may be disposed between two adjacent supporting dummy substrates 402. Among a plurality of supporting coupling insulation layers 352, a supporting coupling insulation layer 352 disposed between the uppermost second semiconductor chip 200H and the lowermost supporting dummy substrate 402 may be referred to as a lowermost supporting coupling insulation layer 352L.

The lowermost supporting coupling insulation layer 352L may have a second recess 352R in an upper portion thereof such that the thickness of a portion of the lowermost supporting coupling insulation layer 352L, which overlaps with the supporting dummy substrates 402 in the vertical direction, is greater than the thickness of a portion of the lowermost supporting coupling insulation layer 352L, which does not overlap with the supporting dummy substrates 402 in the vertical direction. The second recess 352R may be disposed in the portion of the lowermost supporting coupling insulation layer 352L, which does not overlap with the supporting dummy substrates 402 in the vertical direction. A central portion of the lowermost supporting coupling insulation layer 352L, i.e., the portion of the lowermost supporting coupling insulation layer 352L which overlaps with the supporting dummy substrates 402 in the vertical direction, may protrude upwards from an edge portion of the lowermost supporting coupling insulation layer 352L, i.e., the portion of the lowermost supporting coupling insulation layer 352L which does not overlap with the supporting dummy substrates 402 in the vertical direction, and the lowermost supporting coupling insulation layer 352L may have a flat bottom surface.

The top surface of the lowermost supporting coupling insulation layer 352L among the supporting coupling insulation layers 352 may be in contact with only a semiconductor material. The lowermost supporting coupling insulation layer 352L may completely cover the bottom surface of the lowermost supporting dummy substrate 402. Because the top chip connection pads 322 are arranged on the top surface of the uppermost second semiconductor chip 200H, the lowermost supporting coupling insulation layer 352L may at least partially surround the top chip connection pads 322. For example, the lowermost supporting coupling insulation layer 352L may cover the top surface, i.e., the inactive surface, of the second semiconductor substrate 210 of the uppermost second semiconductor chip 200H and the side and top surfaces of the top chip connection pads 322.

Only a semiconductor material may be exposed on the bottom and top surfaces of each of the supporting dummy substrates 402. Each of the supporting coupling insulation layers 352, except for the lowermost supporting coupling insulation layer 352L, may completely cover the top and bottom surfaces of respective two adjacent supporting dummy substrates 402, wherein the top and bottom surfaces thereof face each other. Accordingly, the top and bottom surfaces of each of the supporting coupling insulation layers 352, except for the lowermost supporting coupling insulation layer 352L, may be in contact with only a semiconductor material. The supporting coupling insulation layers 352, except for the lowermost supporting coupling insulation layer 352L, may have flat top and bottom surfaces and may thus have substantially the same thickness as each other.

Figure 2B:
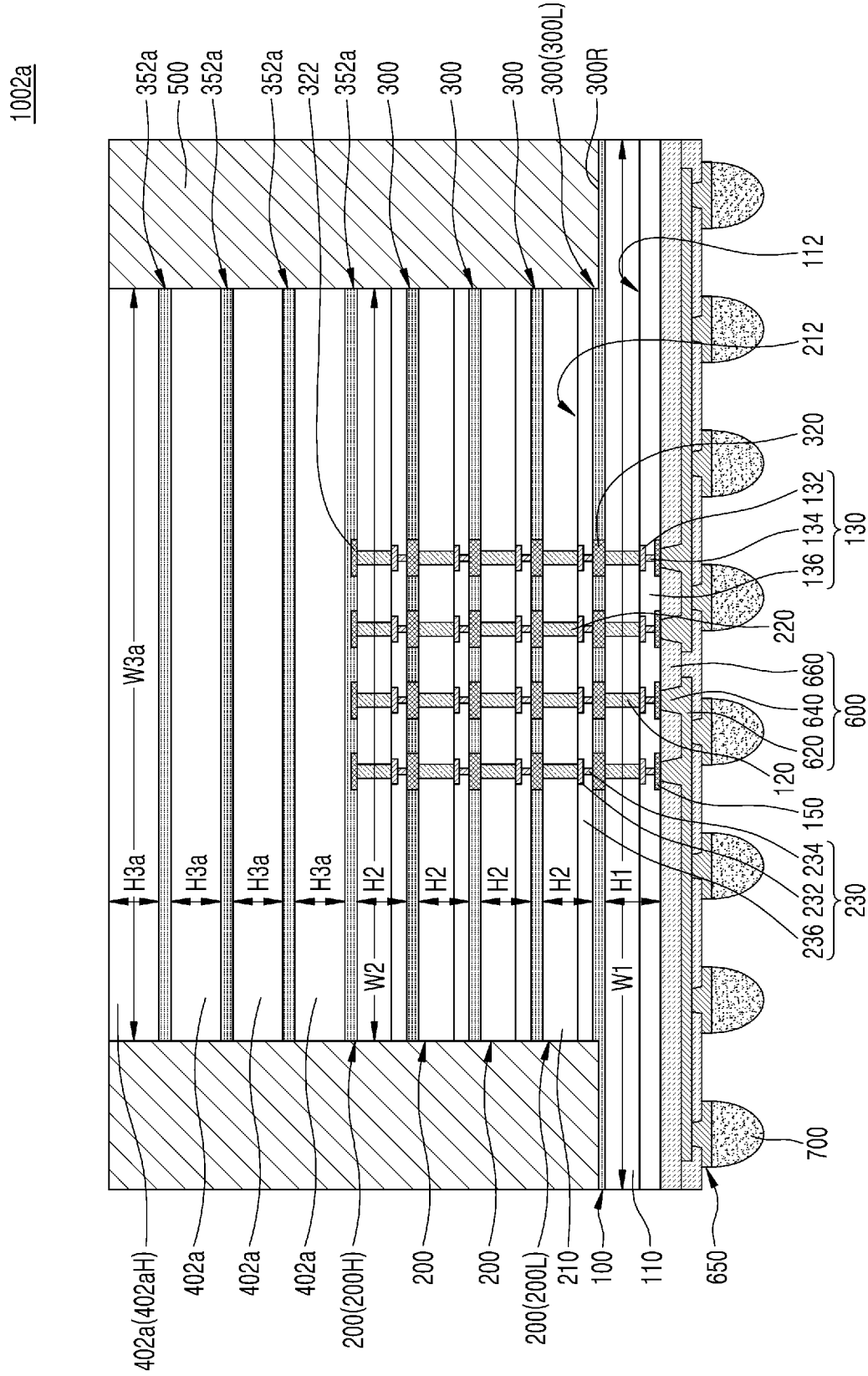

Referring to FIG. 2B, a semiconductor package 1002a may include the first semiconductor chip 100 and the second semiconductor chips 200. The first semiconductor chip 100 and the second semiconductor chips 200 of the semiconductor package 1002a may be electrically connected to each other through the coupling pads 320 and may thus exchange signals with each other and provide power and ground.

The first semiconductor chip 100 may have the first horizontal width W1 and the first vertical height H1, and each of the second semiconductor chips 200 may have the second horizontal width W2 and the second vertical height H2.

A plurality of supporting dummy substrates 402a may be sequentially stacked on the uppermost second semiconductor chip 200H. For example, the supporting dummy substrates 402a may include a semiconductor material such as silicon (Si). In some embodiments, the supporting dummy substrates 402a may include only a semiconductor material. For example, each of the supporting dummy substrates 402a may be a part of a bare wafer. Each of the supporting dummy substrate 402a may have the third horizontal width W3a and a third vertical height H3a. In some embodiments, the third horizontal width W3a may be substantially equal to the second horizontal width W2.

A supporting coupling insulation layer 352a may be disposed between the uppermost second semiconductor chip 200H and a lowermost supporting dummy substrate 402a at the bottom of the stack of the supporting dummy substrates 402a, and a supporting coupling insulation layer 352a may be disposed between two adjacent supporting dummy substrates 402a.

Each of the supporting coupling insulation layers 352a may completely cover the bottom surface of the lowermost supporting dummy substrate 402a or the top and bottom surfaces of respective two adjacent supporting dummy substrates 402a, wherein the top and bottom surfaces thereof face each other. The supporting coupling insulation layers 352a may have flat top and bottom surfaces and may thus have substantially the same thickness as each other.

Among the supporting coupling insulation layer 352a, a lowermost supporting coupling insulation layer 352a may at least partially surround the top chip connection pads 322. For example, the lowermost supporting coupling insulation layer 352a may cover the top surface, i.e., the inactive surface, of the second semiconductor substrate 210 of the uppermost second semiconductor chip 200H and the side and top surfaces of the top chip connection pads 322.

The supporting coupling insulation layers 352a may have the third horizontal width W3a. The chip coupling insulation layers 300, except for the lowermost chip coupling insulation layer 300L, may overlap with the second semiconductor chips 200, the supporting coupling insulation layers 352a, and the supporting dummy substrates 402a in the vertical direction. Side surfaces of the chip coupling insulation layers 300, except for the lowermost chip coupling insulation layer 300L, side surfaces of the second semiconductor chips 200, side surfaces of the supporting coupling insulation layers 352a, and side surfaces of the supporting dummy substrates 402a may be aligned and coplanar with one another in the vertical direction.

Figure 2C:
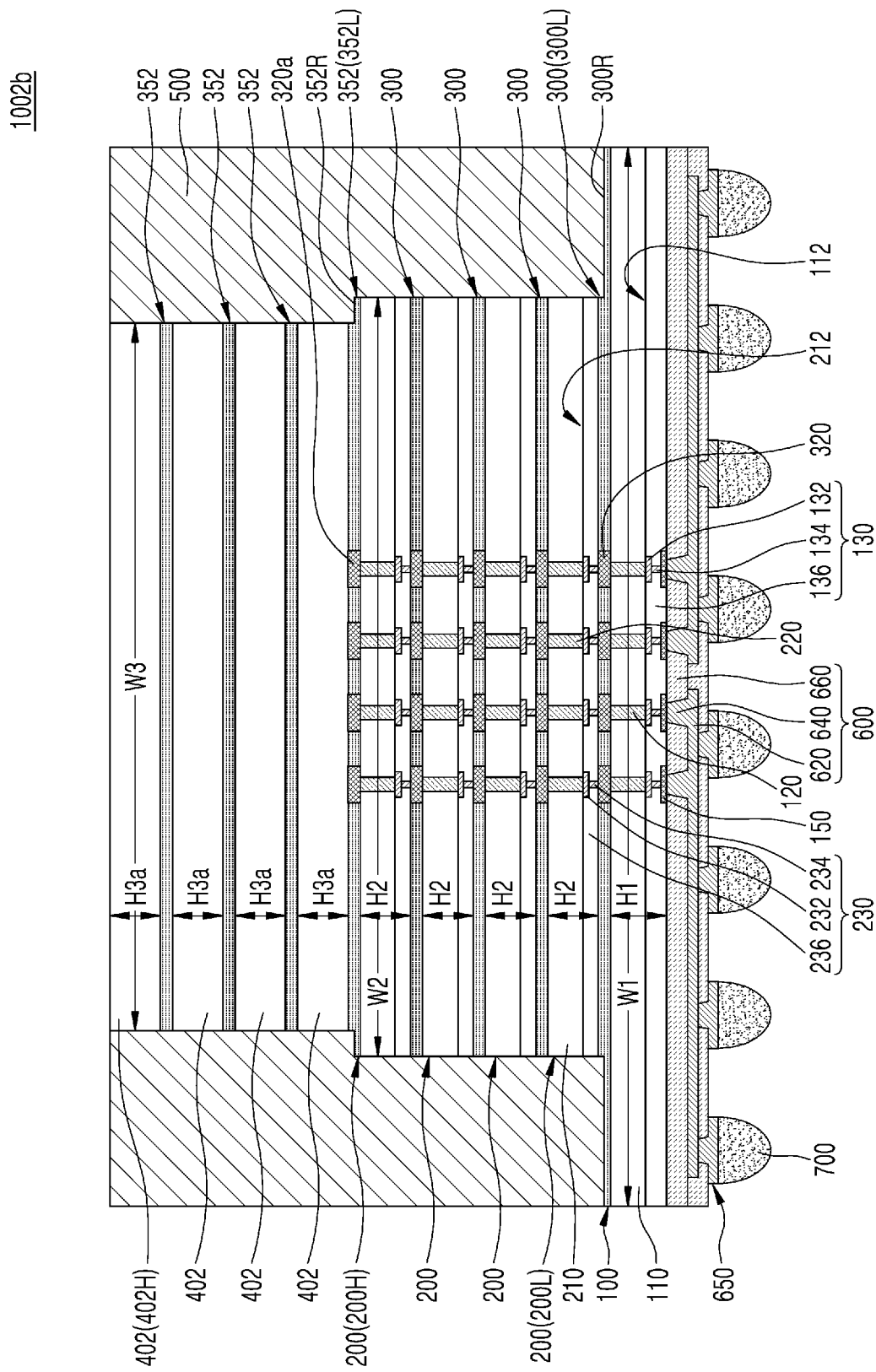

Referring to FIG. 2C, a semiconductor package 1002b may include the first semiconductor chip 100 and the second semiconductor chips 200. The semiconductor package 1002b may include a plurality of thermal coupling pads 320a instead of the top chip connection pads 322 of the semiconductor package 1002 of FIG. 2A. The thermal coupling pads 320a may be disposed between the top surface of the uppermost second semiconductor chip 200H and the bottom surface of the lowermost supporting dummy substrate 402.

Because the thermal coupling pads 320a are disposed between the uppermost second semiconductor chip 200H and the lowermost supporting dummy substrate 402, the lowermost supporting coupling insulation layer 352L may at least partially surround the thermal coupling pads 320a. For example, the lowermost supporting coupling insulation layer 352L may cover the side surfaces of the thermal coupling pads 320a and may fill a space between the uppermost second semiconductor chip 200H and the lowermost supporting dummy substrate 402.

Figure 2D:
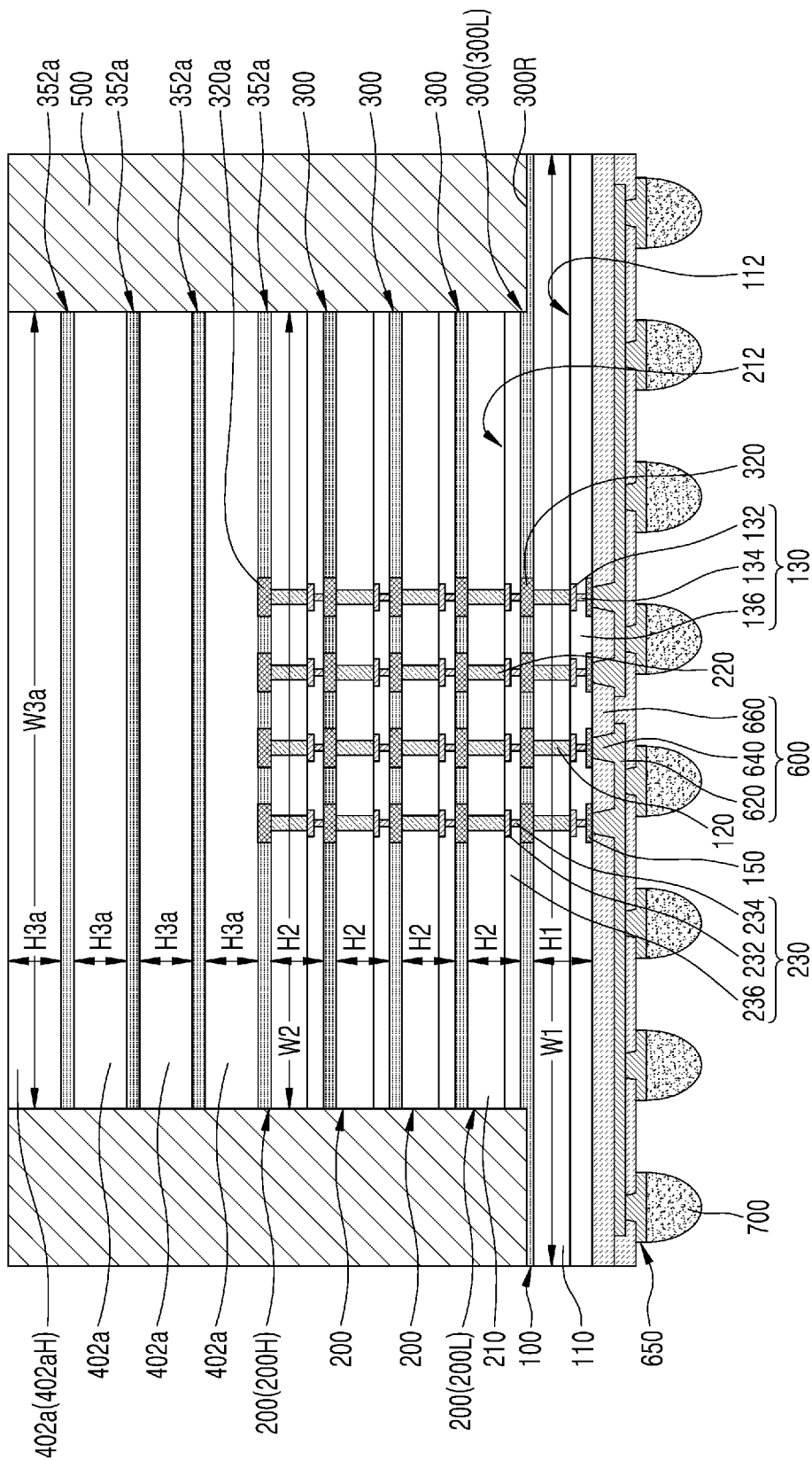

Referring to FIG. 2D, a semiconductor package 1002c may include the first semiconductor chip 100 and the second semiconductor chips 200. The semiconductor package 1002c may include a plurality of thermal coupling pads 320a instead of the top chip connection pads 322 of the semiconductor package 1002a of FIG. 2B. The lowermost supporting coupling insulation layer 352a may at least partially surround the thermal coupling pads 320a. For example, the lowermost supporting coupling insulation layer 352a may cover the side surfaces of the thermal coupling pads 320a and may fill a space between the uppermost second semiconductor chip 200H and the lowermost supporting dummy substrate 402a.

Figure 2E:
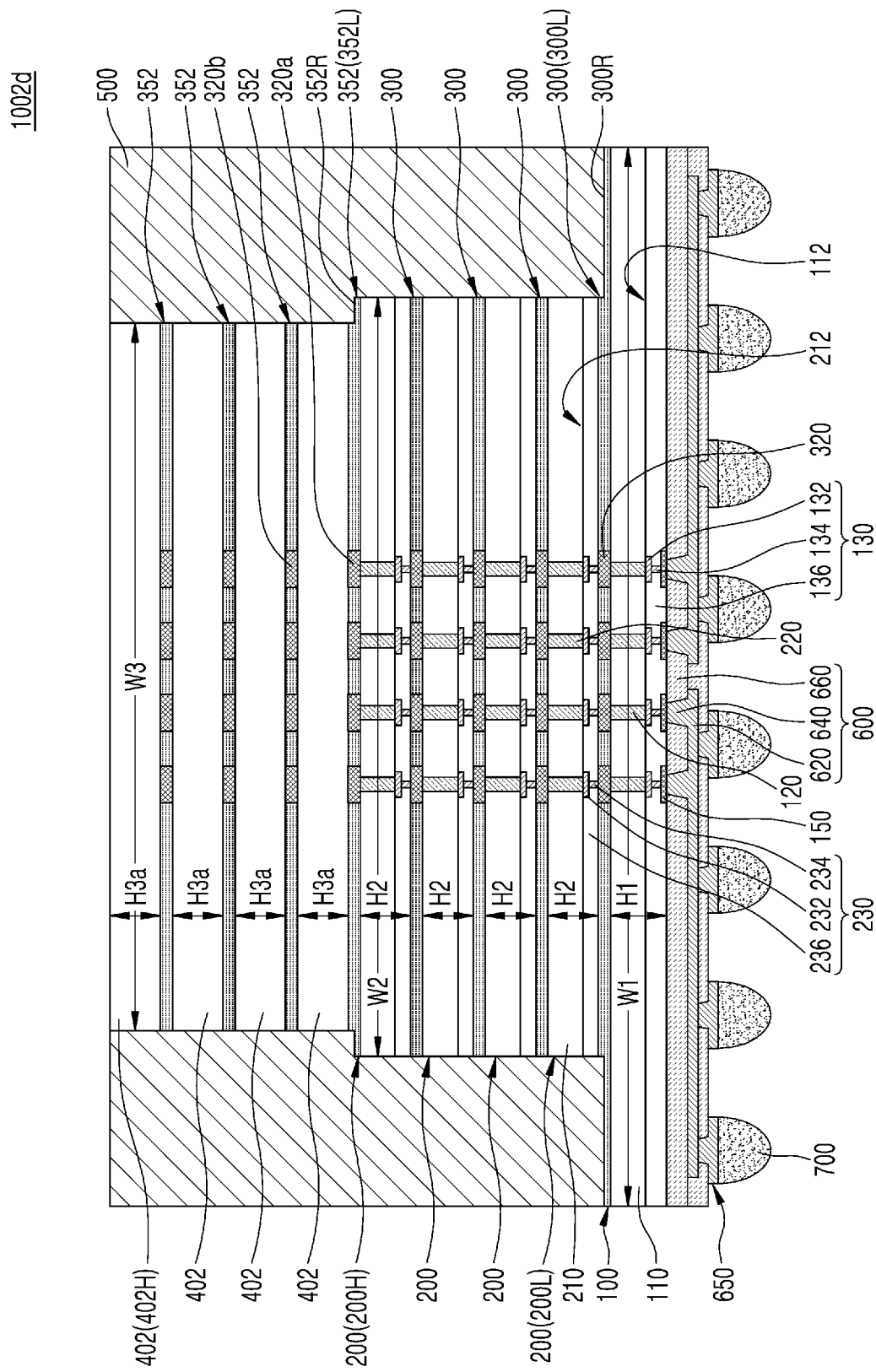

Referring to FIG. 2E, a semiconductor package 1002d may include the first semiconductor chip 100 and the second semiconductor chips 200. Compared to the semiconductor package 1002b of FIG. 2C, the semiconductor package 1002d may further include a plurality of dummy coupling pads 320b.

The dummy coupling pads 320b may be disposed between two adjacent supporting dummy substrates 402. The top and bottom surfaces of each of the dummy coupling pads 320b may be in contact with the bottom and top surfaces of respective two adjacent lowermost supporting dummy substrates 402, which face each other. Each of the dummy coupling pads 320b may be formed by respectively forming conductive material layers, e.g., a top dummy pad 326 and a bottom dummy pad 328 in FIGS. 10A to 10C, on respective facing top and bottom surfaces of the two adjacent supporting dummy substrates 402 and performing diffusion bonding such that the conductive material layers facing each other are expanded by heat to contact each other and are then integrated with each other through the diffusion of metal atoms. For example, the dummy coupling pads 320b may include a material including Copper (Cu).

Each of the supporting coupling insulation layers 352, except for the lowermost supporting coupling insulation layer 352L, may at least partially surround the dummy coupling pads 320b. For example, each of the supporting coupling insulation layers 352, except for the lowermost supporting coupling insulation layer 352L, may cover the side surfaces of the dummy coupling pads 320b and may fill a space between two adjacent supporting dummy substrates 402.

Because the semiconductor package 1002d includes the dummy coupling pads 320b disposed between two adjacent supporting dummy substrates 402, an adhesive strength between the supporting dummy substrates 402 may increase, thereby increasing structural reliability, and heat transmission through the supporting dummy substrates 402 may increase, thereby increasing the ability of the semiconductor package 1002d to release heat.

Figure 2F:
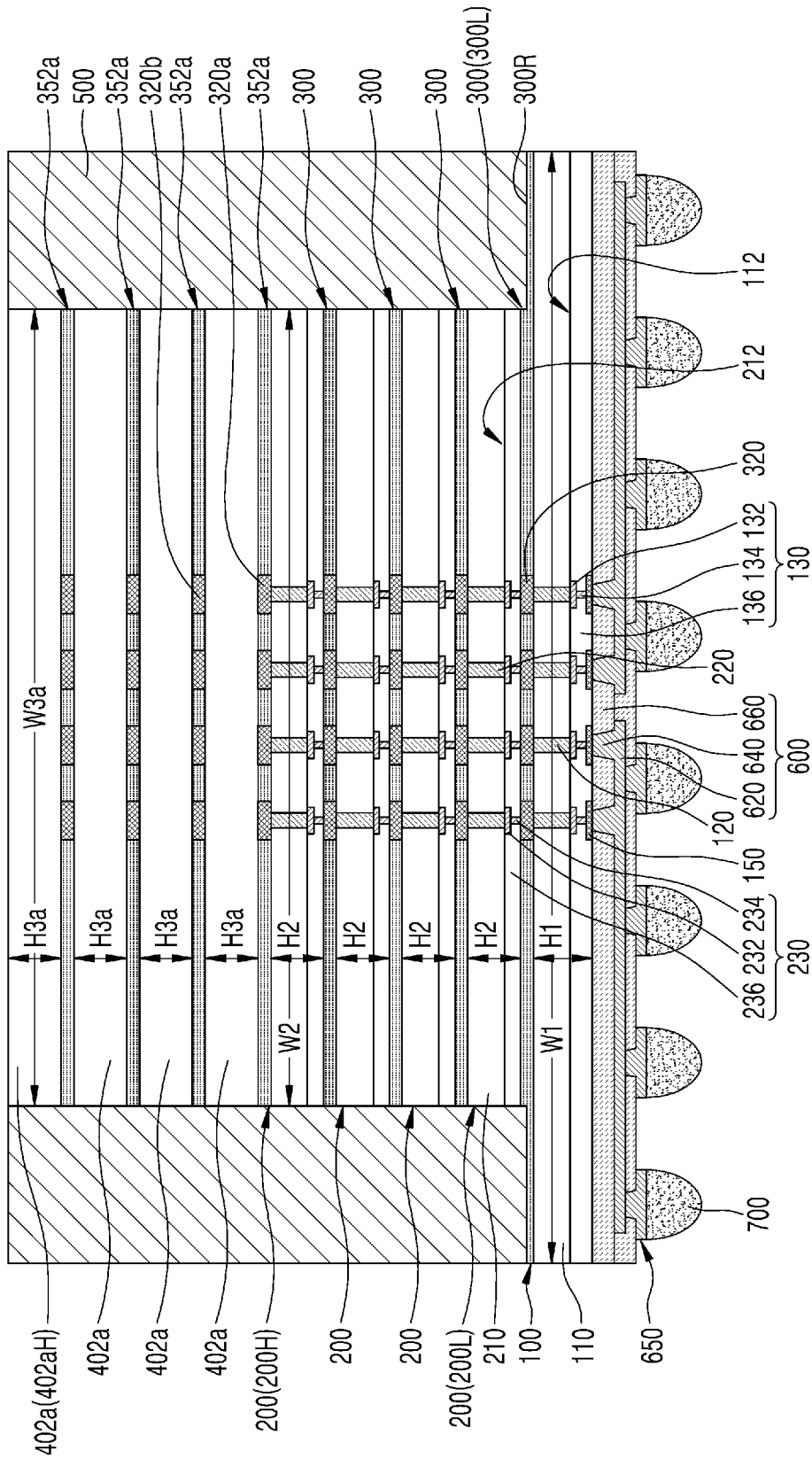

Referring to FIG. 2F, a semiconductor package 1002e may include the first semiconductor chip 100 and the second semiconductor chips 200. Compared to the semiconductor package 1002c of FIG. 2D, the semiconductor package 1002e may further include a plurality of dummy coupling pads 320b. The supporting coupling insulation layers 352a, except for the lowermost supporting coupling insulation layer 352a, may at least partially surround the dummy coupling pads 320b. For example, each of the supporting coupling insulation layers 352a, except for the lowermost supporting coupling insulation layer 352a, may cover the side surfaces of the dummy coupling pads 320b and may fill a space between two adjacent supporting dummy substrates 402a.

Figure 2G:
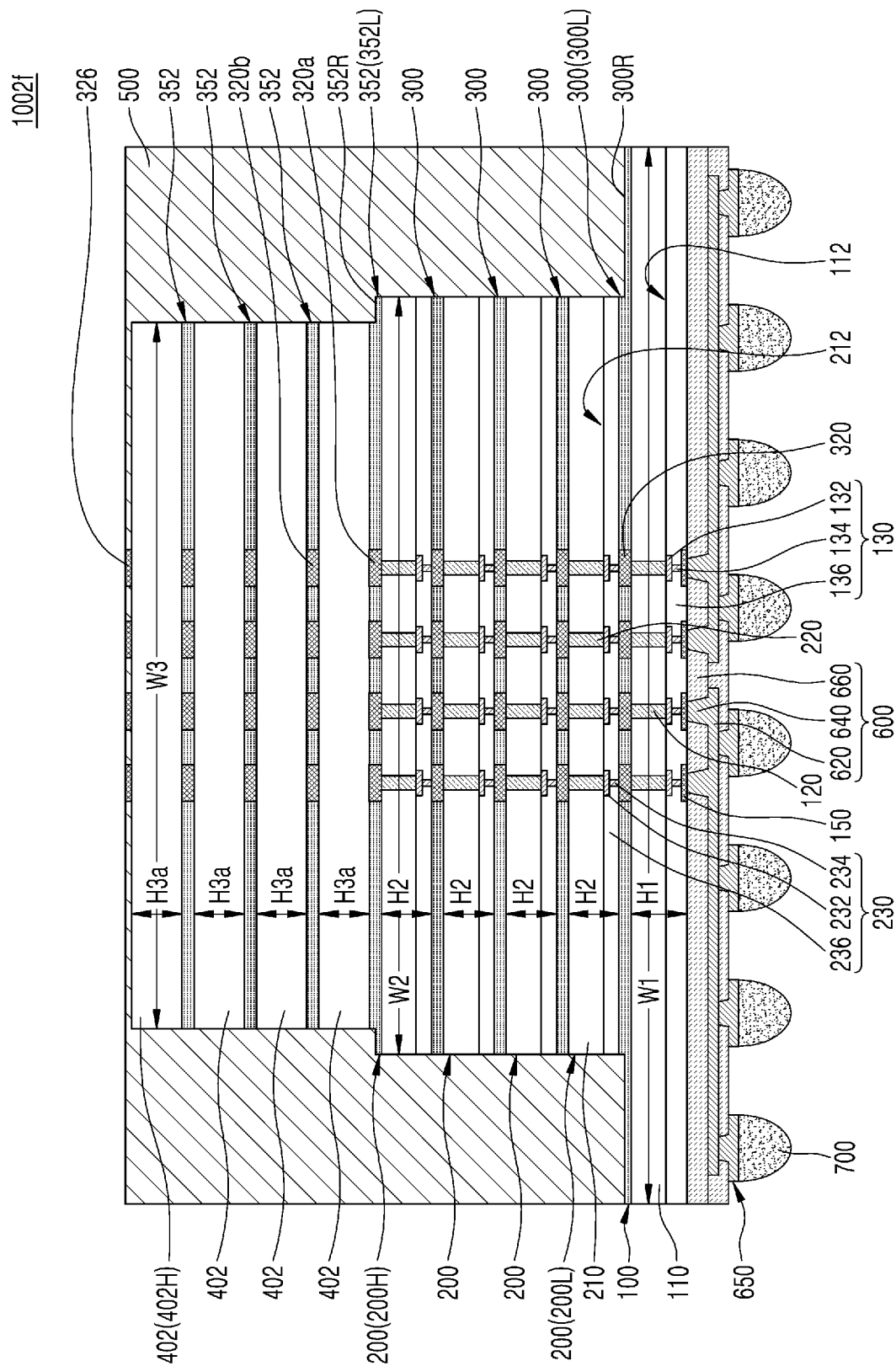

Referring to FIG. 2G, a semiconductor package 1002f may include the first semiconductor chip 100 and the second semiconductor chips 200. Compared to the semiconductor package 1002d of FIG. 2E, the semiconductor package 1002f may further include a plurality of top dummy pads 326.

The top dummy pads 326 may be disposed on the top surface of the uppermost supporting dummy substrate 402H. In some embodiments, the package molding layer 500 may at least partially surround the top dummy pads 326. For example, the package molding layer 500 may cover the top surface of the uppermost supporting dummy substrate 402H and the side surfaces of the top dummy pads 326 and may expose the top surfaces of the top dummy pads 326.

Because the semiconductor package 1002f includes the top dummy pads 326 on the top surface of the uppermost supporting dummy substrate 402H, the ability of the semiconductor package 1002f to release heat may be increased.

Figure 2H:
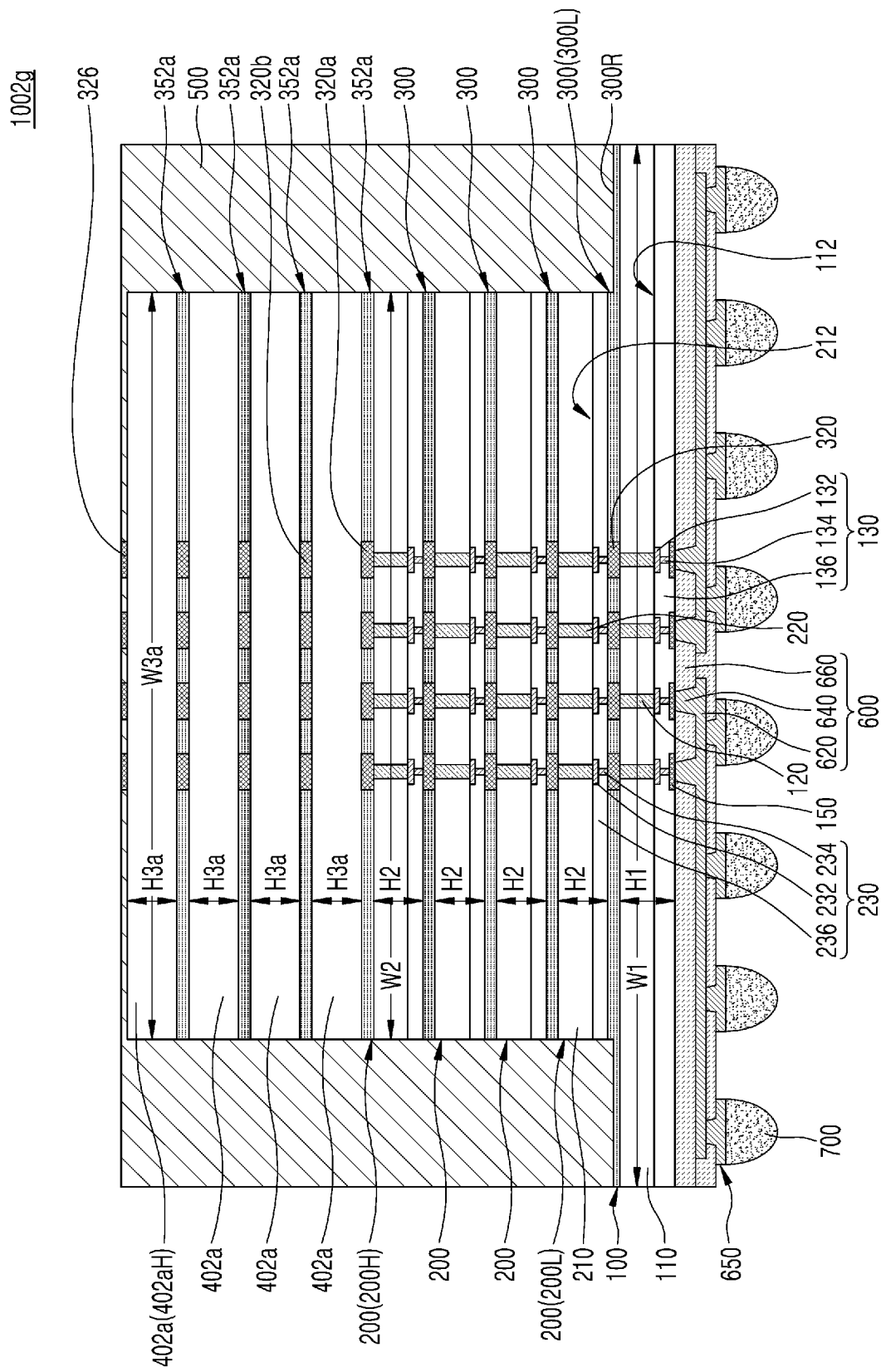

Referring to FIG. 2H, a semiconductor package 1002g may include the first semiconductor chip 100 and the second semiconductor chips 200. Compared to the semiconductor package 1002e of FIG. 2F, the semiconductor package 1002g may further include a plurality of top dummy pads 326.

The top dummy pads 326 may be disposed on the top surface of an uppermost supporting dummy substrate 402aH. In some embodiments, the package molding layer 500 may at least partially surround the top dummy pads 326. For example, the package molding layer 500 may cover the top surface of the uppermost supporting dummy substrate 402aH and the side surfaces of the top dummy pads 326 and may expose the top surfaces of the top dummy pads 326.

Figure 3A:
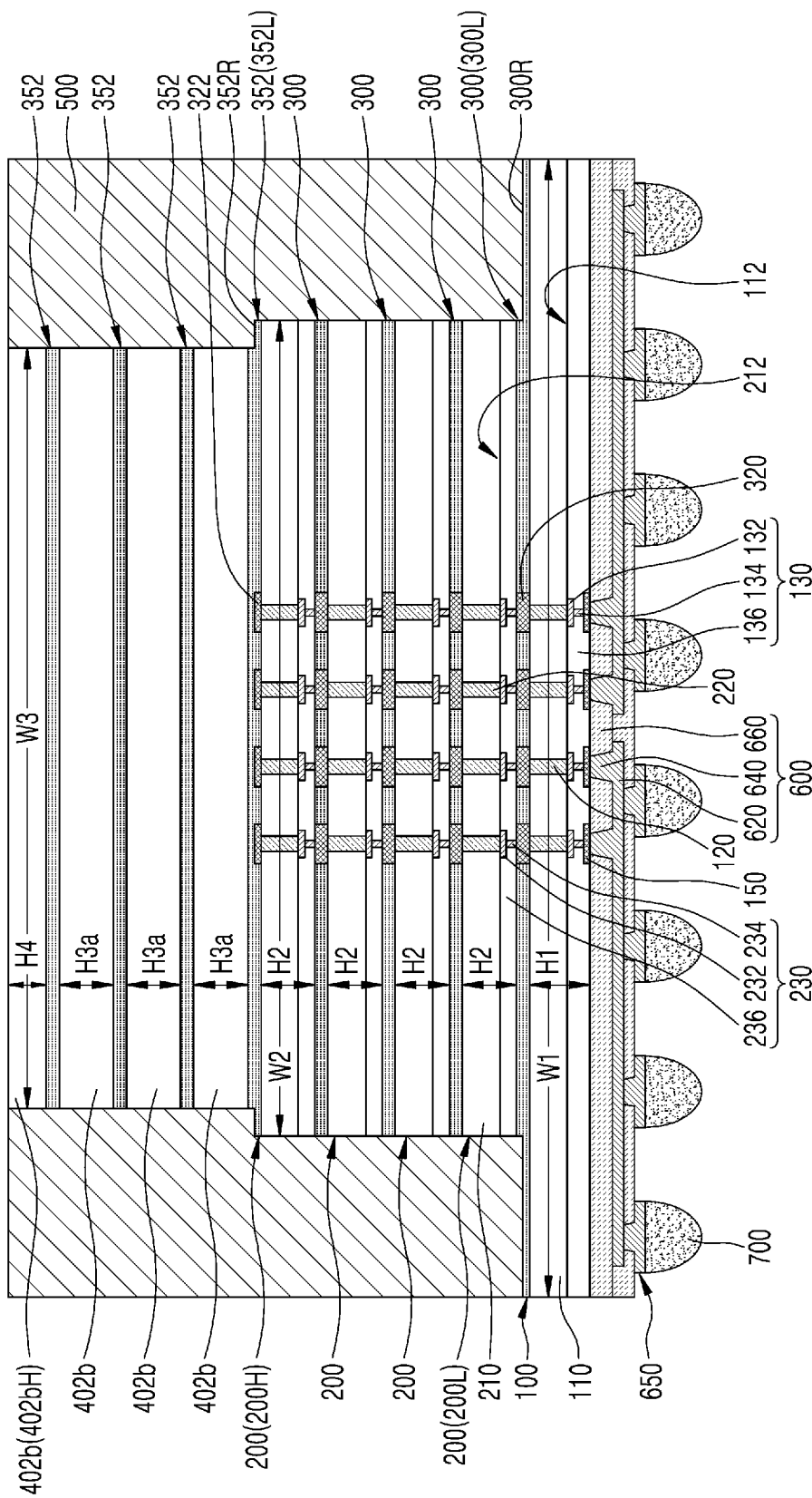

Referring to FIG. 3A, a semiconductor package 1004 may include the first semiconductor chip 100 and the second semiconductor chips 200. The first semiconductor chip 100 and the second semiconductor chips 200 of the semiconductor package 1004 may be electrically connected to each other through the coupling pads 320 and may thus exchange signals with each other and provide power and ground. The semiconductor package 1004 may include a plurality of supporting dummy substrates 402b instead of the supporting dummy substrates 402 of the semiconductor package 1002 of FIG. 2A.

The supporting dummy substrates 402b may be stacked on the uppermost second semiconductor chip 200H. For example, the supporting dummy substrates 402b may include a semiconductor material such as silicon (Si). In some embodiments, the supporting dummy substrates 402b may include only a semiconductor material. For example, each of the supporting dummy substrates 402b may be a part of a bare wafer. The total vertical height of the stack of the supporting dummy substrates 402b may be greater than the second vertical height H2. For example, the total vertical height of the stack of the supporting dummy substrates 402b may be about 100 μm to about 500 μm.

Each of the supporting dummy substrates 402b, except for an uppermost supporting dummy substrate 402bH, may have the third horizontal width W3 and the third vertical height H3a. The uppermost supporting dummy substrate 402bH may have the third horizontal width W3 and a fourth vertical height H4. The fourth vertical height H4 may be less than the third vertical height H3a. For example, the fourth vertical height H4 may be several μm less than the third vertical height H3a.

Figure 3B:
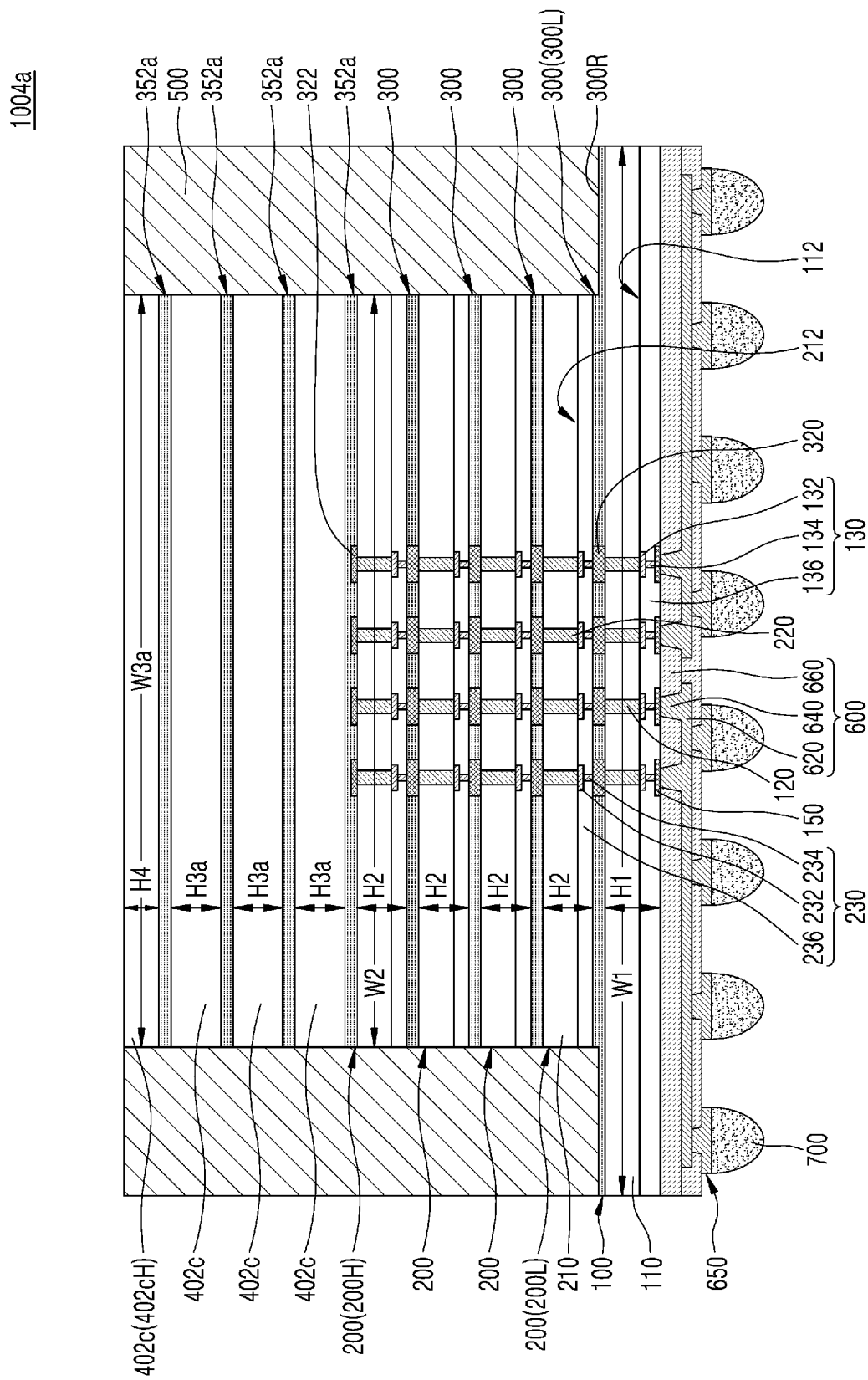

Referring to FIG. 3B, a semiconductor package 1004a may include the first semiconductor chip 100 and the second semiconductor chips 200. The first semiconductor chip 100 and the second semiconductor chips 200 of the semiconductor package 1004a may be electrically connected to each other through the coupling pads 320 and may thus exchange signals with each other and provide power and ground. The semiconductor package 1004a may include a plurality of supporting dummy substrates 402c instead of the supporting dummy substrates 402a of the semiconductor package 1002a of FIG. 2B.

The supporting dummy substrates 402c may be stacked on the uppermost second semiconductor chip 200H. For example, the supporting dummy substrates 402c may include a semiconductor material such as silicon (Si). In some embodiments, the supporting dummy substrates 402c may include only a semiconductor material. For example, each of the supporting dummy substrates 402c may be a part of a bare wafer. A supporting dummy substrate 402c at the top among the supporting dummy substrates 402c may be referred to as an uppermost supporting dummy substrate 402cH.

The supporting dummy substrates 402c, except for the uppermost supporting dummy substrate 402cH, may have the third horizontal width W3a and the third vertical height H3a. The uppermost supporting dummy substrate 402cH may have the third horizontal width W3a and the fourth vertical height H4. The fourth vertical height H4 may be less than the third vertical height H3a. For example, the fourth vertical height H4 may be several μm less than the third vertical height H3a.

Figure 3C:
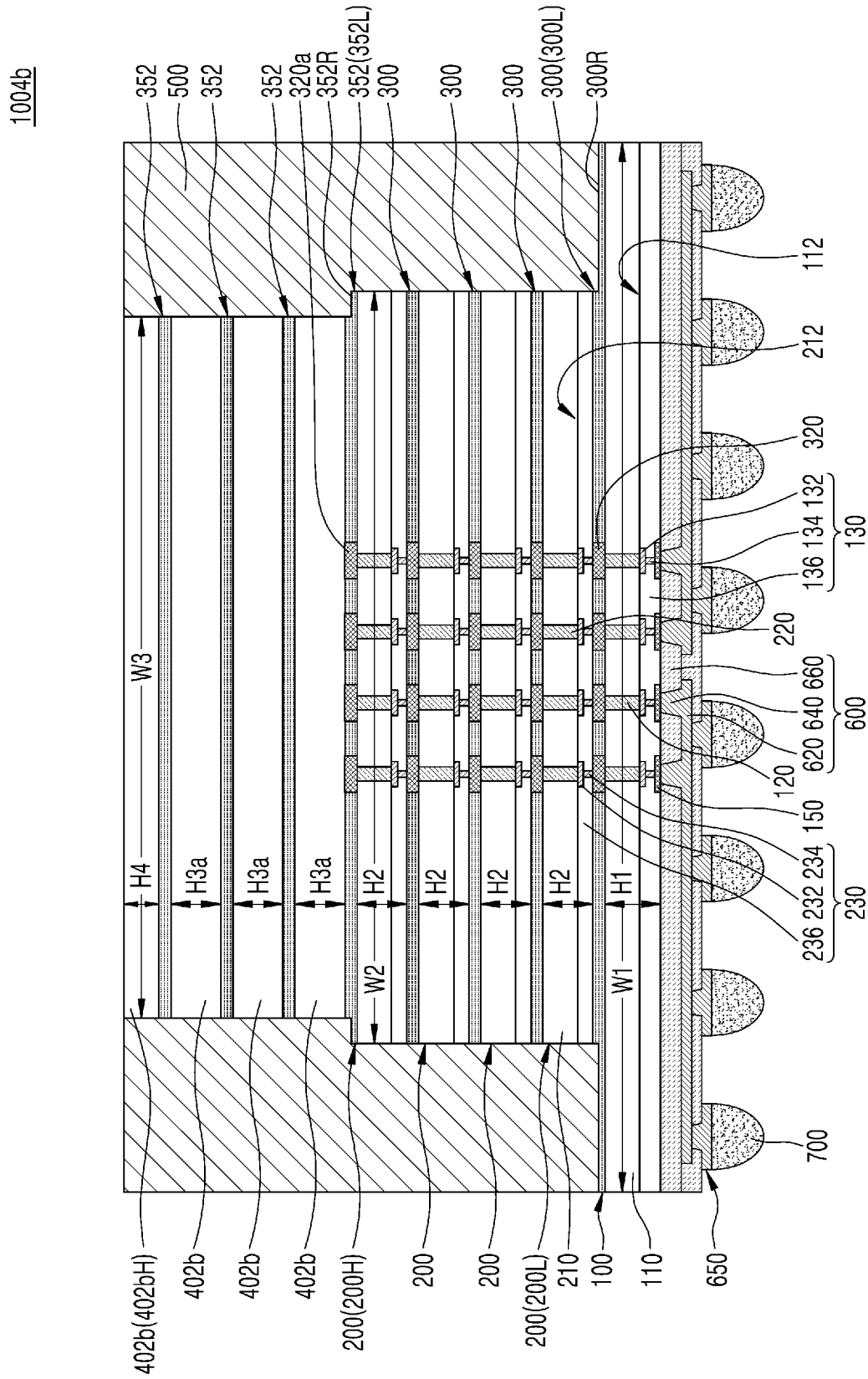

Referring to FIG. 3C, a semiconductor package 1004b may include the first semiconductor chip 100 and the second semiconductor chips 200. The first semiconductor chip 100 and the second semiconductor chips 200 of the semiconductor package 1004b may be electrically connected to each other through the coupling pads 320 and may thus exchange signals with each other and provide power and ground. The semiconductor package 1004b may include a plurality of supporting dummy substrates 402b instead of the supporting dummy substrates 402 of the semiconductor package 1002b of FIG. 2C.

Figure 3D:
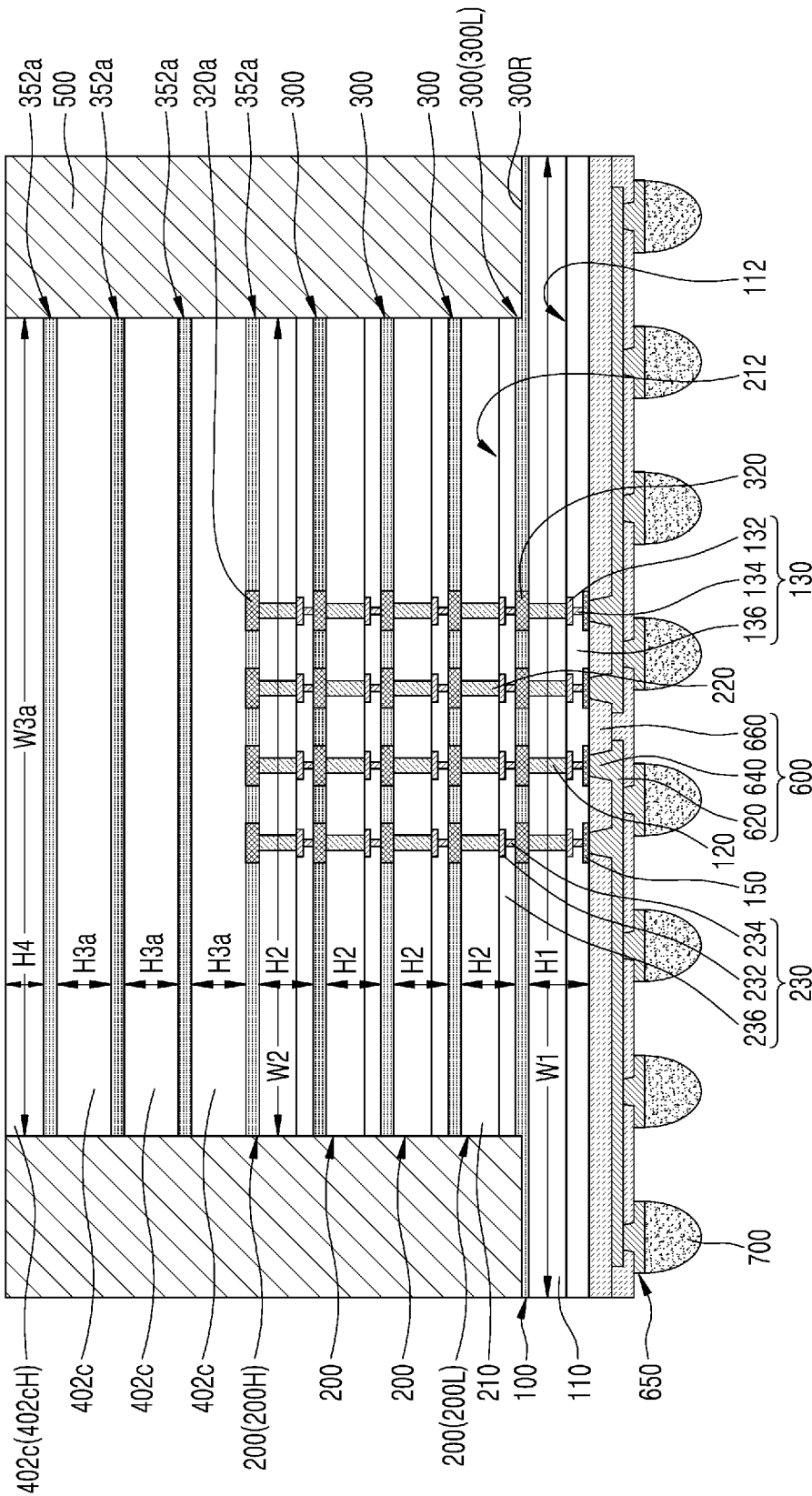

Referring to FIG. 3D, a semiconductor package 1004c may include the first semiconductor chip 100 and the second semiconductor chips 200. The first semiconductor chip 100 and the second semiconductor chips 200 of the semiconductor package 1004c may be electrically connected to each other through the coupling pads 320 and may thus exchange signals with each other and provide power and ground. The semiconductor package 1004c may include a plurality of supporting dummy substrates 402c instead of the supporting dummy substrates 402a of the semiconductor package 1002c of FIG. 2D.

Figure 3E:
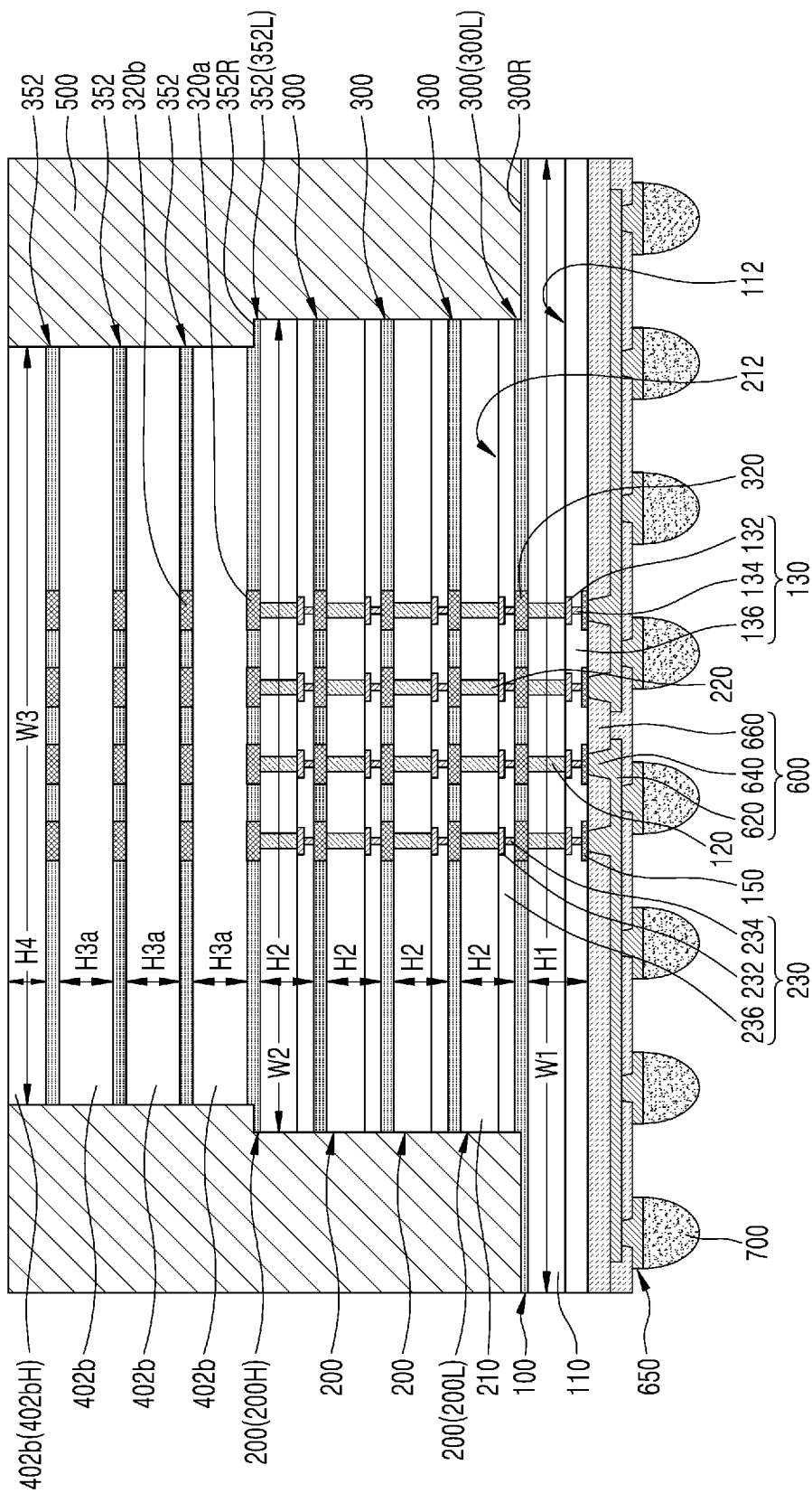

Referring to FIG. 3E, a semiconductor package 1004d may include the first semiconductor chip 100 and the second semiconductor chips 200. The first semiconductor chip 100 and the second semiconductor chips 200 of the semiconductor package 1004d may be electrically connected to each other through the coupling pads 320 and may thus exchange signals with each other and provide power and ground. The semiconductor package 1004d may include a plurality of supporting dummy substrates 402b instead of the supporting dummy substrates 402 of the semiconductor package 1002d of FIG. 2E.

Figure 3F:
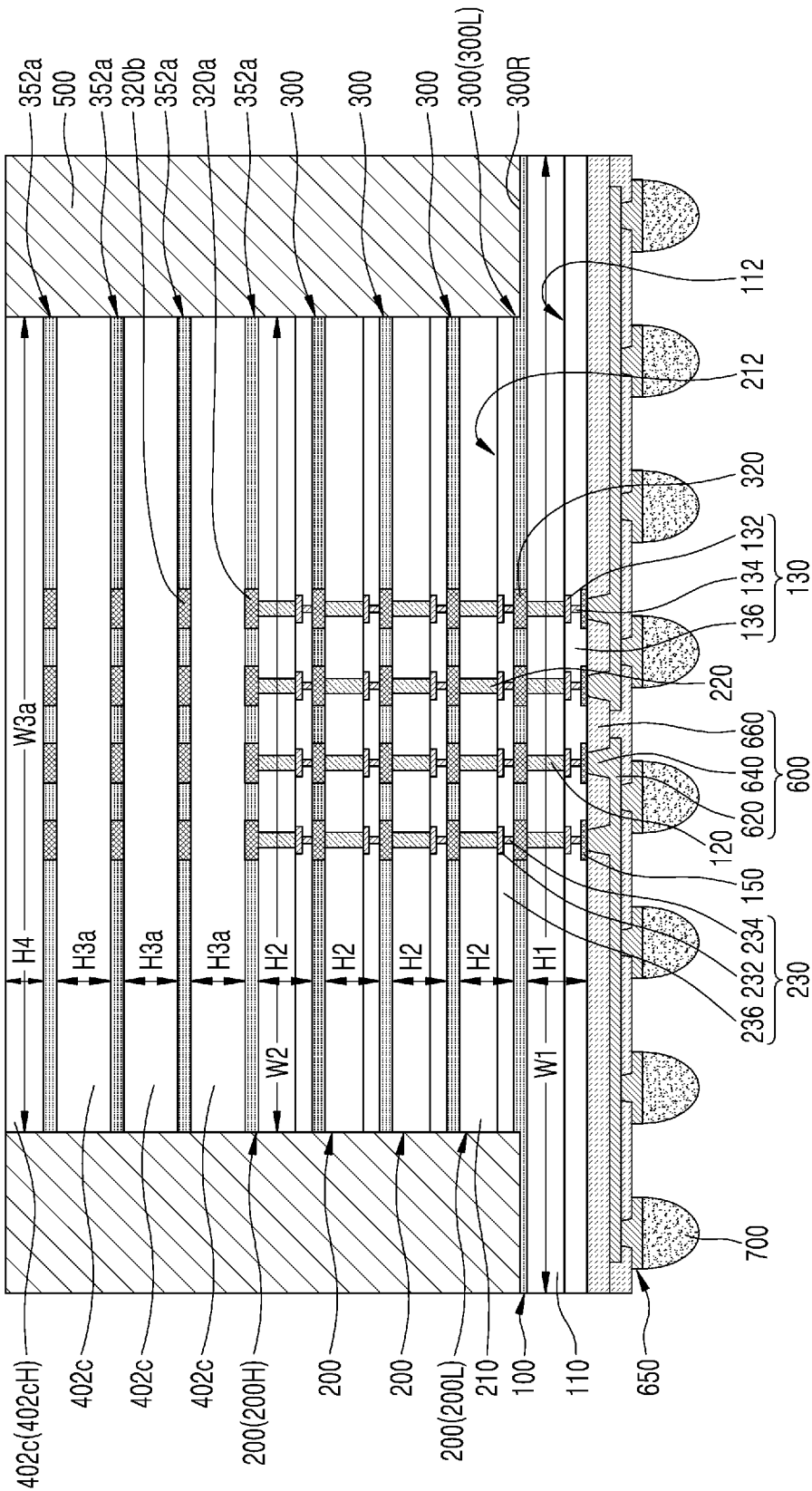

Referring to FIG. 3F, a semiconductor package 1004e may include the first semiconductor chip 100 and the second semiconductor chips 200. The first semiconductor chip 100 and the second semiconductor chips 200 of the semiconductor package 1004e may be electrically connected to each other through the coupling pads 320 and may thus exchange signals with each other and provide power and ground. The semiconductor package 1004e may include a plurality of supporting dummy substrates 402c instead of the supporting dummy substrates 402a of the semiconductor package 1002e of FIG. 2F.

Figure 4A:
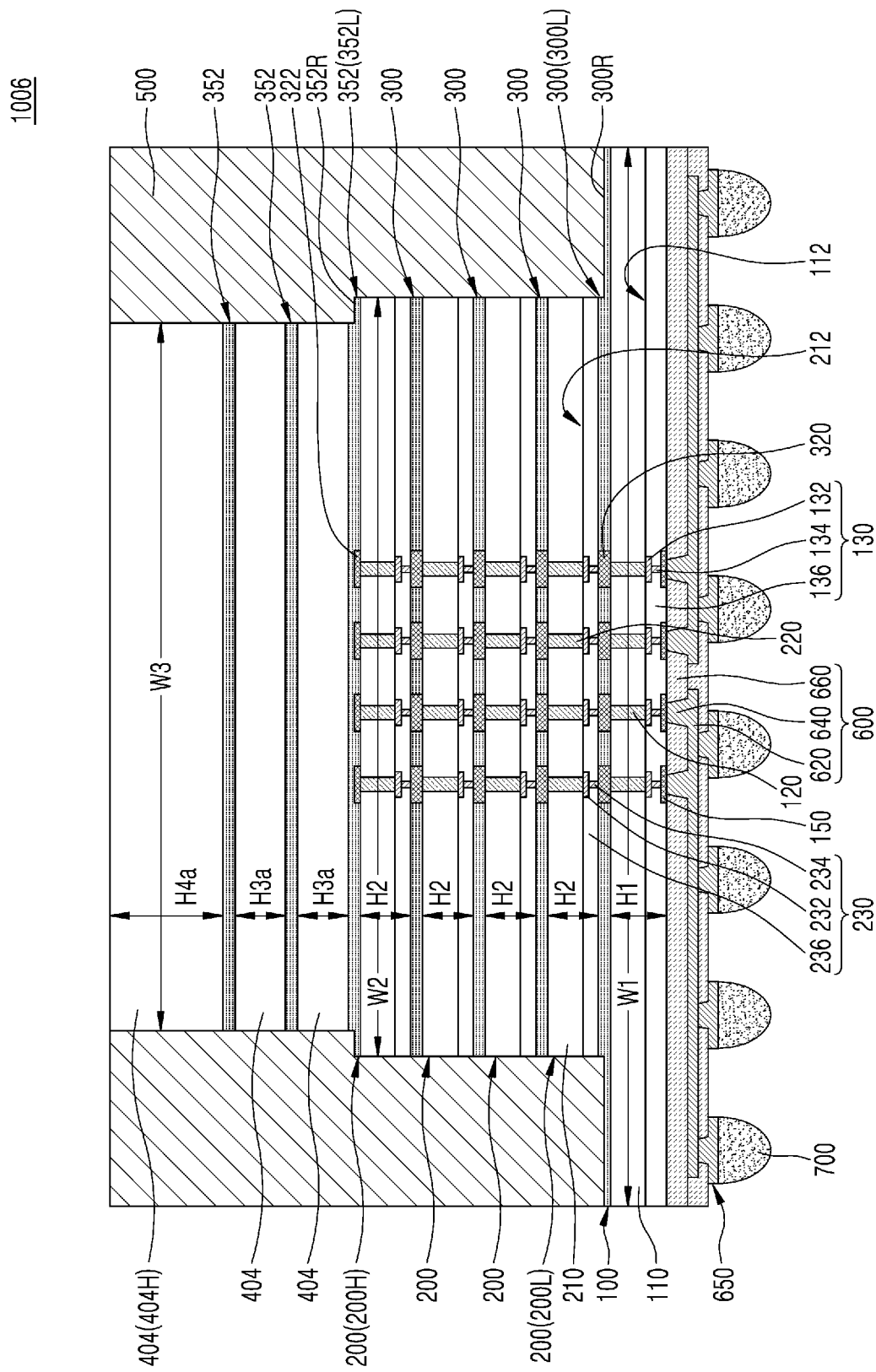

Referring to FIG. 4A, a semiconductor package 1006 may include the first semiconductor chip 100 and the second semiconductor chips 200. The first semiconductor chip 100 and the second semiconductor chips 200 of the semiconductor package 1006 may be electrically connected to each other through the coupling pads 320 and may thus exchange signals with each other and provide power and ground. The semiconductor package 1006 may include a plurality of supporting dummy substrates 404 instead of the supporting dummy substrates 402 of the semiconductor package 1002 of FIG. 2A.

The supporting dummy substrates 404 may be stacked on the uppermost second semiconductor chip 200H. For example, the supporting dummy substrates 404 may include a semiconductor material such as silicon (Si). In some embodiments, the supporting dummy substrates 404 may include only a semiconductor material. For example, each of the supporting dummy substrates 404 may be a part of a bare wafer. A supporting dummy substrate 404 at the top among the supporting dummy substrates 404 may be referred to as an uppermost supporting dummy substrate 404H. The total vertical height of the stack of the supporting dummy substrates 404 may be greater than the second vertical height H2. For example, the total vertical height of the stack of the supporting dummy substrates 404 may be about 100 μm to about 500 μm.

The supporting dummy substrates 404, except for the uppermost supporting dummy substrate 404H, may have the third horizontal width W3 and the third vertical height H3a. The uppermost supporting dummy substrate 404H may have the third horizontal width W3 and a fourth vertical height H4a. The fourth vertical height H4a may be greater than the third vertical height H3a. For example, the fourth vertical height H4a may be several tens to hundreds of μm greater than the third vertical height H3a.

Figure 4B:
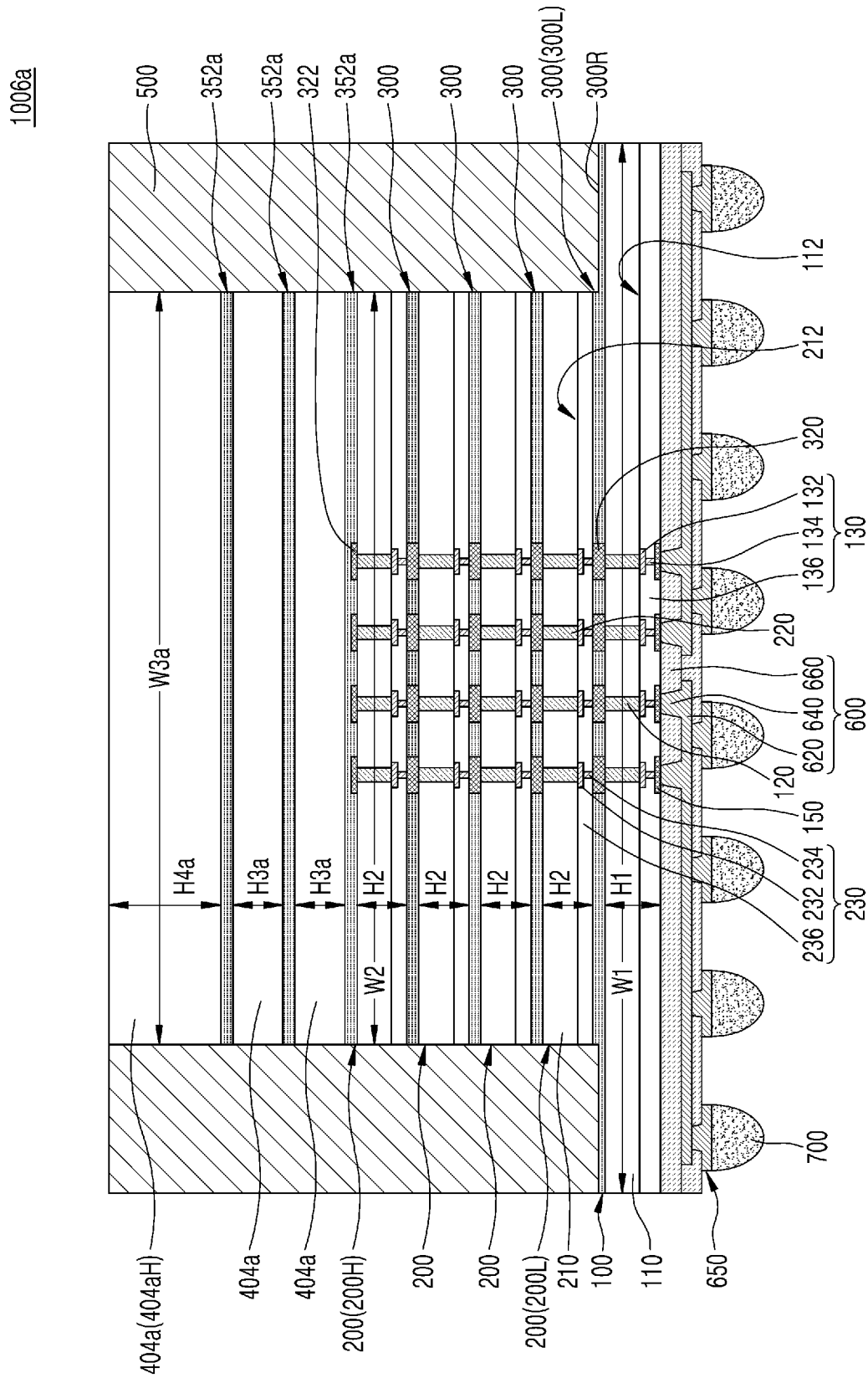

Referring to FIG. 4B, a semiconductor package 1006a may include the first semiconductor chip 100 and the second semiconductor chips 200. The first semiconductor chip 100 and the second semiconductor chips 200 of the semiconductor package 1006a may be electrically connected to each other through the coupling pads 320 and may thus exchange signals with each other and provide power and ground. The semiconductor package 1006a may include a plurality of supporting dummy substrates 404a instead of the supporting dummy substrates 402a of the semiconductor package 1002a of FIG. 2B.

The supporting dummy substrates 404a may be stacked on the uppermost second semiconductor chip 200H. For example, the supporting dummy substrates 404a may include a semiconductor material such as silicon (Si). In some embodiments, the supporting dummy substrates 404a may include only a semiconductor material. For example, each of the supporting dummy substrates 404a may be a part of a bare wafer. A supporting dummy substrate 404a at the top among the supporting dummy substrates 404a may be referred to as an uppermost supporting dummy substrate 404aH.

The supporting dummy substrates 404a, except for the uppermost supporting dummy substrate 404aH, may have the third horizontal width W3a and the third vertical height H3a. The uppermost supporting dummy substrate 404aH may have the third horizontal width W3a and the fourth vertical height H4a. The fourth vertical height H4a may be greater than the third vertical height H3a. For example, the fourth vertical height H4a may be several tens to hundreds of μm greater than the third vertical height H3a.

Figure 4C:
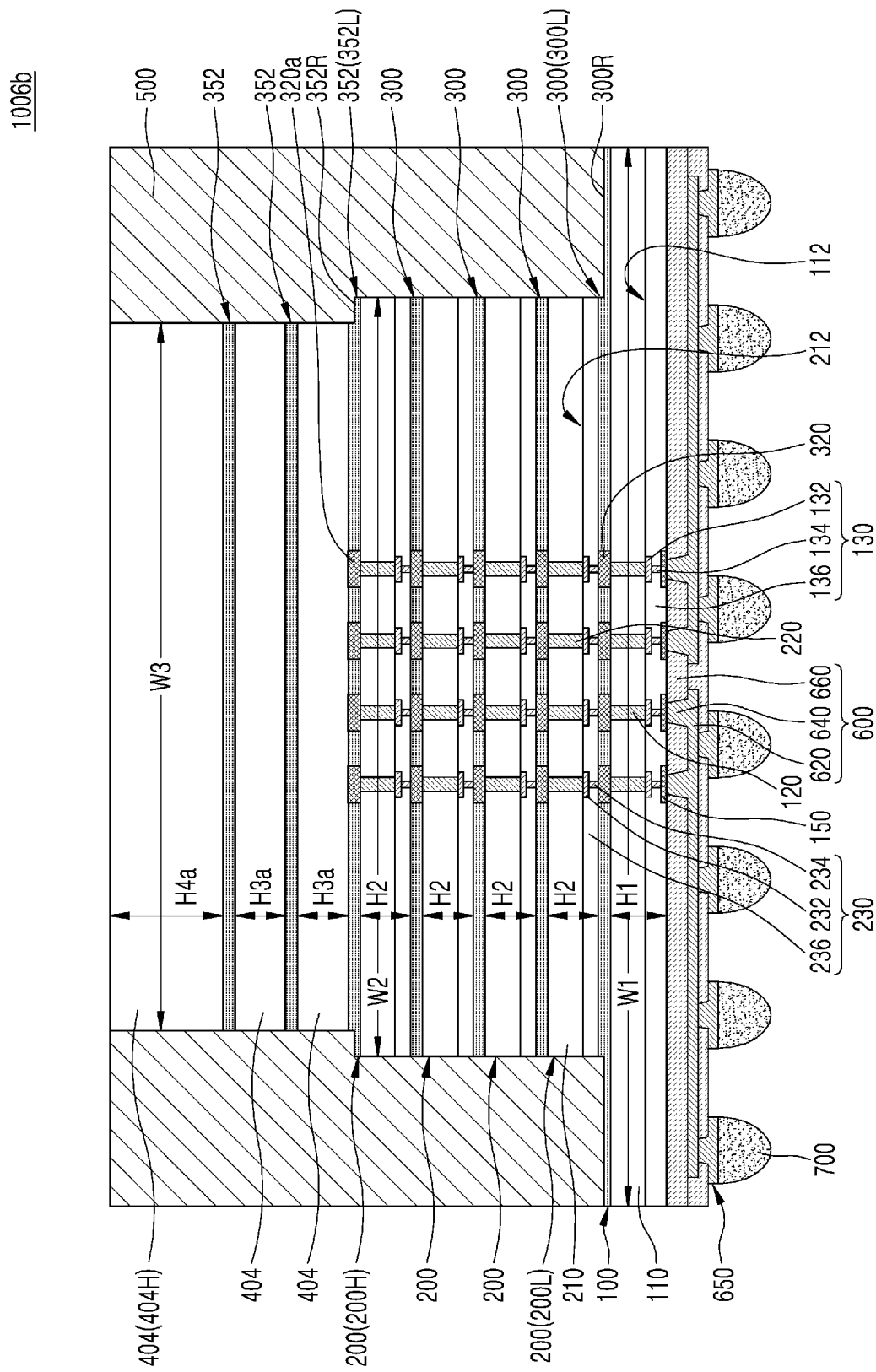

Referring to FIG. 4C, a semiconductor package 1006b may include the first semiconductor chip 100 and the second semiconductor chips 200. The first semiconductor chip 100 and the second semiconductor chips 200 of the semiconductor package 1006b may be electrically connected to each other through the coupling pads 320 and may thus exchange signals with each other and provide power and ground. The semiconductor package 1006b may include a plurality of supporting dummy substrates 404 instead of the supporting dummy substrates 402 of the semiconductor package 1002b of FIG. 2C.

Figure 4D:
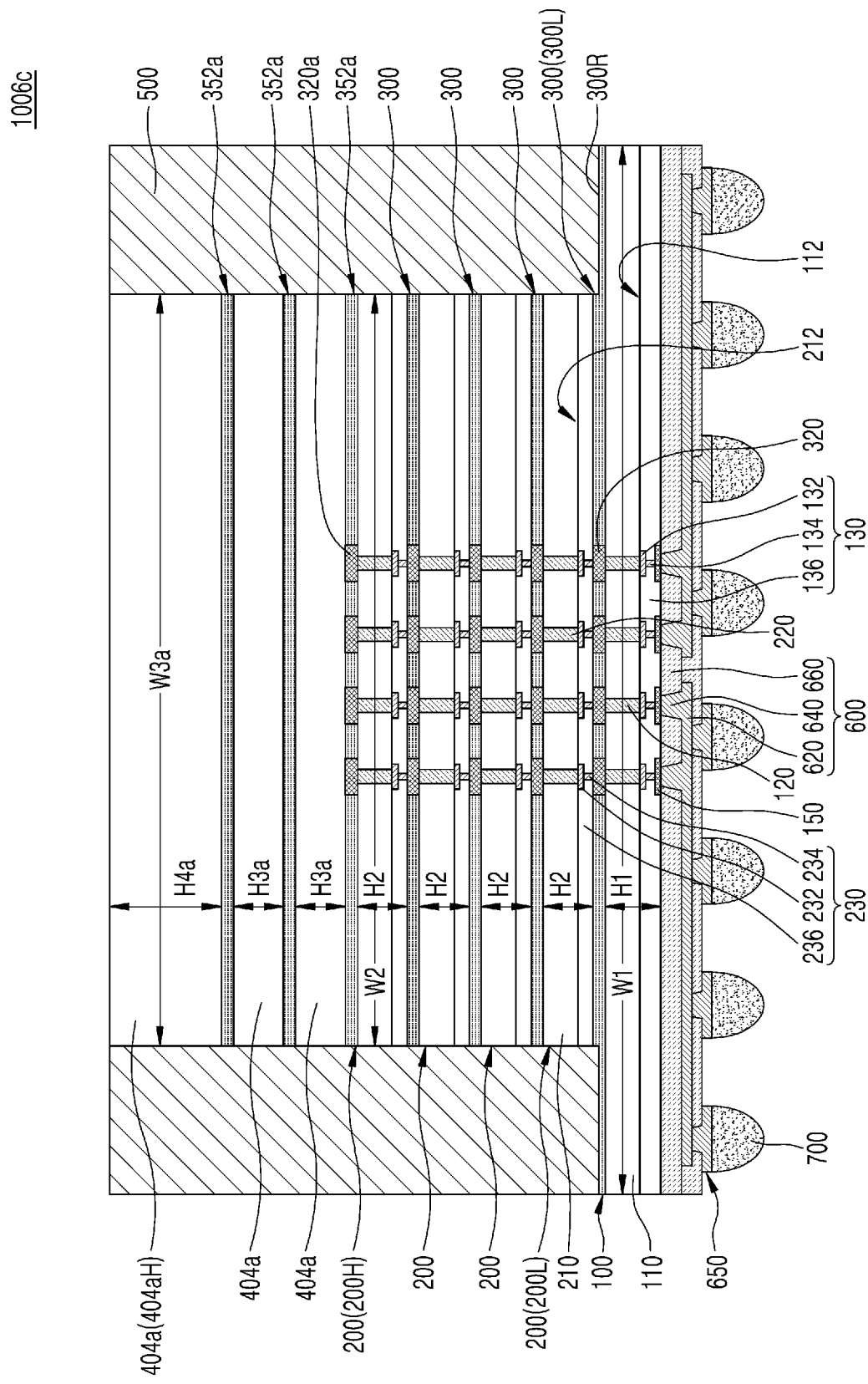

Referring to FIG. 4D, a semiconductor package 1006c may include the first semiconductor chip 100 and the second semiconductor chips 200. The first semiconductor chip 100 and the second semiconductor chips 200 of the semiconductor package 1006c may be electrically connected to each other through the coupling pads 320 and may thus exchange signals with each other and provide power and ground. The semiconductor package 1006c may include a plurality of supporting dummy substrates 404a instead of the supporting dummy substrates 402a of the semiconductor package 1002c of FIG. 2D.

Figure 4E:
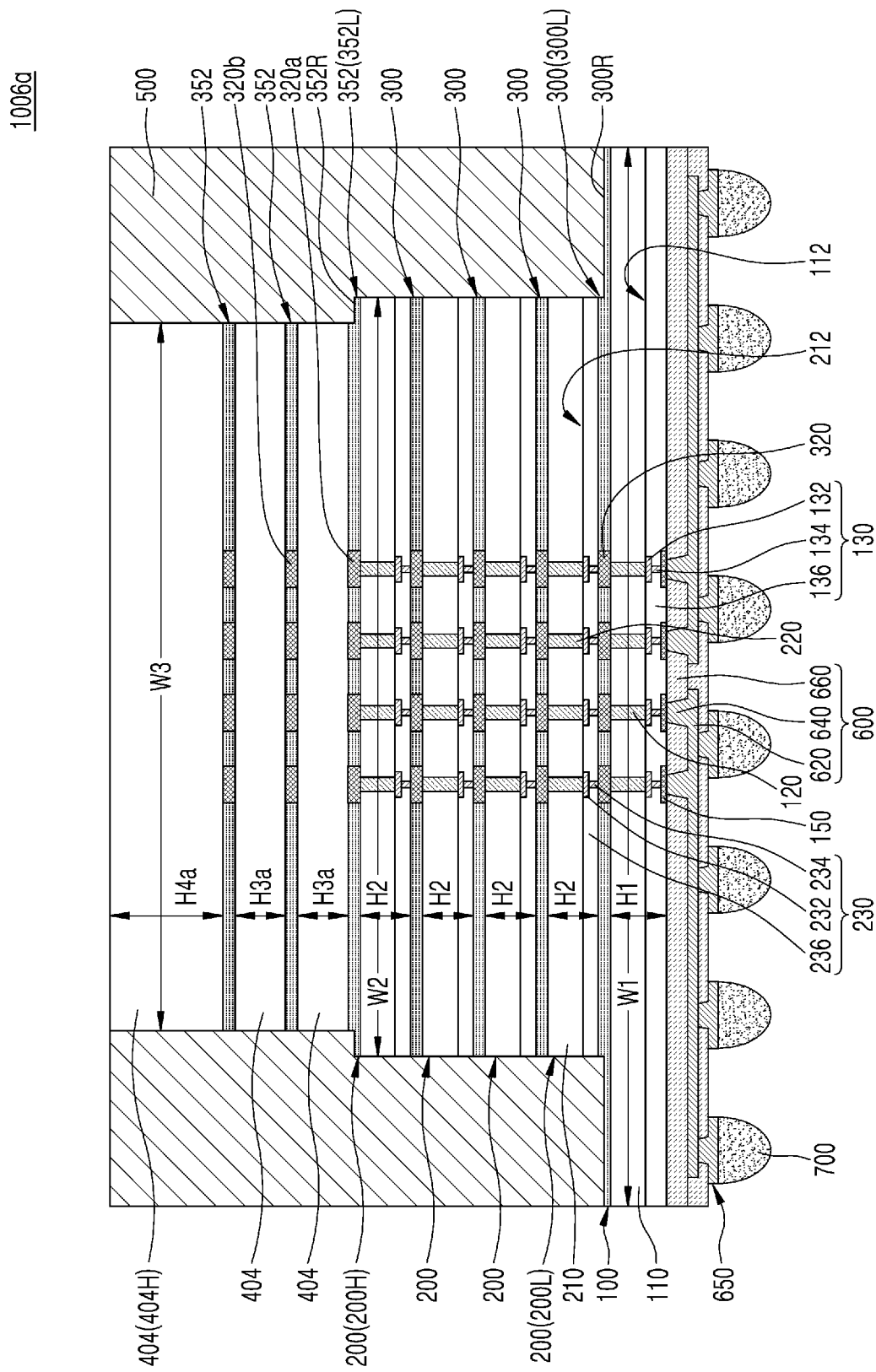

Referring to FIG. 4E, a semiconductor package 1006d may include the first semiconductor chip 100 and the second semiconductor chips 200. The first semiconductor chip 100 and the second semiconductor chips 200 of the semiconductor package 1006d may be electrically connected to each other through the coupling pads 320 and may thus exchange signals with each other and provide power and ground. The semiconductor package 1006d may include a plurality of supporting dummy substrates 404 instead of the supporting dummy substrates 402 of the semiconductor package 1002d of FIG. 2E.

Figure 4F:
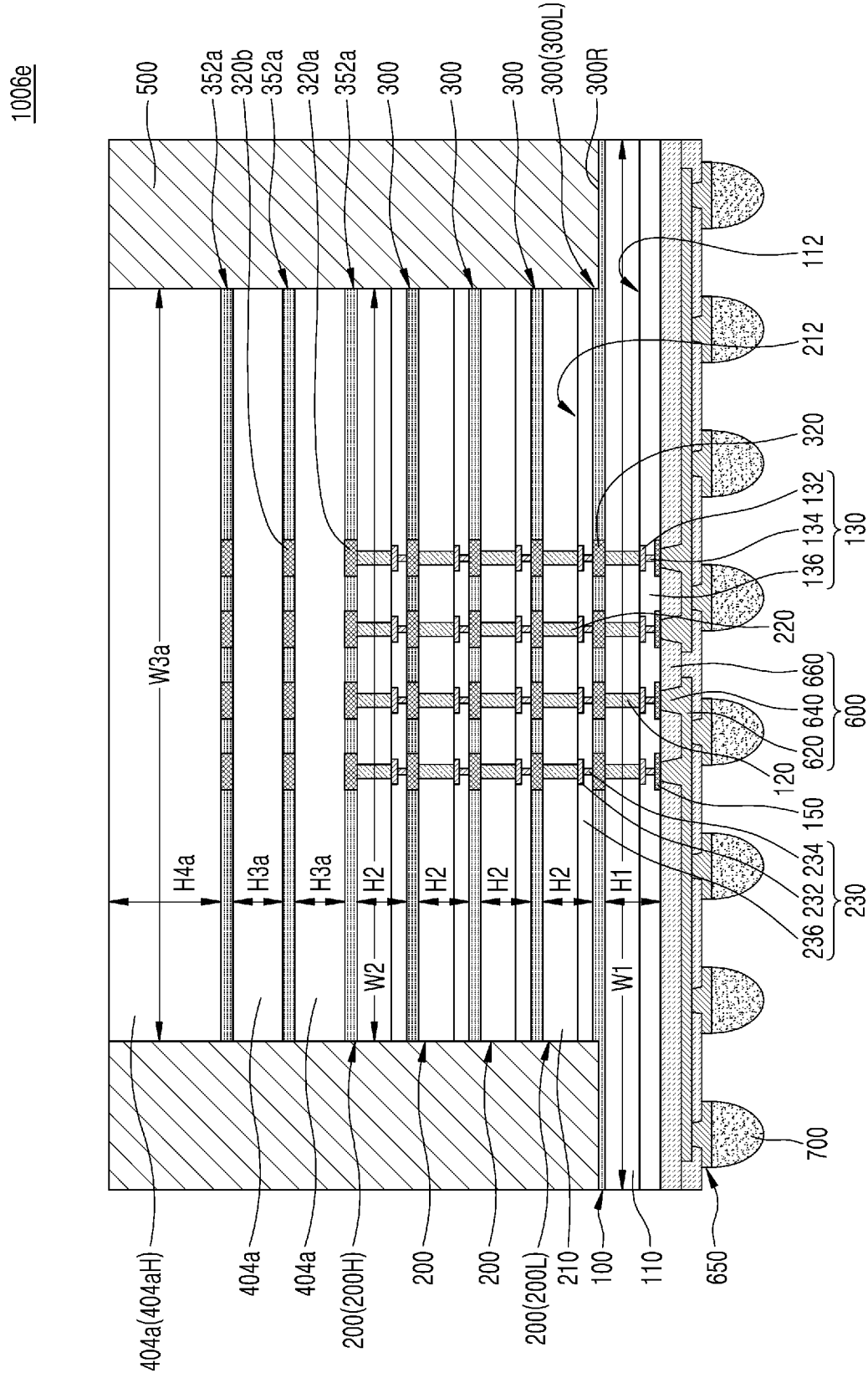

Referring to FIG. 4F, a semiconductor package 1006e may include the first semiconductor chip 100 and the second semiconductor chips 200. The first semiconductor chip 100 and the second semiconductor chips 200 of the semiconductor package 1006e may be electrically connected to each other through the coupling pads 320 and may thus exchange signals with each other and provide power and ground. The semiconductor package 1006e may include a plurality of supporting dummy substrates 404a instead of the supporting dummy substrates 402a of the semiconductor package 1002e of FIG. 2F.

Figure 4G:
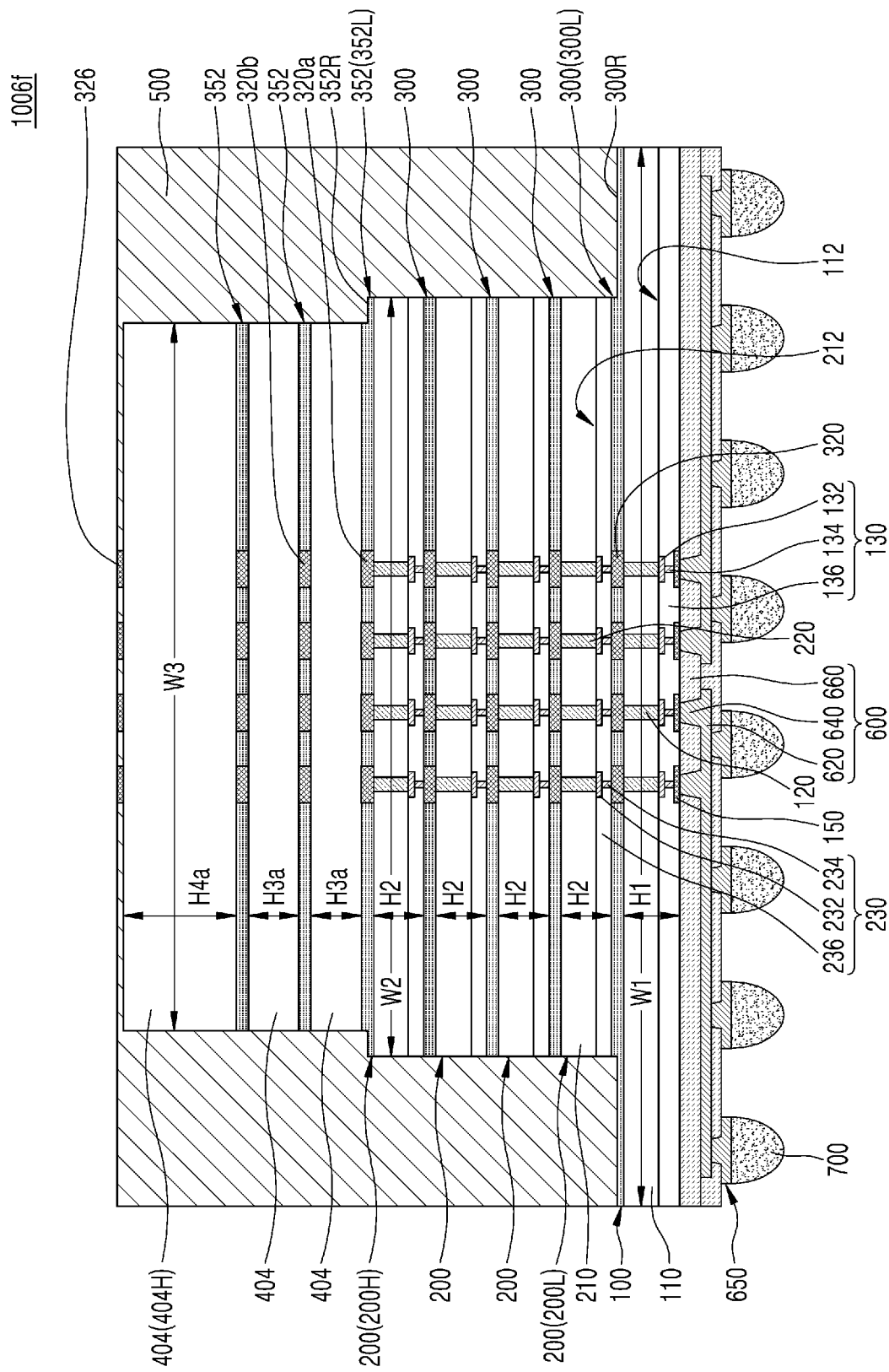

Referring to FIG. 4G, a semiconductor package 1006f may include the first semiconductor chip 100 and the second semiconductor chips 200. The first semiconductor chip 100 and the second semiconductor chips 200 of the semiconductor package 1006f may be electrically connected to each other through the coupling pads 320 and may thus exchange signals with each other and provide power and ground. The semiconductor package 1006f may include a plurality of supporting dummy substrates 404 instead of the supporting dummy substrates 402 of the semiconductor package 1002f of FIG. 2G.

Figure 4H:
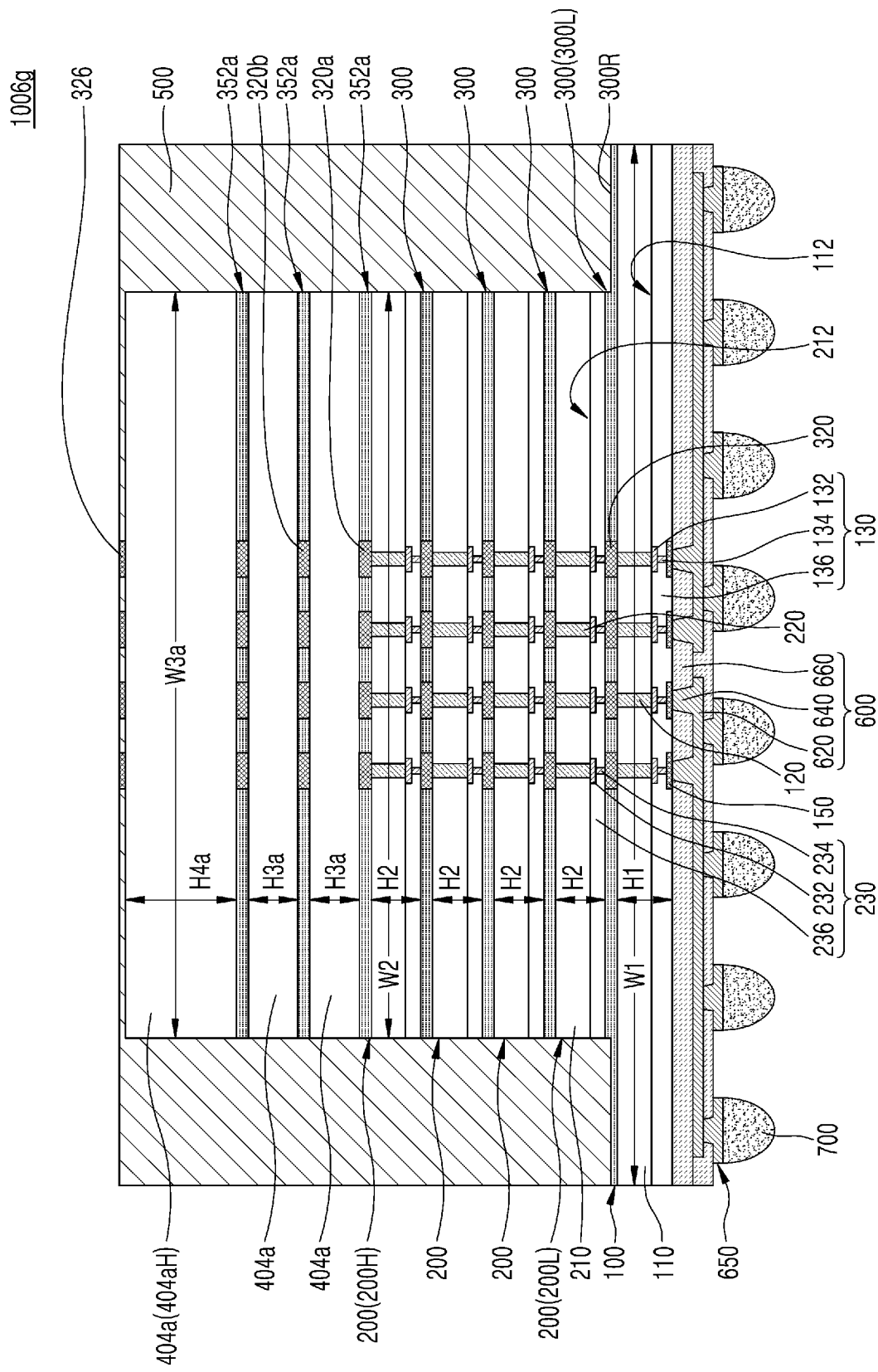

Referring to FIG. 4H, a semiconductor package 1006g may include the first semiconductor chip 100 and the second semiconductor chips 200. The first semiconductor chip 100 and the second semiconductor chips 200 of the semiconductor package 1006g may be electrically connected to each other through the coupling pads 320 and may thus exchange signals with each other and provide power and ground. The semiconductor package 1006g may include a plurality of supporting dummy substrates 404a instead of the supporting dummy substrates 402a of the semiconductor package 1002g of FIG. 2H.

FIGS. 5A to 5I are cross-sectional views of a method of manufacturing a semiconductor package, according to embodiments. For example, FIGS. 5A to 5I are cross-sectional views of a method of manufacturing the semiconductor package 1000 of FIG. 1A, and to the extent that a detailed description of an element has been omitted, it may be assumed that the element is at least similar to corresponding elements that have been described elsewhere within the specification.

Referring to FIG. 5A, a plurality of top chip connection pads 322 and the top chip coupling insulation material layer 302 are formed on the top surface of the first semiconductor chip 100. The top chip connection pads 322 may be disposed on the top surface, i.e., the inactive surface, of the first semiconductor chip 100. The top chip connection pads 322 may be disposed on the top surface of the first semiconductor chip 100 and may be connected to a plurality of first through electrodes 120. The top chip coupling insulation material layer 302 may be formed on the top surface, i.e., the inactive surface, of the first semiconductor chip 100 to at least partially surround the side surfaces of the top chip connection pads 322. The top chip coupling insulation material layer 302 may cover the top surface of the first semiconductor chip 100 and the side surfaces of the top chip connection pads 322 and may expose the top surfaces of the top chip connection pads 322.

The first semiconductor chip 100 having formed there on the top chip connection pads 322 and the top chip coupling insulation material layer 302 is attached to a first supporting substrate 10. After a first release film 20 is attached to the top surface of the first supporting substrate 10, the first semiconductor chip 100 may be attached to the first release film 20. The first semiconductor chip 100 may be attached to the first release film 20 such that the first wiring structure 130 faces the first supporting substrate 10.

A plurality of top chip connection pads 322 and a top chip coupling insulation material layer 302 are formed on the top surface of the second semiconductor chip 200. The top chip connection pads 322 may be disposed on the top surface, i.e., the inactive surface, of the second semiconductor chip 200. The top chip connection pads 322 may be disposed on the top surface of the second semiconductor chip 200 and may be connected to a plurality of second through electrodes 220. The top chip coupling insulation material layer 302 may be formed on the top surface, i.e., the inactive surface, of the second semiconductor chip 200 to at least partially surround the side surfaces of the top chip connection pads 322. The top chip coupling insulation material layer 302 may cover the top surface of the second semiconductor chip 200 and the side surfaces of the top chip connection pads 322 and may expose the top surfaces of the top chip connection pads 322.

A plurality of bottom chip connection pads 324 and the bottom chip coupling insulation material layer 304 are formed on the bottom surface of the second semiconductor chip 200. The bottom chip connection pads 324 may be disposed on the bottom surface of the second semiconductor chip 200, i.e., the bottom surface of the second wiring structure 230. Each of the bottom chip connection pads 324 may be disposed on the bottom surface of the second semiconductor chip 200 and may be connected to a second wiring pattern 232 and/or a second wiring via 234. The bottom chip coupling insulation material layer 304 may be formed on the bottom surface of the second semiconductor chip 200 to at least partially surround the side surfaces of the bottom chip connection pads 324. The bottom chip coupling insulation material layer 304 may cover the bottom surface of the second semiconductor chip 200 and the side surfaces of the bottom chip connection pads 324 and may expose the bottom surfaces of the bottom chip connection pads 324.

Among the top chip coupling insulation material layers 302 respectively formed on the top surfaces of the first and second semiconductor chips 100 and 200, the top chip coupling insulation material layer 302 on the top surface of the first semiconductor chip 100 may be separately referred to as the lowermost top chip coupling insulation material layer 302L.

The second semiconductor chip 200 is disposed on the first semiconductor chip 100. The second semiconductor chip 200 may correspond to the lowermost second semiconductor chip 200L in FIG. 1A. The lowermost second semiconductor chip 200L may be disposed on the first semiconductor chip 100 such that the second wiring structure 230 faces the first semiconductor chip 100. The lowermost second semiconductor chip 200L may be disposed on the first semiconductor chip 100 such that the bottom chip connection pads 324 on the bottom surface of the lowermost second semiconductor chip 200L may respectively correspond to the top chip connection pads 322 on the top surface of the first semiconductor chip 100. For example, the top chip connection pads 322 and the bottom chip connection pads 324 may include a material including copper (Cu).

Referring to FIGS. 5A and 5B, by applying heat and/or pressure in a process of disposing the lowermost second semiconductor chip 200L on the first semiconductor chip 100, the top chip connection pads 322 may be bonded to the bottom chip connection pads 324, and the top chip coupling insulation material layer 302 may be bonded to the bottom chip coupling insulation material layer 304. In some embodiments, the top chip connection pads 322 may be covalently bonded to the bottom chip connection pads 324, and the top chip coupling insulation material layer 302 may be covalently bonded to the bottom chip coupling insulation material layer 304. For example, heat at a first temperature may be applied in the process of disposing the second semiconductor chip 200 on the first semiconductor chip 100.

Thereafter, heat at a second temperature that is higher than the first temperature is applied such that the top chip connection pads 322 and the bottom chip connection pads 324 combine to form a plurality of coupling pads 320 and the top chip coupling insulation material layer 302 and the bottom chip coupling insulation material layer 304 combine to form a chip coupling insulation layer 300. The chip coupling insulation layer 300 disposed between the first semiconductor chip 100 and the lowermost second semiconductor chip 200L may be separately referred to as the lowermost chip coupling insulation layer 300L. The top chip connection pads 322 and the bottom chip connection pads 324 respectively corresponding to the top chip connection pads 322 may be expanded by heat to contact each other and diffusion bonded to each other and may be integrated with each other through diffusion of metal atoms, thereby forming the coupling pads 320.

Referring to FIG. 5C, a plurality of second semiconductor chips 200 may be sequentially disposed on the lowermost second semiconductor chip 200L. A plurality of bottom chip connection pads 324 and a bottom chip coupling insulation material layer 304 may be formed on the bottom surface of each of the second semiconductor chips 200 sequentially disposed on the lowermost second semiconductor chip 200L, and the top chip connection pads 322 and a top chip coupling insulation material layer 302 may be formed on the top surface of each second semiconductor chip 200.

Thereafter, in a similar manner to that described above with reference to FIG. 5B, the top chip connection pads 322 and the bottom chip connection pads 324 combine to form a plurality of coupling pads 320 and the top chip coupling insulation material layer 302 and the bottom chip coupling insulation material layer 304 combine to form a chip coupling insulation layer 300, disposed between two adjacent second semiconductor chips 200, and accordingly, the second semiconductor chips 200 may be sequentially attached to the first semiconductor chip 100.

Figure 5D:
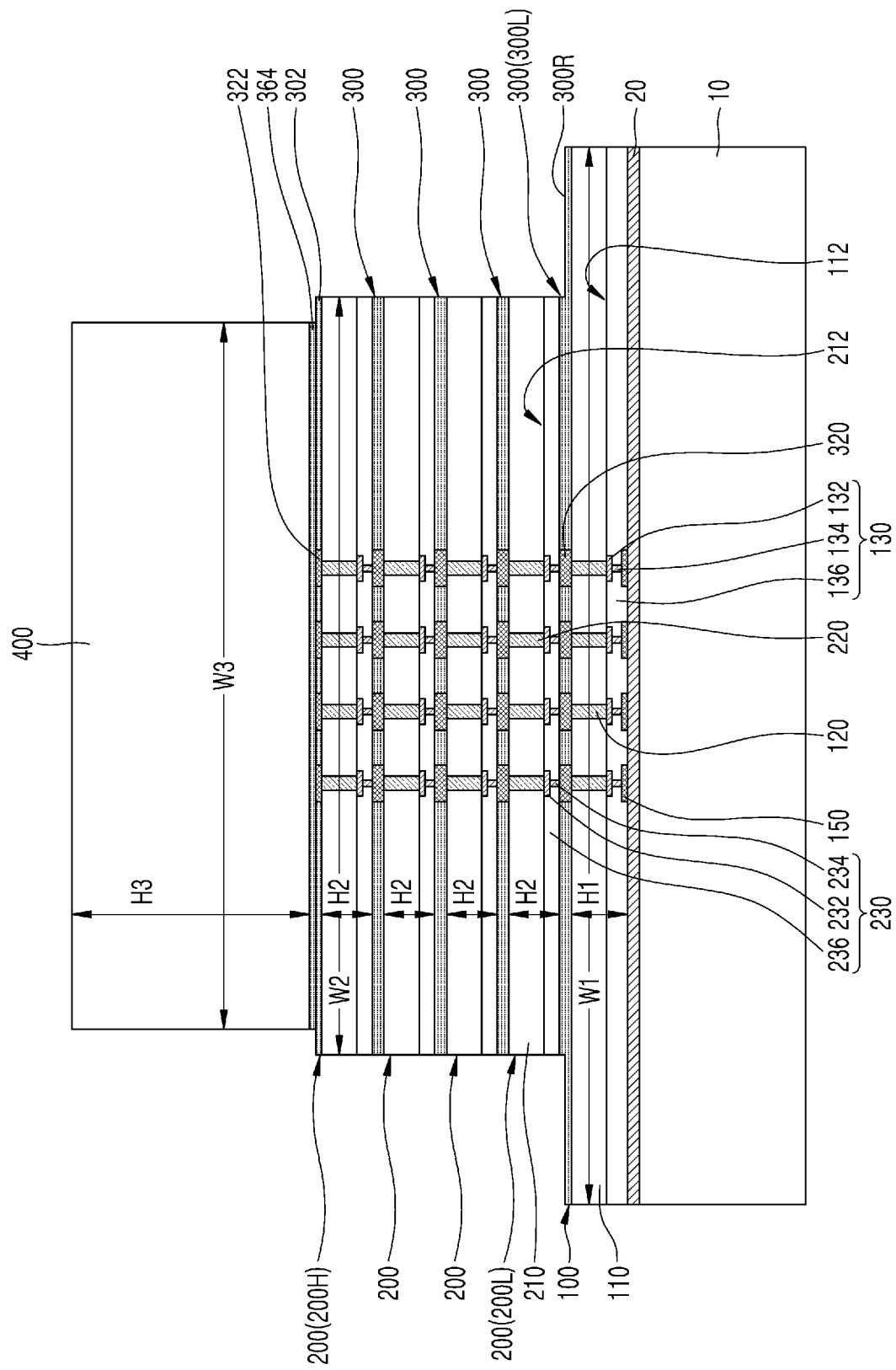

Referring to FIG. 5D, after the bottom dummy coupling insulation material layer 364 is formed on the bottom surface of the supporting dummy substrate 400, the supporting dummy substrate 400 is disposed on the uppermost second semiconductor chip 200H.

The second semiconductor chips 200 may have the second horizontal width W2, and the supporting dummy substrate 400 may have the third horizontal width W3 that is less than the second horizontal width W2. In some embodiments, the third horizontal width W3 may be several tens to hundreds of μm less than the second horizontal width W2.

The supporting dummy substrate 400 may be disposed on the uppermost second semiconductor chip 200H using the edge of the uppermost second semiconductor chip 200H as an align key.

Referring to FIG. 5E, in a similar manner to that described above with reference to FIG. 5B, the top chip coupling insulation material layer 302 and the bottom dummy coupling insulation material layer 364 combine to form the supporting coupling insulation layer 350 disposed between the uppermost second semiconductor chip 200H and the supporting dummy substrate 400, and accordingly, the supporting dummy substrate 400 may be attached to the uppermost second semiconductor chip 200H.

Figure 5F:
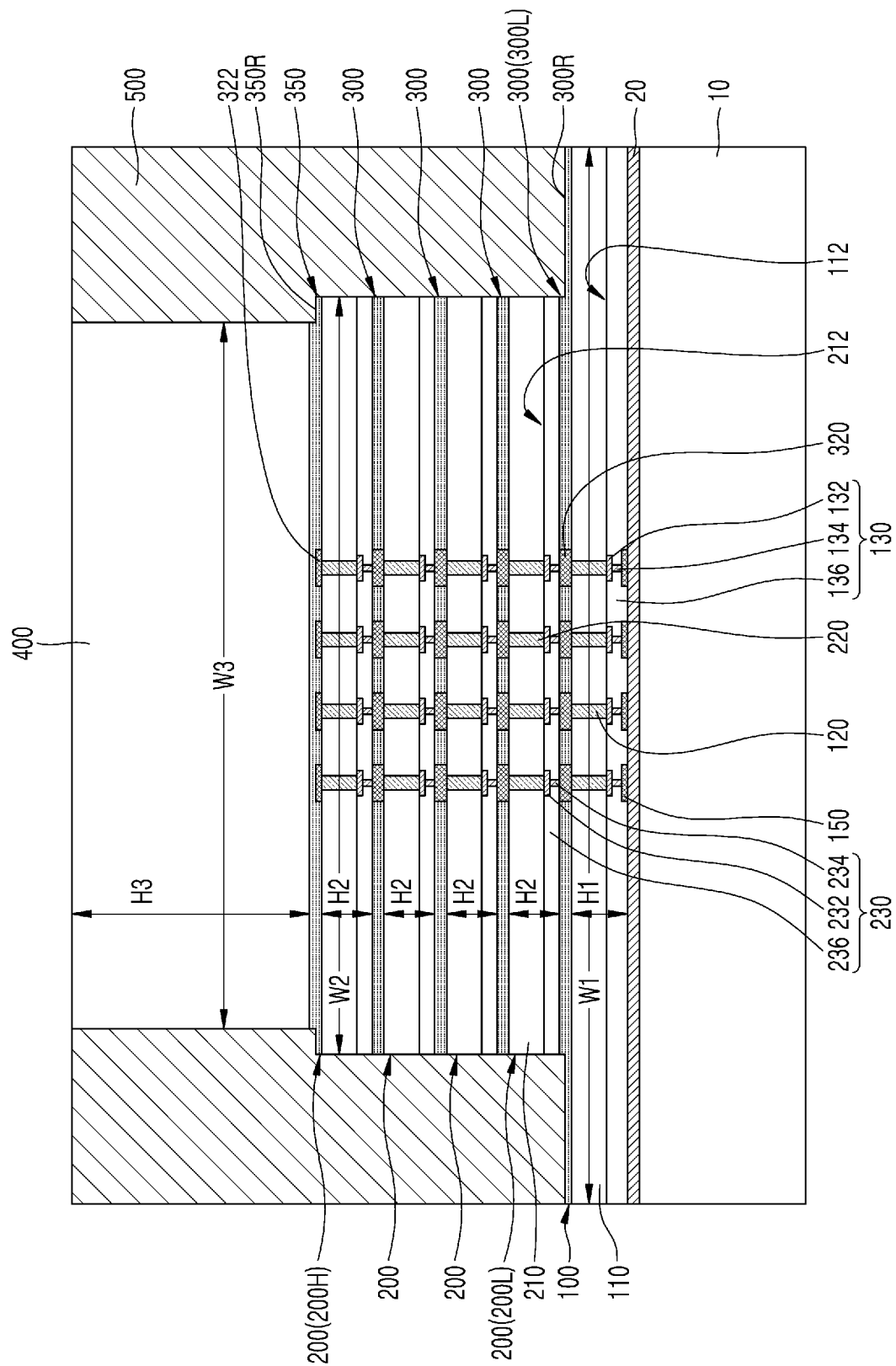

Referring to FIG. 5F, the package molding layer 500 may be formed on the first semiconductor chip 100 to cover the top surface of the first semiconductor chip 100 and at least partially surround the side surfaces of the supporting dummy substrate 400 and the second semiconductor chips 200.

After the package molding layer 500 is formed, the first supporting substrate 10 having the first release film 20 attached thereto may be separated from the first semiconductor chip 100.

Figure 5G:
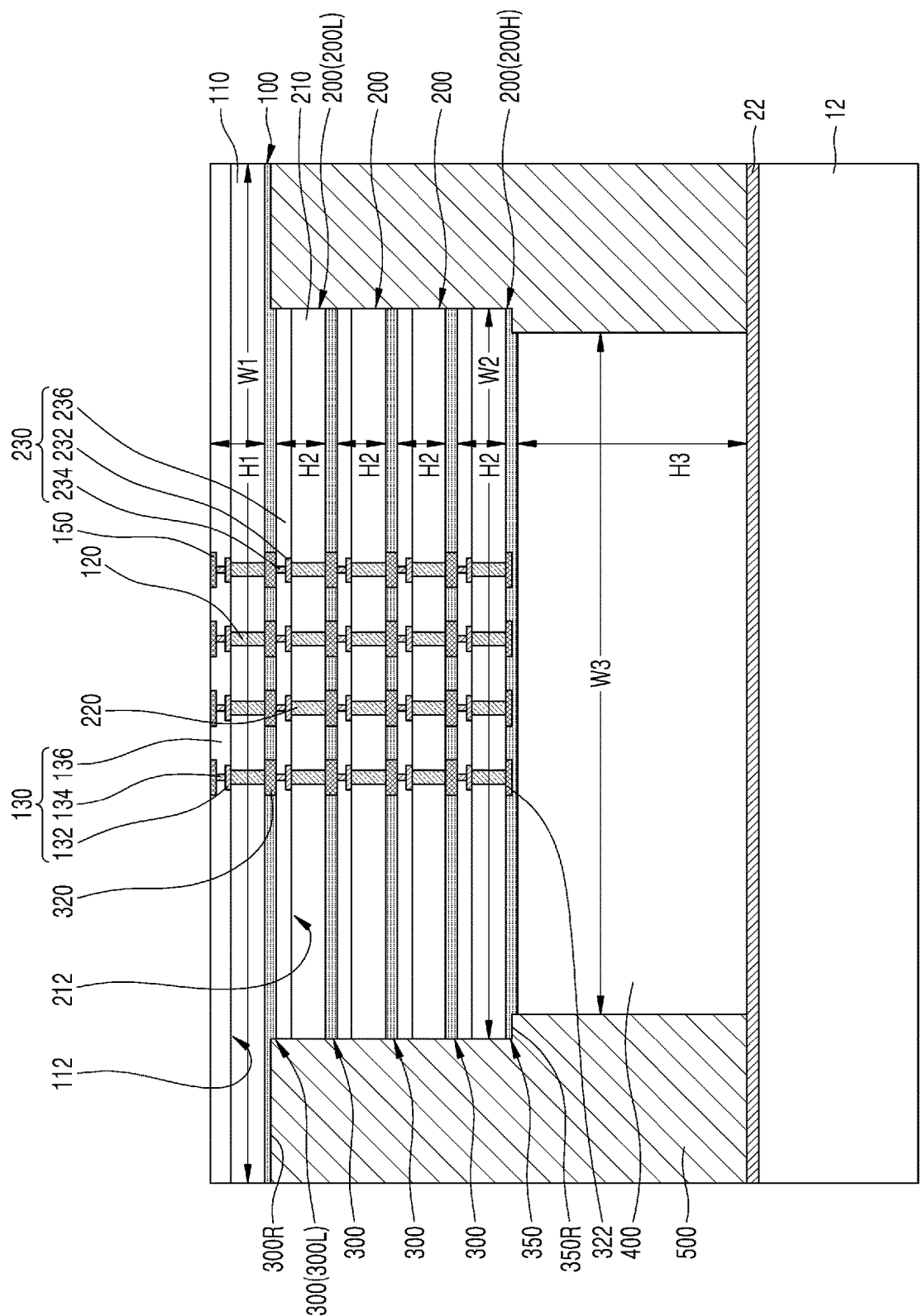

Referring to FIG. 5G, the resultant structure of FIG. 5F is turned upside down and attached to a second supporting substrate 12. After a second release film 22 is attached to the top surface of the second supporting substrate 12, the resultant structure of FIG. 5F that has been turned upside down may be attached to the second release film 22. The supporting dummy substrate 400 and the package molding layer 500 may be in contact with the second release film 22.

Figure 5H:
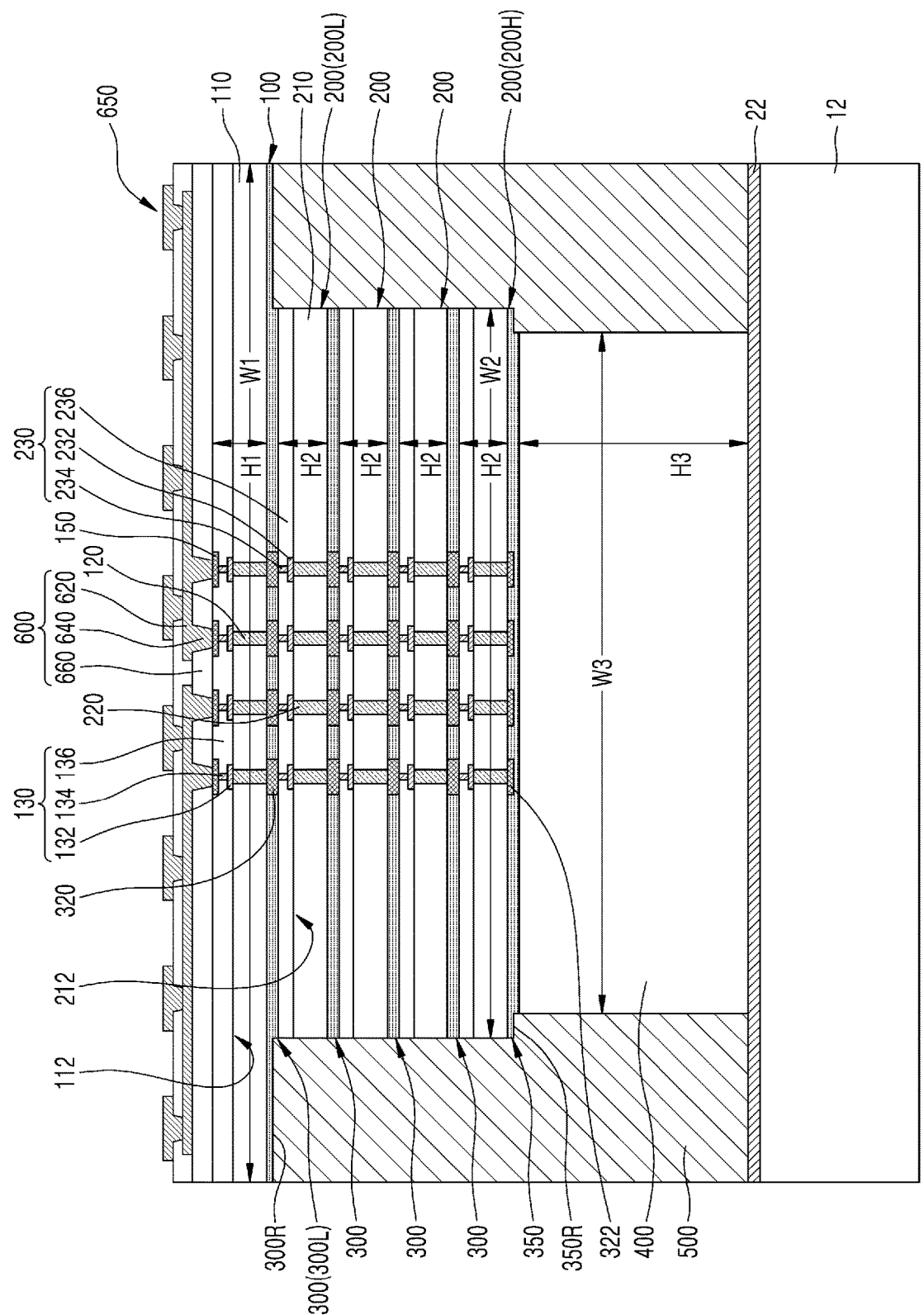

Referring to FIG. 5H, the base redistribution layer 600 is formed on the first wiring structure 130 of the first semiconductor chip 100. The base redistribution layer 600 may include the package redistribution line patterns 620, the package redistribution vias 640, and the package redistribution insulation layer 660. At least some of the package redistribution vias 640 or at least some of the package redistribution line patterns 620 may be in contact with the chip pads 150. Among the package redistribution line patterns 620, package redistribution line patterns 620 on the top surface of the base redistribution layer 600 may be referred to as package pads 650.

In some embodiments, the package redistribution vias 640 may have a tapered shape having a horizontal width decreasing downwards. For example, the horizontal width of the package redistribution vias 640 may increase away from the first semiconductor chip 100.

Figure 5I:
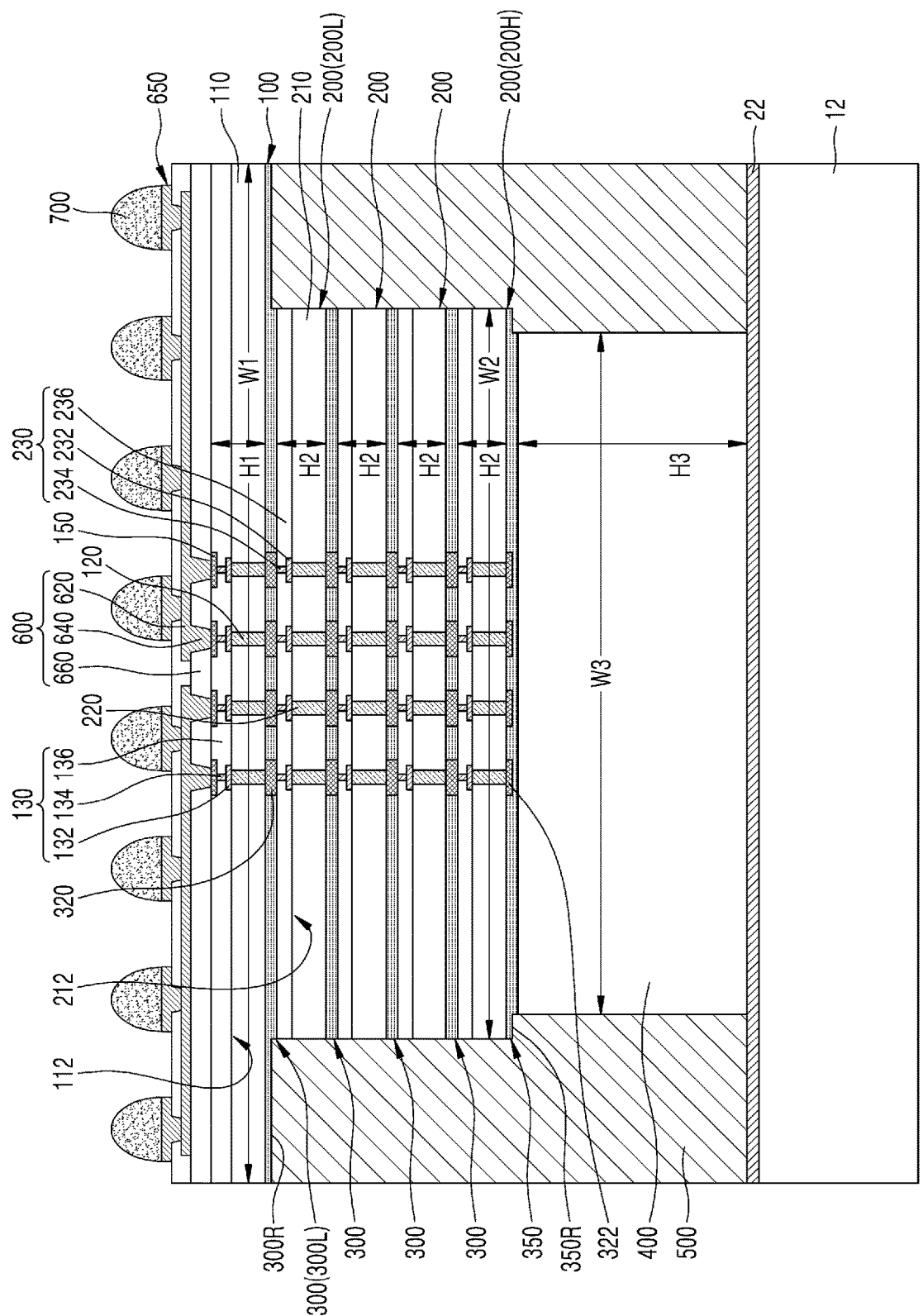

Referring to FIG. 5I, the package connection terminals 700 are respectively attached to the package pads 650.

Thereafter, the second supporting substrate 12 having the second release film 22 attached thereto may be separated from the supporting dummy substrate 400 and the package molding layer 500, and then the resultant structure is turned upside down. As a result, the semiconductor package 1000 of FIG. 1A may be formed.

Figure 6A:
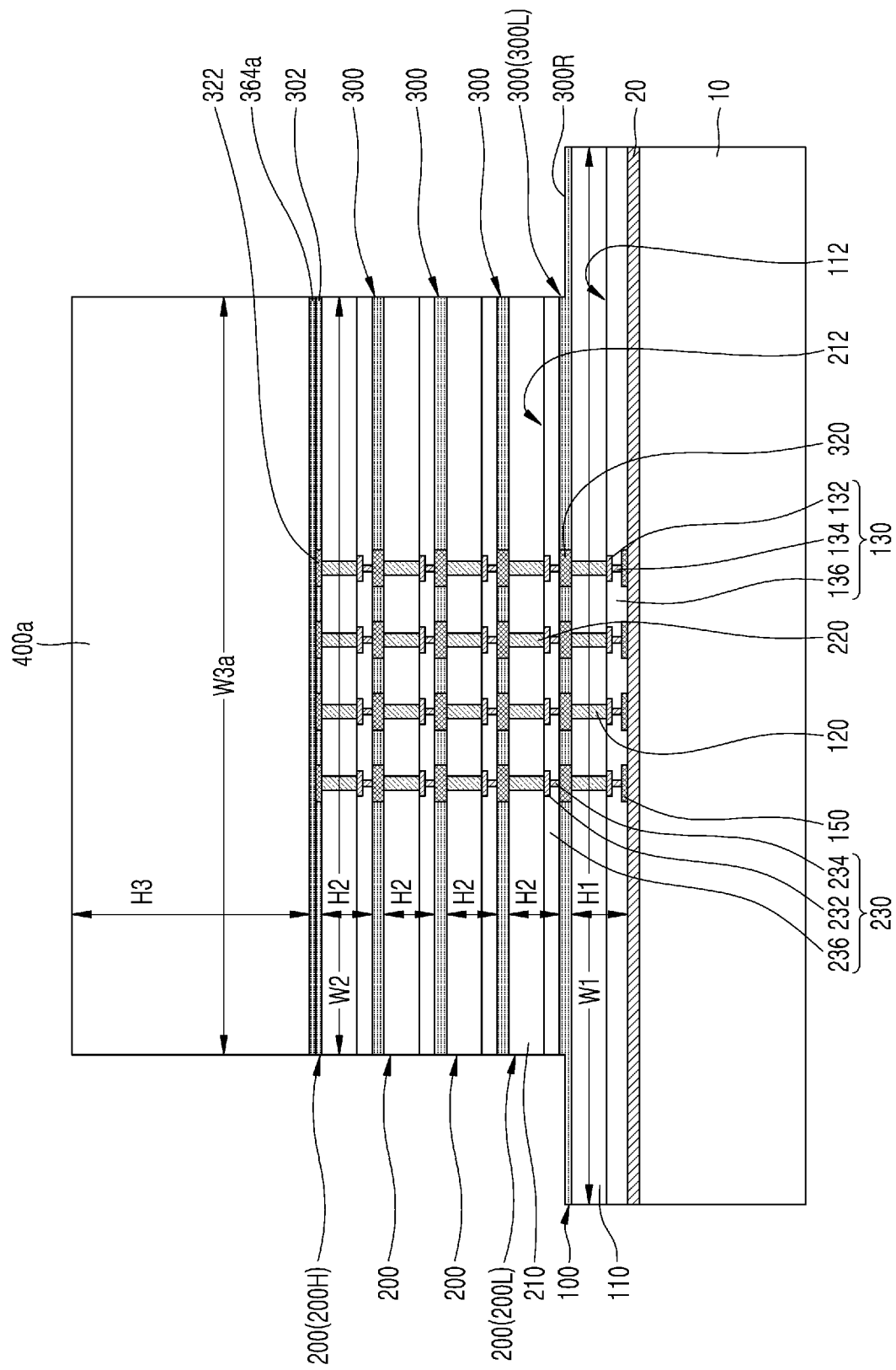
FIGS. 6A and 6B are cross-sectional views of a method of manufacturing a semiconductor package, according to embodiments.
Figure 6B:
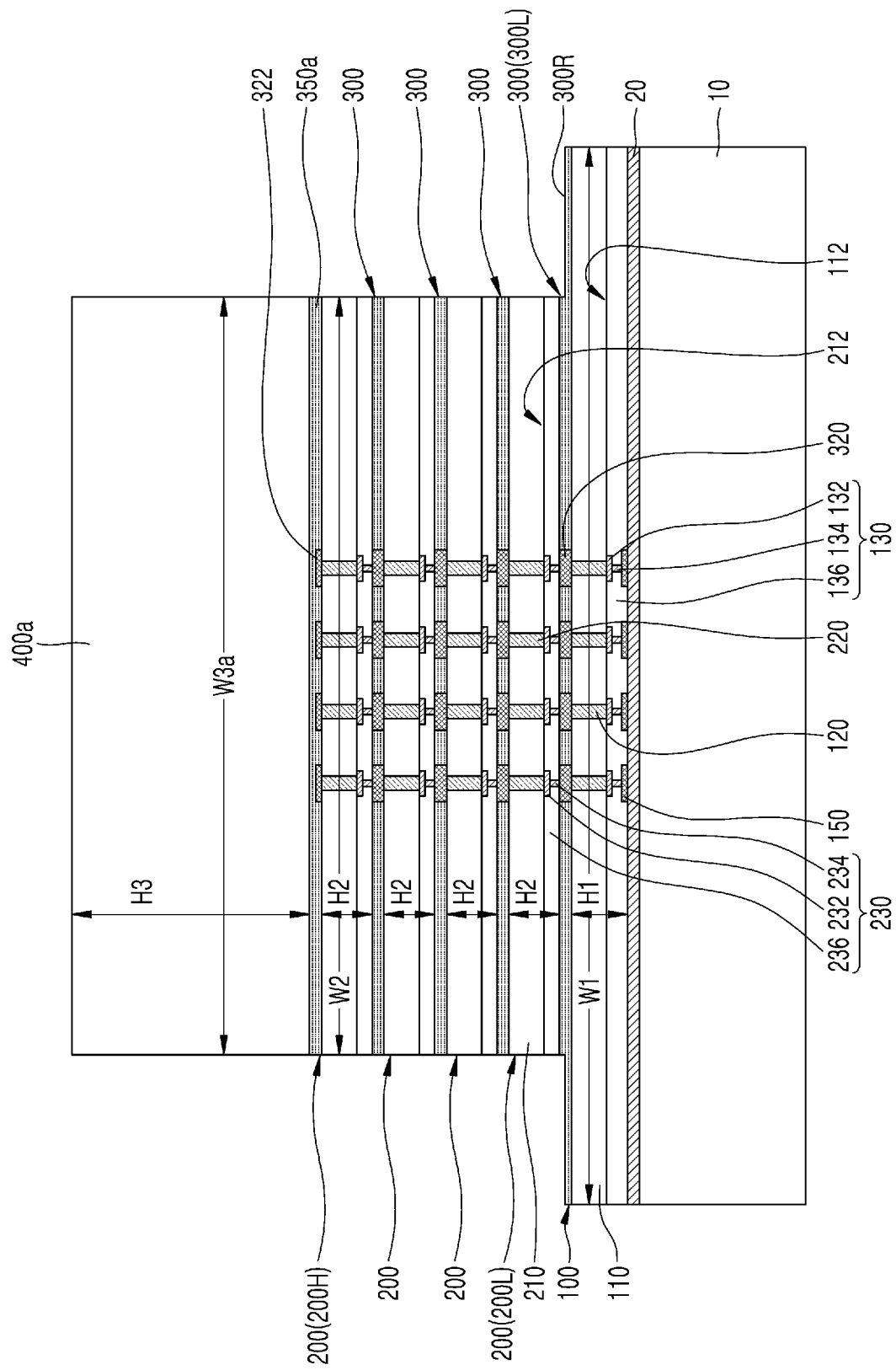

FIGS. 6A and 6B are cross-sectional views of a method of manufacturing a semiconductor package, according to embodiments. For example, FIGS. 6A and 6B are cross-sectional views of a method of manufacturing the semiconductor package 1000a of FIG. 1B, and to the extent that a detailed description of an element has been omitted, it may be assumed that the element is at least similar to corresponding elements that have been described elsewhere within the specification.

Referring to FIG. 6A, after the bottom dummy coupling insulation material layer 364 is formed on the bottom surface of the supporting dummy substrate 400a, the supporting dummy substrate 400a is disposed on the uppermost second semiconductor chip 200H of the resultant structure of FIG. 5C.

The second semiconductor chips 200 may have the second horizontal width W2, and the supporting dummy substrate 400a may have the third horizontal width W3a. In some embodiments, the third horizontal width W3a may be substantially equal to the second horizontal width W2.

The supporting dummy substrate 400a may be disposed on the uppermost second semiconductor chip 200H such that the edge of the supporting dummy substrate 400a is aligned with the edge of the uppermost second semiconductor chip 200H.

Referring to FIGS. 6A and 6B, in a similar manner to that described above with reference to FIG. 5B, the top chip coupling insulation material layer 302 and a bottom dummy coupling insulation material layer 364a combine to form the supporting coupling insulation layer 350a disposed between the uppermost second semiconductor chip 200H and the supporting dummy substrate 400a, and accordingly, the supporting dummy substrate 400a may be attached to the uppermost second semiconductor chip 200H.

Thereafter, the semiconductor package 1000a of FIG. 1B may be formed using the method described with reference to FIGS. 5F to 5I.

Figure 7A:
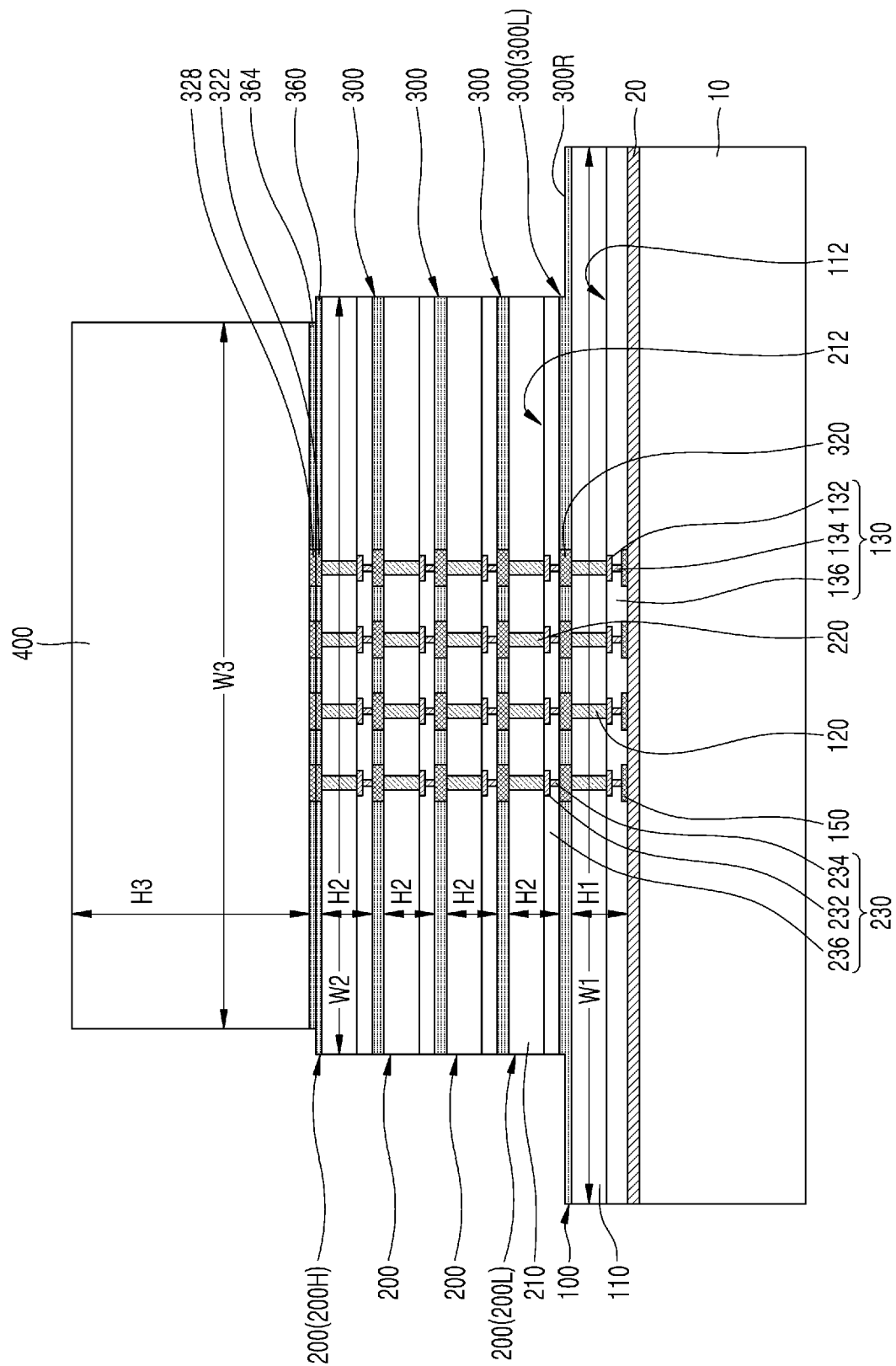
FIGS. 7A and 7B are cross-sectional views of a method of manufacturing a semiconductor package, according to embodiments.
Figure 7B:
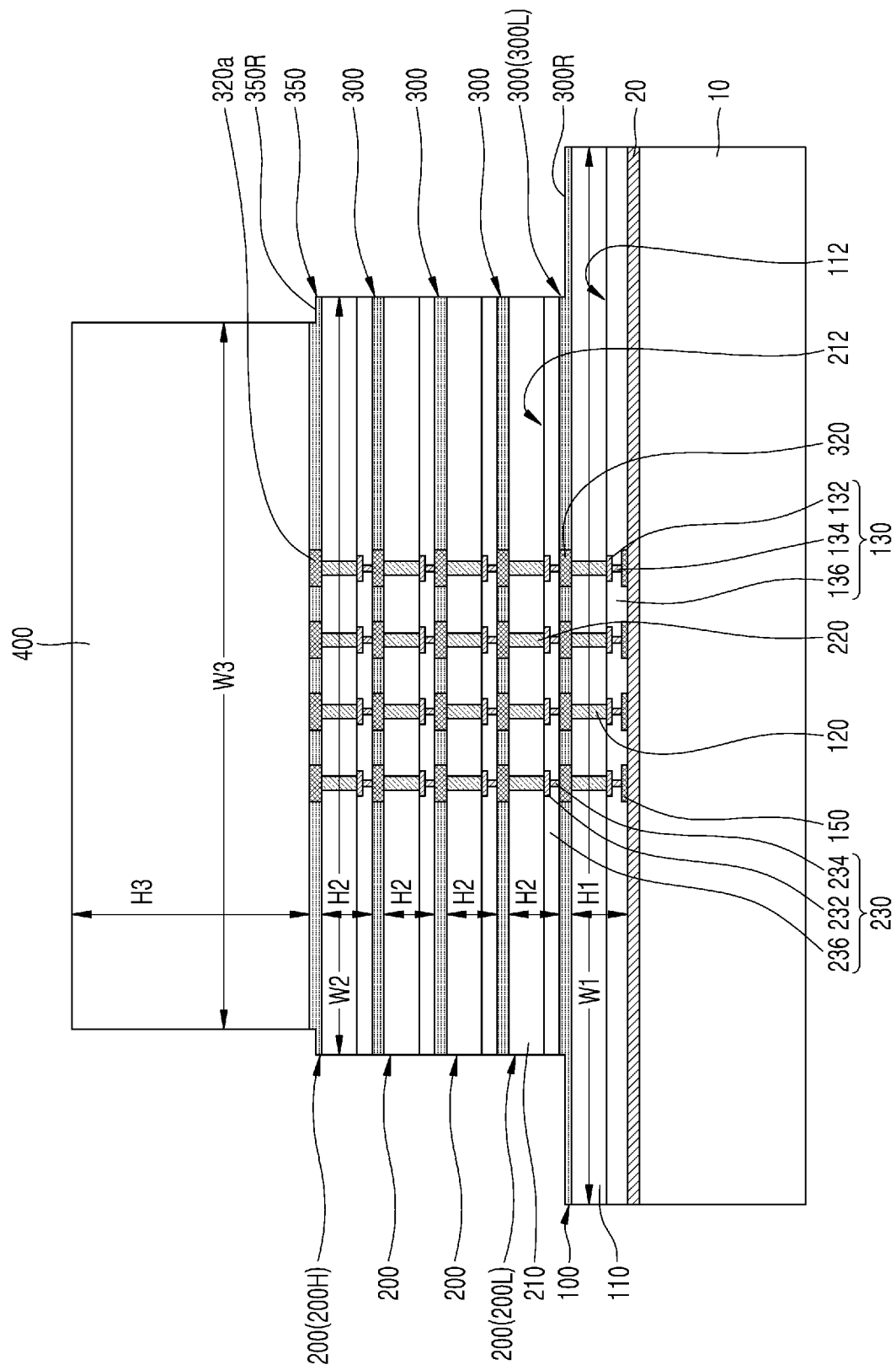

FIGS. 7A and 7B are cross-sectional views of a method of manufacturing a semiconductor package, according to embodiments. For example, FIGS. 7A and 7B are cross-sectional views of a method of manufacturing the semiconductor package 1000b of FIG. 1C, and to the extent that a detailed description of an element has been omitted, it may be assumed that the element is at least similar to corresponding elements that have been described elsewhere within the specification.

Referring to FIG. 7A, after a plurality of bottom dummy pads 328 and the bottom dummy coupling insulation material layer 364 at least partially surrounding the side surfaces of the bottom dummy pads 328 are formed on the bottom surface of the supporting dummy substrate 400, the supporting dummy substrate 400 is disposed on the uppermost second semiconductor chip 200H of the resultant structure of FIG. 5C. For example, the bottom dummy pads 328 may include a material including copper (Cu).

Referring to FIGS. 7A and 7B, when heat and/or pressure is applied in a process of disposing the supporting dummy substrate 400 on the uppermost second semiconductor chip 200H, the top chip connection pads 322 and the bottom dummy pads 328 may combine to form the thermal coupling pads 320a, and the top chip coupling insulation material layer 302 and the bottom dummy coupling insulation material layer 364 may combine to form the supporting coupling insulation layer 350.

Thereafter, the semiconductor package 1000b of FIG. 1C may be formed using the method described with reference to FIGS. 5F to 5I.

FIGS. 8A to 8D are cross-sectional views of a method of manufacturing a semiconductor package, according to embodiments. For example, FIGS. 8A to 8D are cross-sectional views of a method of manufacturing the semiconductor package 1002 of FIG. 2A, and to the extent that a detailed description of an element has been omitted, it may be assumed that the element is at least similar to corresponding elements that have been described elsewhere within the specification.

Figure 8A:
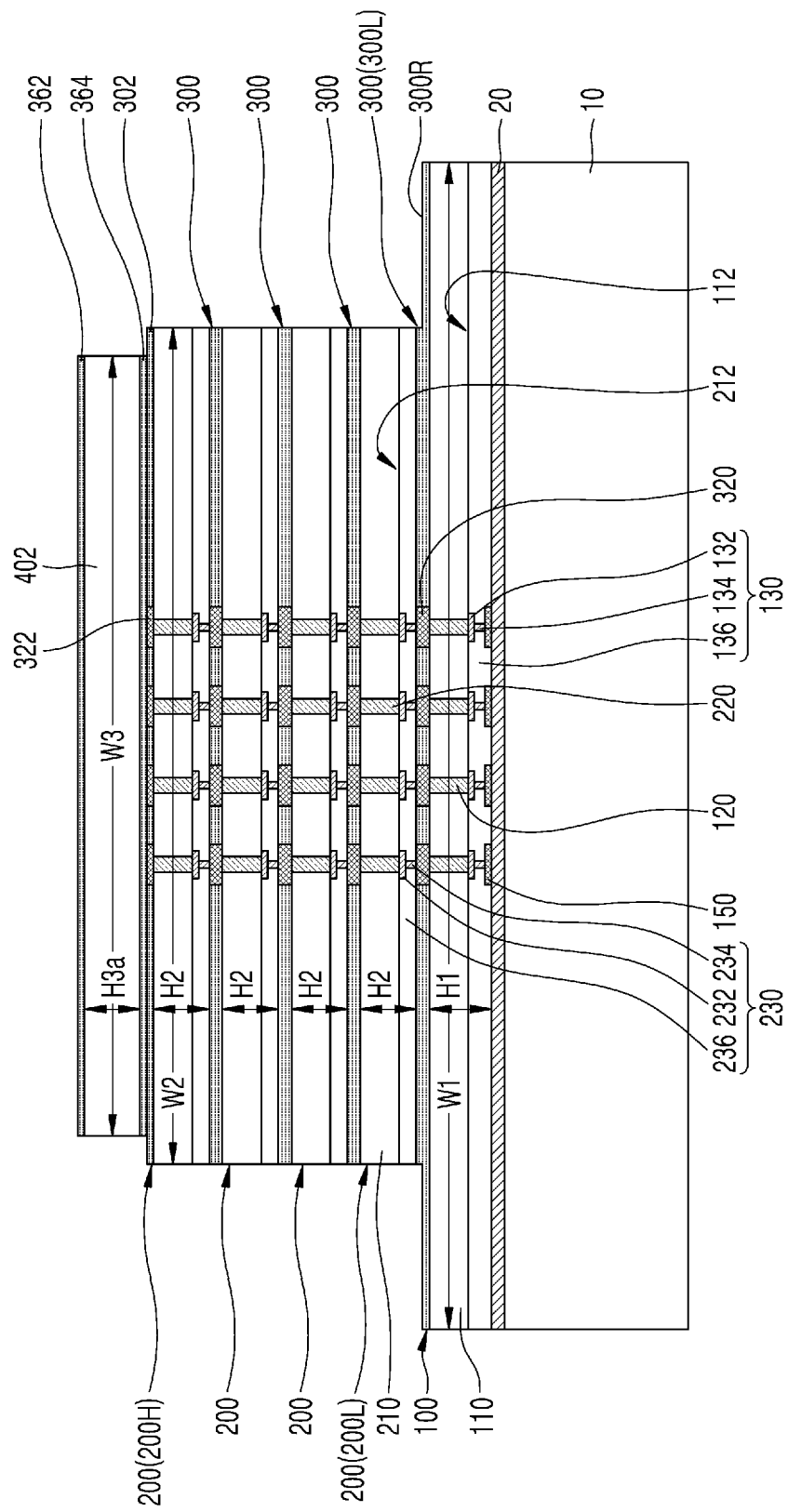
FIGS. 8A to 8D are cross-sectional views of a method of manufacturing a semiconductor package, according to embodiments.

Referring to FIG. 8A, after the bottom dummy coupling insulation material layer 364 is formed on the bottom surface of a supporting dummy substrate 402 and a top dummy coupling insulation material layer 362 is formed on the top surface of the supporting dummy substrate 402, the supporting dummy substrate 402 is disposed on the uppermost second semiconductor chip 200H of the resultant structure of FIG. 5C.

The second semiconductor chips 200 may have the second horizontal width W2 and the second vertical height H2, and the supporting dummy substrate 402 may have the third horizontal width W3 and the third vertical height H3a. In some embodiments, the third horizontal width W3 may be less than each of the first and second horizontal widths W1 and W2. In some embodiments, the third vertical height H3a may be substantially equal to each of the first and second heights H1 and H2. The supporting dummy substrate 402 may be disposed on the uppermost second semiconductor chip 200H using the edge of the uppermost second semiconductor chip 200H as an align key.

Figure 8B:
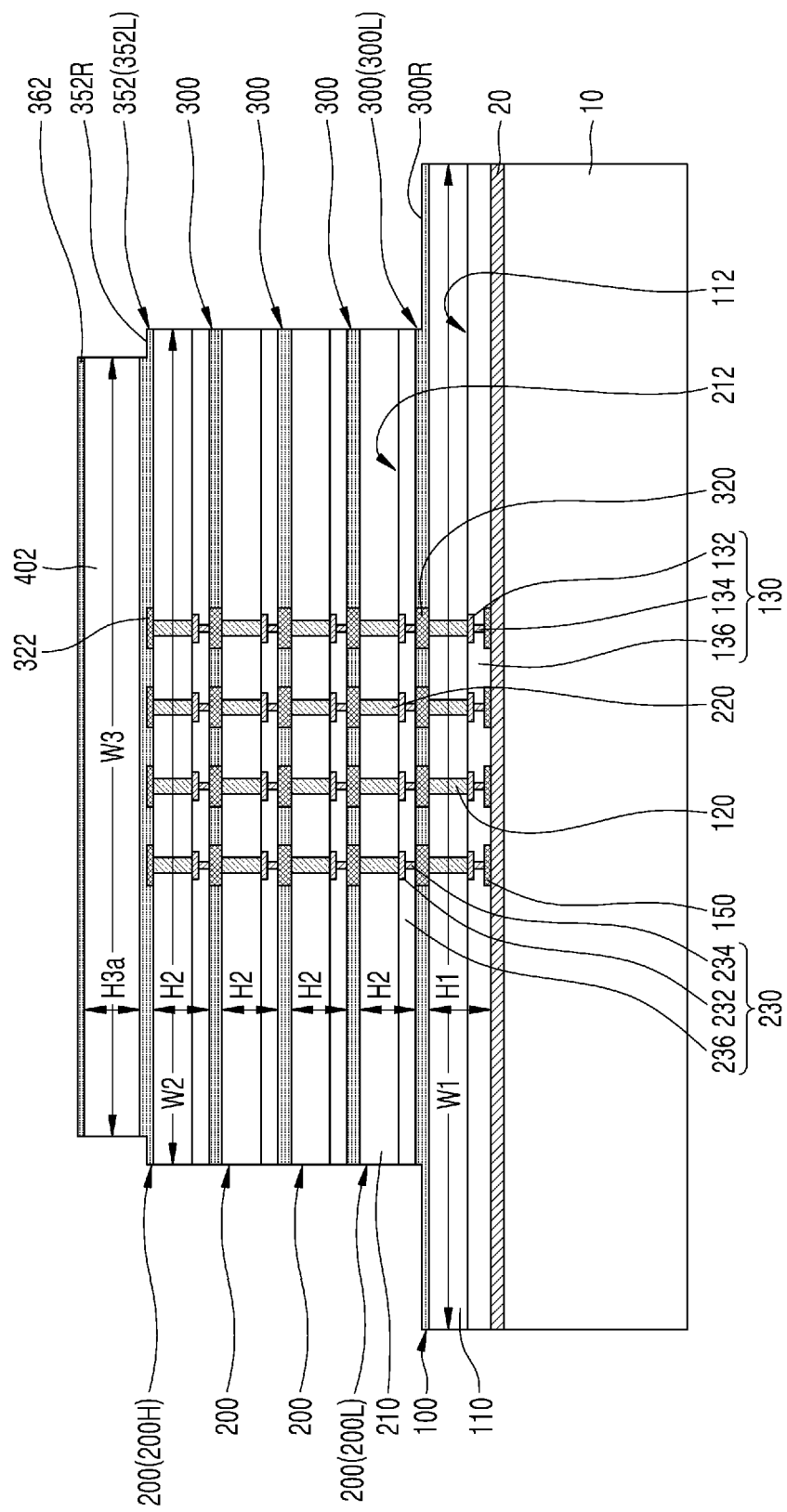

Referring to FIGS. 8A and 8B, in a similar manner to that described above with reference to FIG. 5B, the top chip coupling insulation material layer 302 and the bottom dummy coupling insulation material layer 364 combine to form the lowermost supporting coupling insulation layer 352L disposed between the uppermost second semiconductor chip 200H and the supporting dummy substrate 402, and accordingly, the supporting dummy substrate 402 may be attached to the uppermost second semiconductor chip 200H.

Figure 8C:
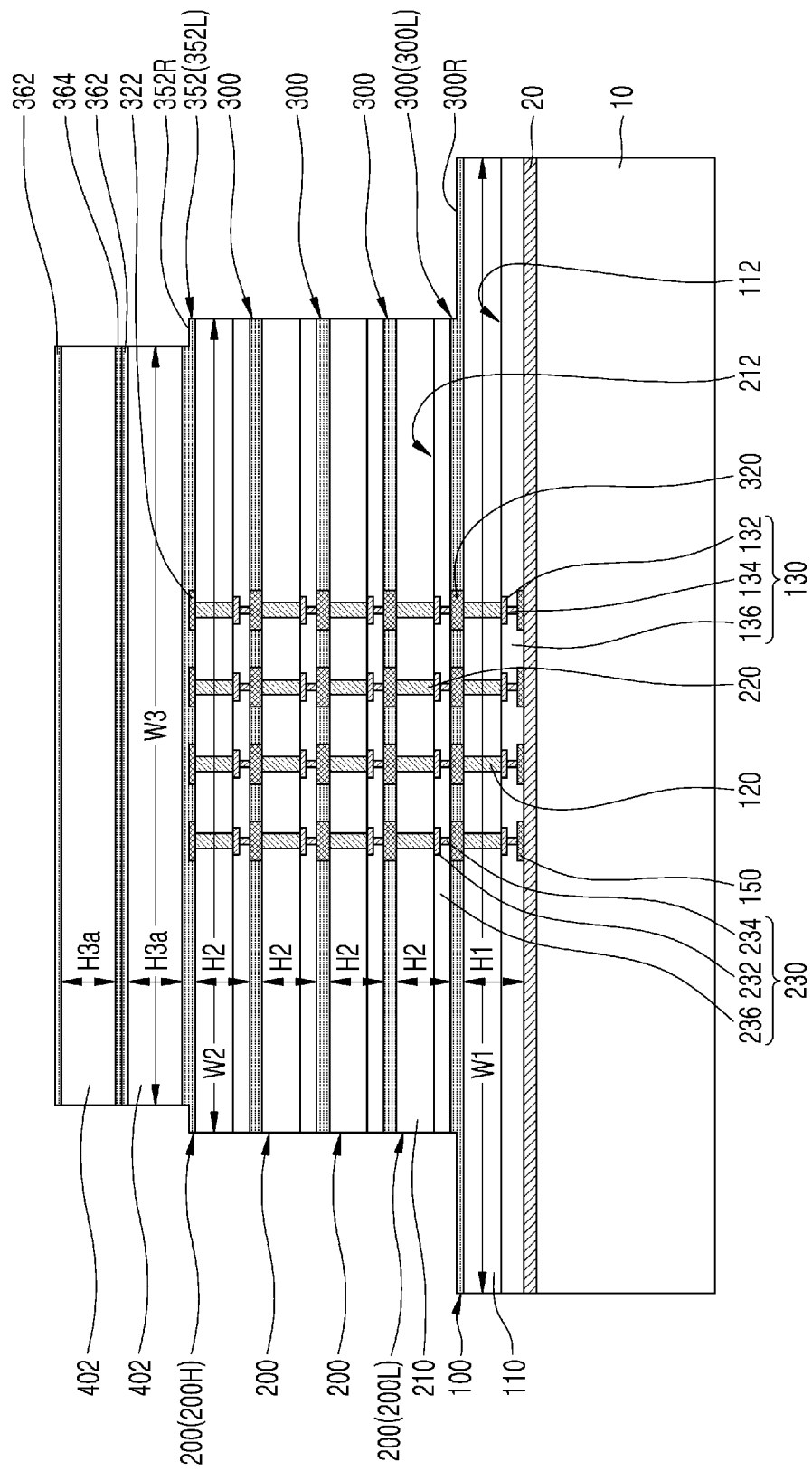
Figure 8D:
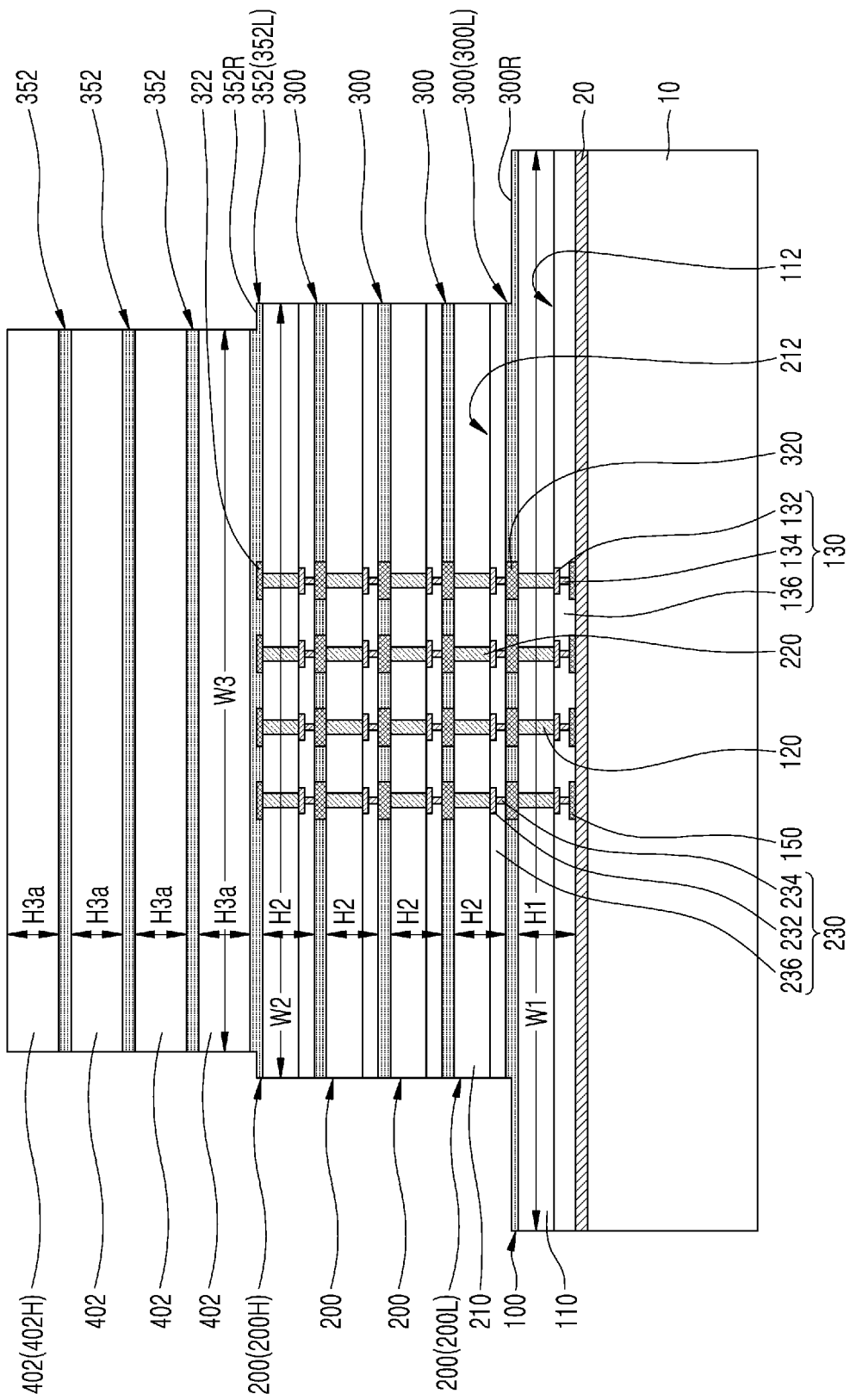

Referring to FIGS. 8C and 8D, another supporting dummy substrate 402, on the bottom and top surfaces of which the bottom dummy coupling insulation material layer 364 and the top dummy coupling insulation material layer 362 are respectively formed, may be disposed on the supporting dummy substrate 402 such that a plurality of supporting dummy substrates 402 are stacked on the uppermost second semiconductor chip 200H. In some embodiments, the top dummy coupling insulation material layer 362 might not be formed on the top surface of the uppermost supporting dummy substrate 402.

In a similar manner to that described above with reference to FIG. 5B, the top dummy coupling insulation material layer 362 and the bottom dummy coupling insulation material layer 364, which are respectively formed on the top and bottom surfaces of respective supporting dummy substrates 402 facing each other, combine to form a supporting coupling insulation layer 352, and accordingly, a plurality of supporting dummy substrates 402 may be attached to the uppermost second semiconductor chip 200H.

Thereafter, the semiconductor package 1002 of FIG. 2A may be formed using the method described with reference to FIGS. 5F to 5I.

Figure 9A:
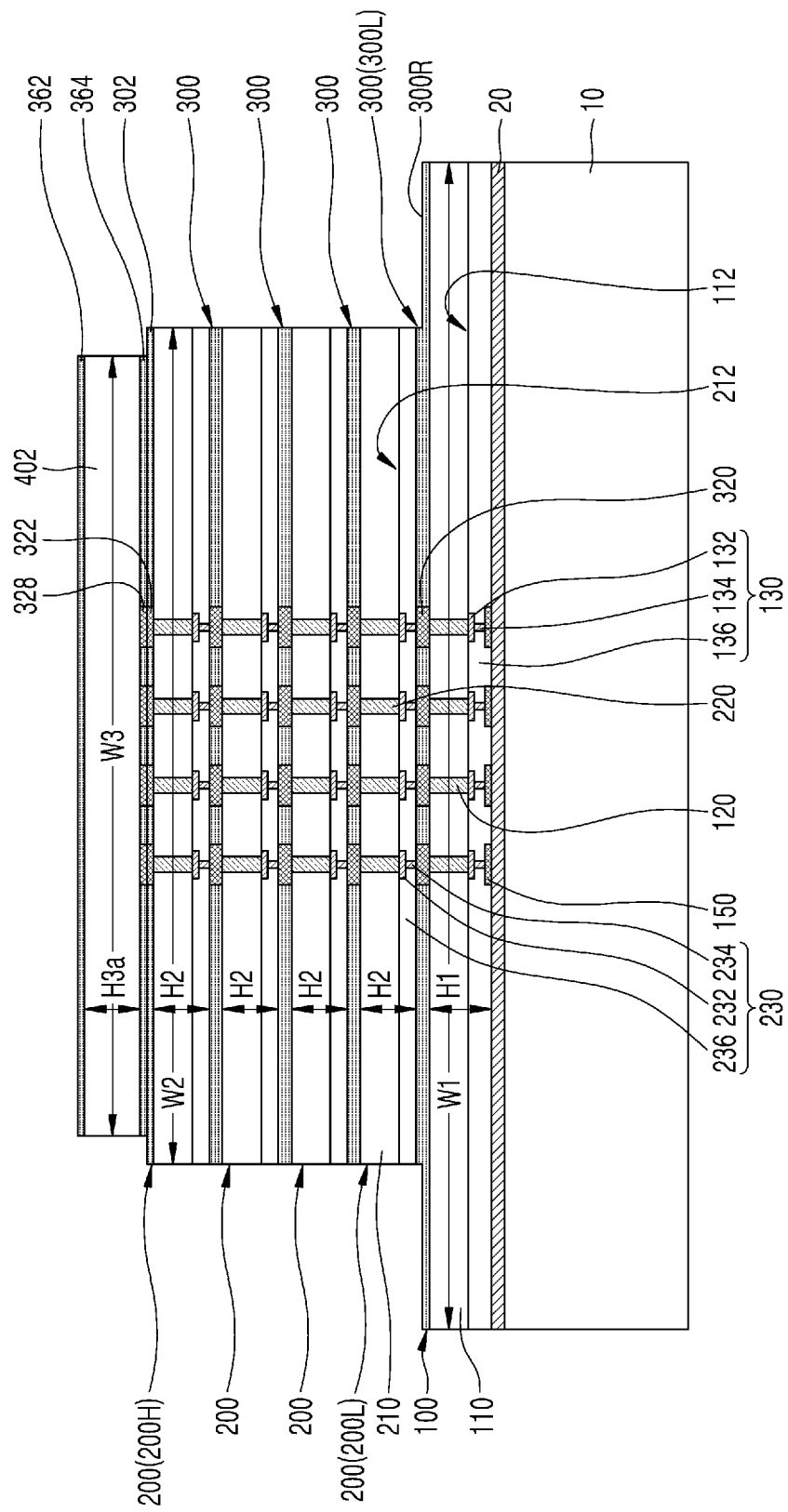
FIGS. 9A and 9B are cross-sectional views of a method of manufacturing a semiconductor package, according to embodiments.
Figure 9B:
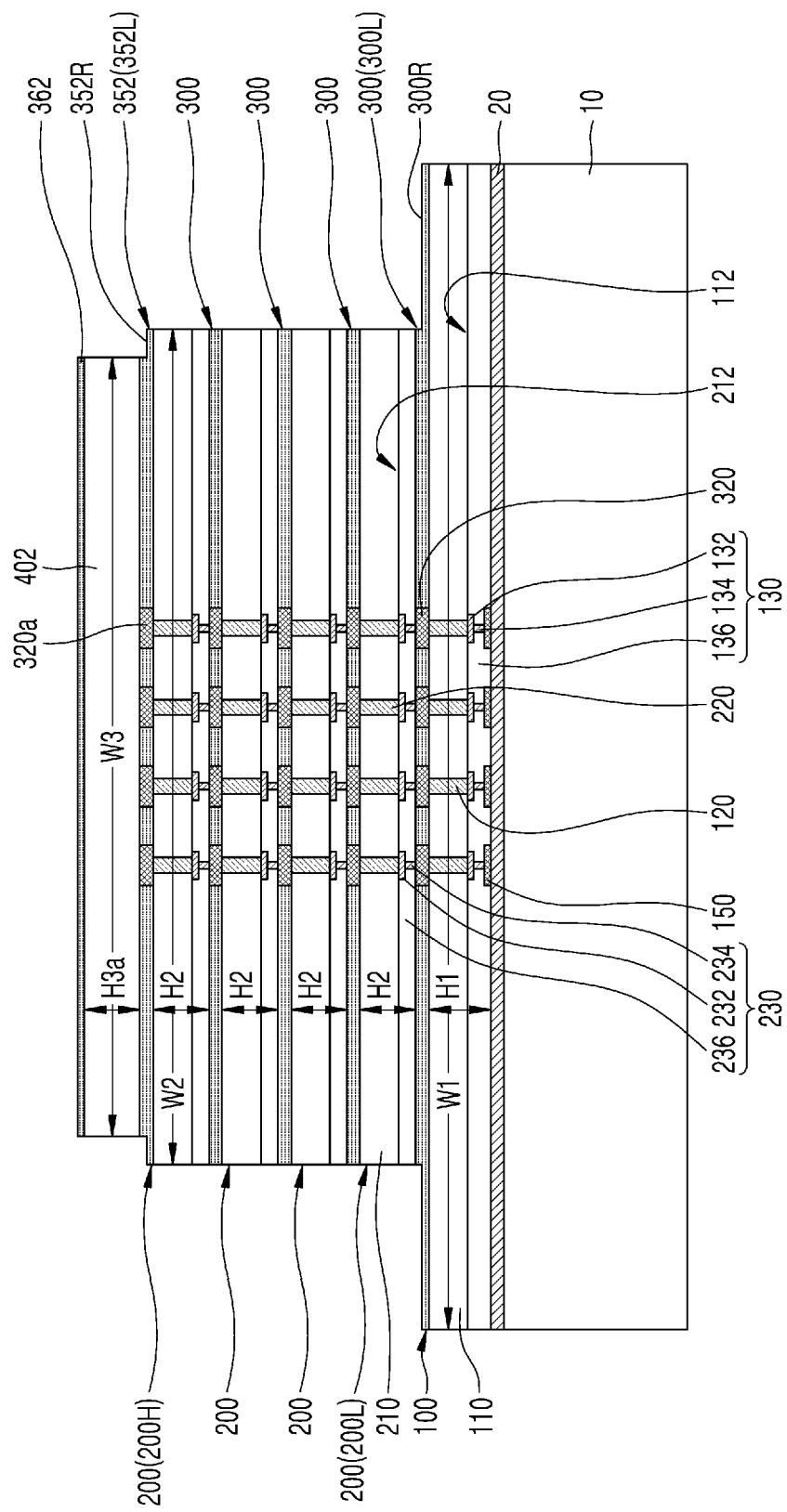

FIGS. 9A and 9B are cross-sectional views of a method of manufacturing a semiconductor package, according to embodiments. For example, FIGS. 9A and 9B are cross-sectional views of a method of manufacturing the semiconductor package 1002b of FIG. 2C, and to the extent that a detailed description of an element has been omitted, it may be assumed that the element is at least similar to corresponding elements that have been described elsewhere within the specification.

Referring to FIG. 9A, after the bottom dummy pads 328 and the bottom dummy coupling insulation material layer 364 at least partially surrounding the side surfaces of the bottom dummy pads 328 are formed on the bottom surface of a supporting dummy substrate 402 and the top dummy coupling insulation material layer 362 is formed on the top surface of the supporting dummy substrate 402, the supporting dummy substrate 402 is disposed on the uppermost second semiconductor chip 200H of the resultant structure of FIG. 5C.

Referring to FIGS. 9A and 9B, in a similar manner to that described above with reference to FIG. 5B, the top chip connection pads 322 and the bottom dummy pads 328 combine to form the thermal coupling pads 320a and the top chip coupling insulation material layer 302 and the bottom dummy coupling insulation material layer 364 combine to form the lowermost supporting coupling insulation layer 352L, disposed between the uppermost second semiconductor chip 200H and the supporting dummy substrate 402, and accordingly, the supporting dummy substrate 402 may be attached to the uppermost second semiconductor chip 200H.

Thereafter, the semiconductor package 1002b of FIG. 2C may be formed using the method described with reference to FIGS. 8C, 8D, and 5F to 5I.

Figure 10A:
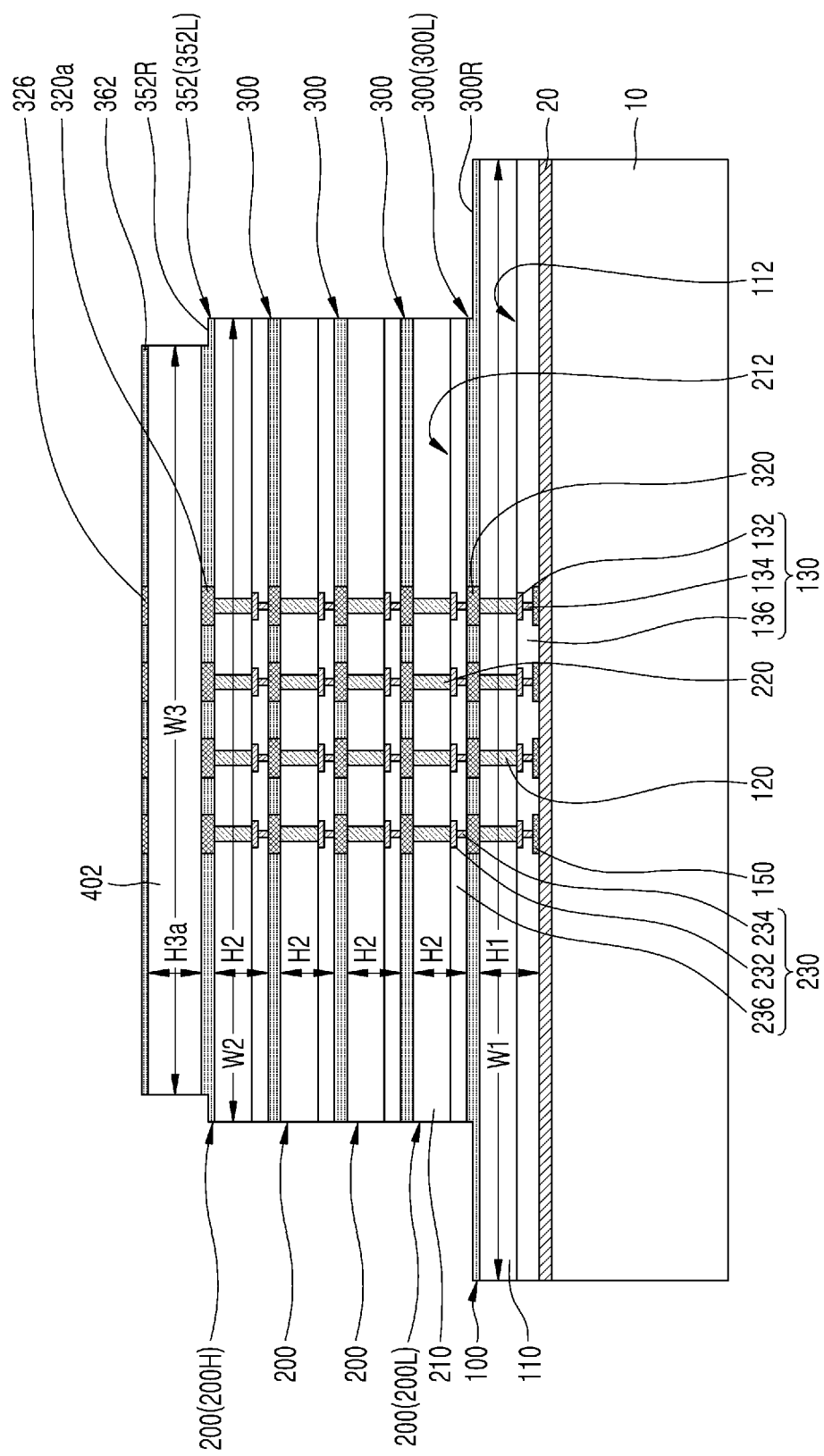
FIGS. 10A to 10C are cross-sectional views of a method of manufacturing a semiconductor package, according to embodiments.
Figure 10B:
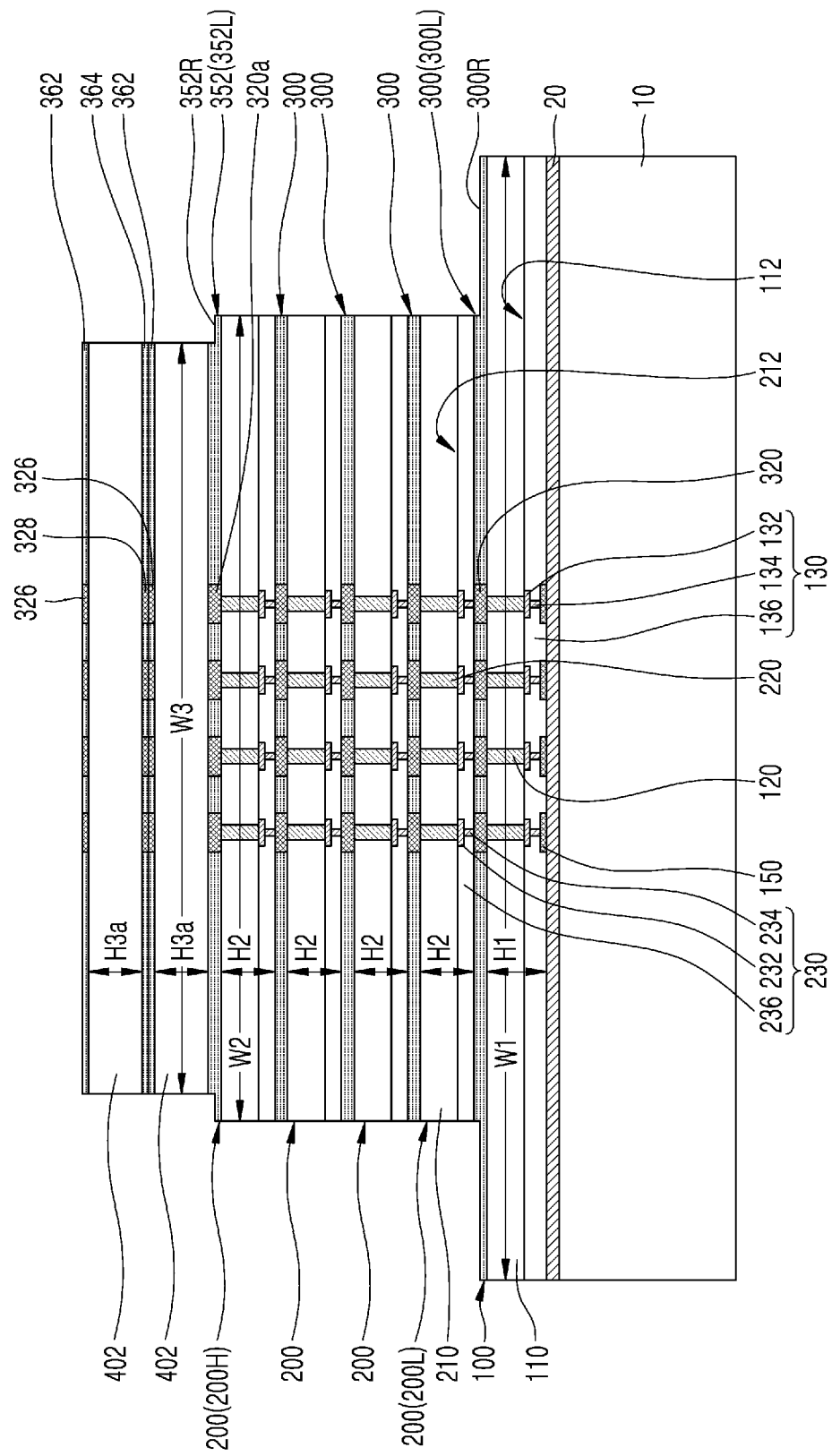
Figure 10C:
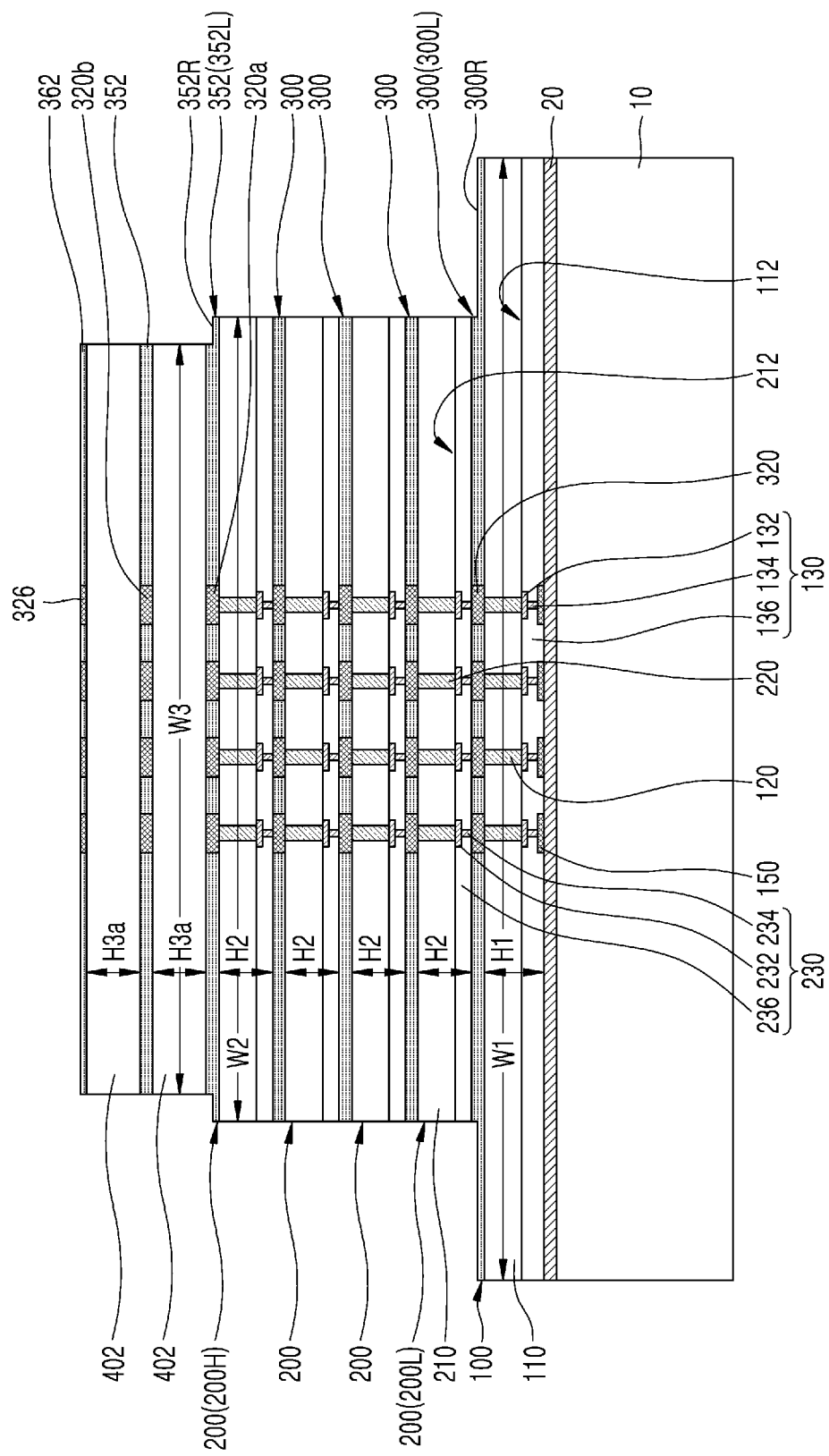

FIGS. 10A to 10C are cross-sectional views of a method of manufacturing a semiconductor package, according to embodiments. For example, FIGS. 10A to 10D are cross-sectional views of a method of manufacturing the semiconductor package 1002d of FIG. 2E or the semiconductor package 1002f of FIG. 2G, and to the extent that a detailed description of an element has been omitted, it may be assumed that the element is at least similar to corresponding elements that have been described elsewhere within the specification.

Referring to FIG. 10A, after a plurality of top dummy pads 326 are formed on the top surface of the supporting dummy substrate 402 in FIG. 9A such that the side surfaces of the top dummy pads 326 are at least partially surrounded by a top dummy coupling insulation material layer 362, the supporting dummy substrate 402 may be disposed on the uppermost second semiconductor chip 200H of the resultant structure of FIG. 5C. Thereafter, a plurality of top chip connection pads 322 and a plurality of bottom dummy pads 328 combine to form a thermal coupling pads 320a and a top chip coupling insulation material layer 302 and a bottom dummy coupling insulation material layer 364 combine to form the lowermost supporting coupling insulation layer 352L, disposed between the uppermost second semiconductor chip 200H and the supporting dummy substrate 402, and accordingly, the supporting dummy substrate 402 may be attached to the uppermost second semiconductor chip 200H. For example, the top dummy pads 326 may include a material including copper (Cu).

Referring to FIG. 10B, a plurality of bottom dummy pads 328 and a bottom dummy coupling insulation material layer 364 at least partially surrounding the side surfaces of the bottom dummy pads 328 may be formed on the bottom surface of another supporting dummy substrate 402, and a plurality of top dummy pads 326 and a top dummy coupling insulation material layer 362 at least partially surrounding the side surfaces of the top dummy pads 326 may be formed on the top surface of the supporting dummy substrate 402. Thereafter, the supporting dummy substrate 402 may be disposed on the resultant structure of FIG. 10A, i.e., the lowermost supporting dummy substrate 402. Accordingly, a plurality of supporting dummy substrates 402 may be stacked on the uppermost second semiconductor chip 200H.

Referring to FIGS. 10B and 10C, the top dummy coupling insulation material layer 362 and the bottom dummy coupling insulation material layer 364, which are respectively formed on the top and bottom surfaces of the respective supporting dummy substrates 402 facing each other, combine to form a supporting coupling insulation layer 352, and the top dummy pads 326 and the bottom dummy pads 328, which are respectively formed on the top and bottom surfaces of the respective supporting dummy substrates 402 facing each other, combine to form a plurality of dummy coupling pads 320b. Accordingly, a plurality of supporting dummy substrates 402 may be attached to the uppermost second semiconductor chip 200H.

In some embodiments, as shown in FIG. 2E, a plurality of top dummy pads 326 and a top dummy coupling insulation material layer 362 might not be formed on the top surface of the uppermost supporting dummy substrate 402H. In some embodiments, as shown in FIG. 2G, a plurality of top dummy pads 326 may be formed on the top surface of the uppermost supporting dummy substrate 402H.

Figure 11B:
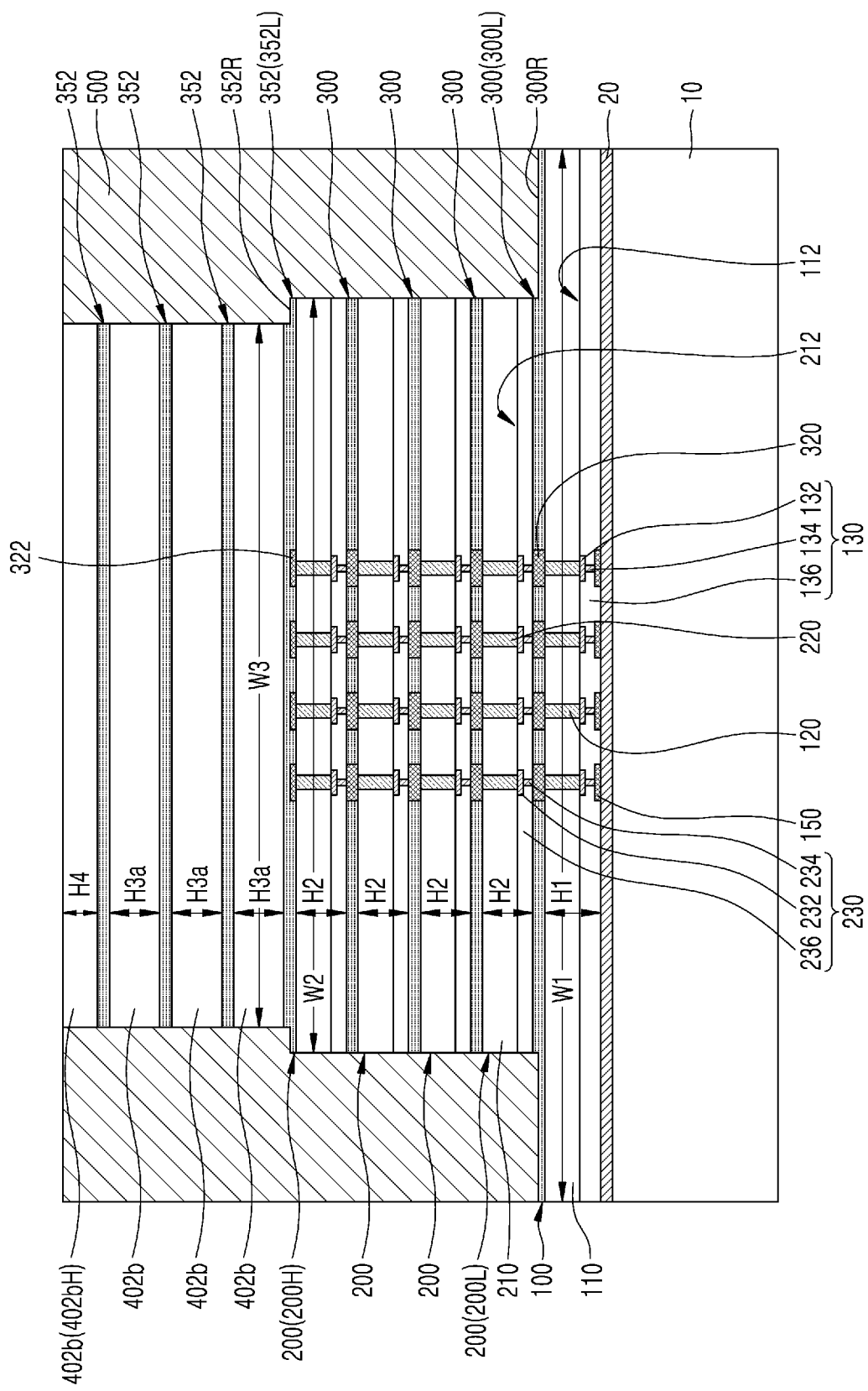

FIGS. 11A and 11B are cross-sectional views of a method of manufacturing a semiconductor package, according to embodiments. For example, FIGS. 11A and 11B are cross-sectional views of a method of manufacturing the semiconductor package 1004 of FIG. 3A, and to the extent that a detailed description of an element has been omitted, it may be assumed that the element is at least similar to corresponding elements that have been described elsewhere within the specification.

Referring to FIG. 11A, a plurality of supporting dummy substrates 402b may be attached to the uppermost second semiconductor chip 200H using the method described with reference to FIGS. 8A to 8D. The supporting dummy substrates 402b in FIG. 11A may be substantially the same as those in FIG. 7D.

Thereafter, a preliminary package molding layer 500P may be formed on the first semiconductor chip 100 to cover the top surface of the first semiconductor chip 100 and at least partially surrounding the side surfaces of the second semiconductor chips 200 and the side and top surfaces of the supporting dummy substrates 402b.

Referring to FIGS. 11A and 11B, the package molding layer 500 is formed by removing an upper portion of the preliminary package molding layer 500P. The package molding layer 500 may be formed by removing an upper portion of the preliminary package molding layer 500P using a grinding process.

In some embodiments, during the grinding process for the formation of the package molding layer 500, an upper portion of the uppermost supporting dummy substrate 402bH may also be removed. Accordingly, the fourth vertical height H4 of the uppermost supporting dummy substrate 402bH may be less than the third vertical height H3a of the other supporting dummy substrates 402b.

Thereafter, the semiconductor package 1004 of FIG. 3A may be formed using the method described with reference to FIGS. 5G to 5I.

The semiconductor package 1006 of FIG. 4A may be formed using the method of FIGS. 8A to 8D such that the fourth vertical height H4a of the uppermost supporting dummy substrate 404H among a plurality of supporting dummy substrates 404 is greater than the third vertical height H3a of the other supporting dummy substrates 404. The semiconductor package 1006a of FIG. 4B may be formed using the method of FIGS. 6A and 6B.

Figure 12:
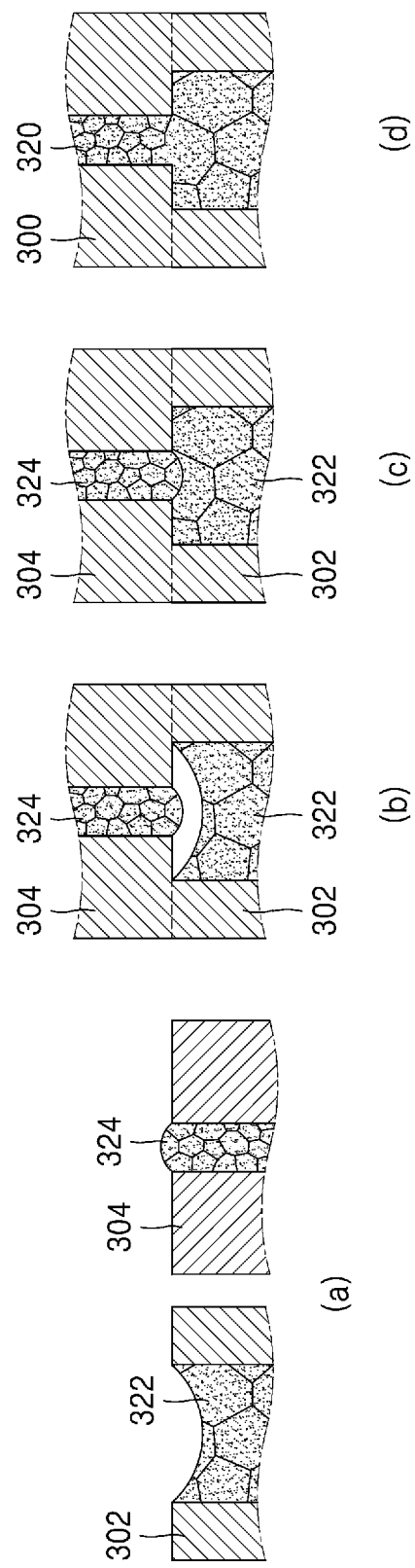
FIGS. 12 to 14 are conceptual cross-sectional views of a process of forming a bonding pad in a method of manufacturing a semiconductor package, according to an embodiment.
Figure 13:
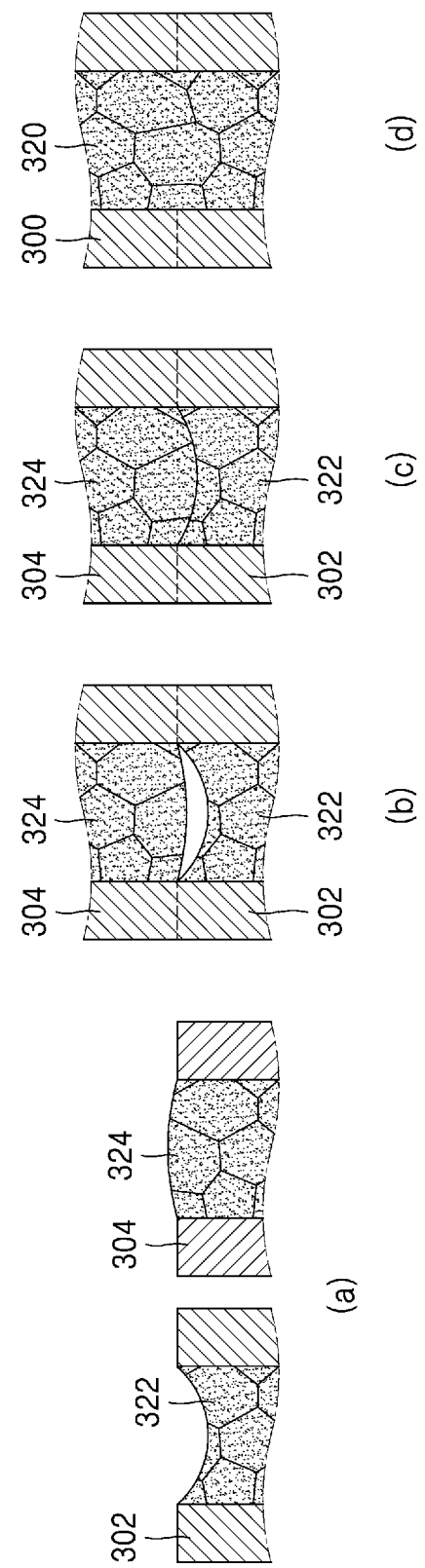
Figure 14:
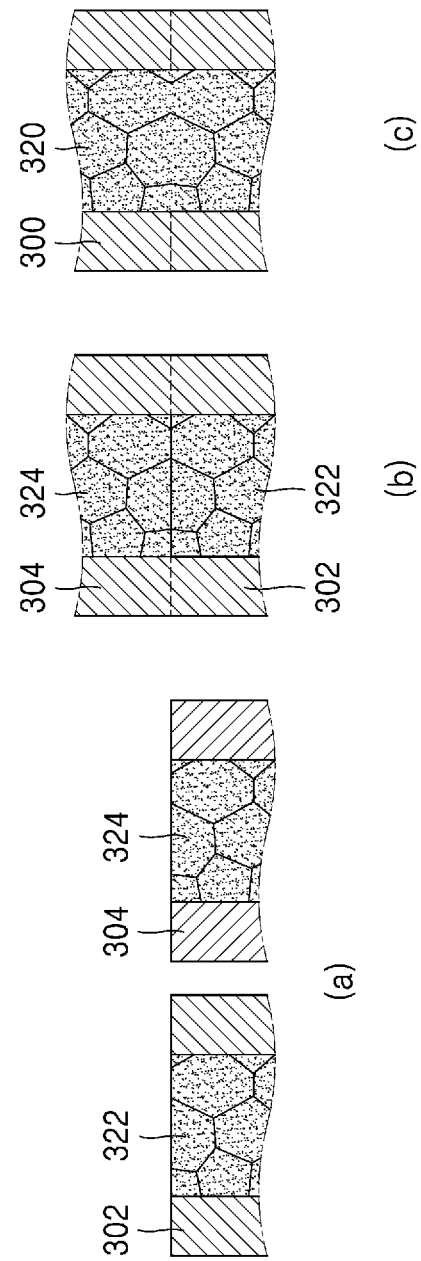

FIGS. 12 to 14 are conceptual cross-sectional views of a process of forming a coupling pad in a method of manufacturing a semiconductor package, according to an embodiment.

As shown in (a) of FIG. 12, a top chip connection pad 322 may have a different horizontal width than a bottom chip connection pad 324. The conditions of a planarization process for the formation of the top chip connection pad 322 and the bottom chip connection pad 324 may be controlled such that the top surface of one of the top chip connection pad 322 and the bottom chip connection pad 324 is convex and the top surface of the other of the top chip connection pad 322 and the bottom chip connection pad 324 is concave. When heat at the first temperature is applied, a top chip coupling insulation material layer 302 may contact the bottom chip coupling insulation material layer 304, as shown in (b) of FIG. 12. When heat at the second temperature is applied, the top chip connection pad 322 and the bottom chip connection pad 324 may expand to contact each other, as shown in (c) of FIG. 12, and may then be integrated into a coupling pad 320 through diffusion of metal atoms of the top and bottom chip connection pads 322 and 324, as shown in (d) of FIG. 12.

The top chip coupling insulation material layer 302 and the bottom chip coupling insulation material layer 304 may be covalently bonded to each other and integrated into a chip coupling insulation layer 300. A thermal coupling pad 320a and a dummy coupling pad 320b may be formed by a method that is substantially the same as the method of forming the coupling pad 320, and supporting coupling insulation layers 350, 350a, 352, and 352a may be formed by a method that is substantially the same as the method of forming the chip coupling insulation layer 300.

As shown in (a) of FIG. 13, the top chip connection pad 322 may have the same horizontal width as the bottom chip connection pad 324. The conditions of a planarization process for the formation of the top chip connection pad 322 and the bottom chip connection pad 324 may be controlled such that the top surface of one of the top chip connection pad 322 and the bottom chip connection pad 324 is convex and the top surface of the other of the top chip connection pad 322 and the bottom chip connection pad 324 is concave. When heat at the first temperature is applied, the top chip coupling insulation material layer 302 may contact the bottom chip coupling insulation material layer 304, as shown in (b) of FIG. 13. When heat at the second temperature is applied, the top chip connection pad 322 and the bottom chip connection pad 324 may expand to contact each other, as shown in (c) of FIG. 13, and may then be integrated into the coupling pad 320 through the diffusion of metal atoms of the top and bottom chip connection pads 322 and 324, as shown in (d) of FIG. 13.

The top chip coupling insulation material layer 302 and the bottom chip coupling insulation material layer 304 may be covalently bonded to each other and integrated into the chip coupling insulation layer 300.

As shown in (a) of FIG. 14, the top surface of the top chip connection pad 322 may be coplanar with the top surface of the top chip coupling insulation material layer 302, and the top surface of the bottom chip connection pad 324 may be coplanar with the top surface of the bottom chip coupling insulation material layer 304. In some embodiments, the top chip connection pad 322 may have the same horizontal width as the bottom chip connection pad 324. In some embodiments, the top chip connection pad 322 may have a different horizontal width than the bottom chip connection pad 324. When heat at the first temperature is applied, the top chip coupling insulation material layer 302 may contact the bottom chip coupling insulation material layer 304, as shown in (b) of FIG. 14. When heat at the second temperature is applied, the top chip connection pad 322 and the bottom chip connection pad 324 may be diffusion bonded to each other through diffusion of metal atoms of the top and bottom chip connection pads 322 and 324 and may thus be integrated into the coupling pad 320, as shown in (c) of FIG. 14.

The top chip coupling insulation material layer 302 and the bottom chip coupling insulation material layer 304 may be covalently bonded to each other and integrated into the chip coupling insulation layer 300.

Figure 15:
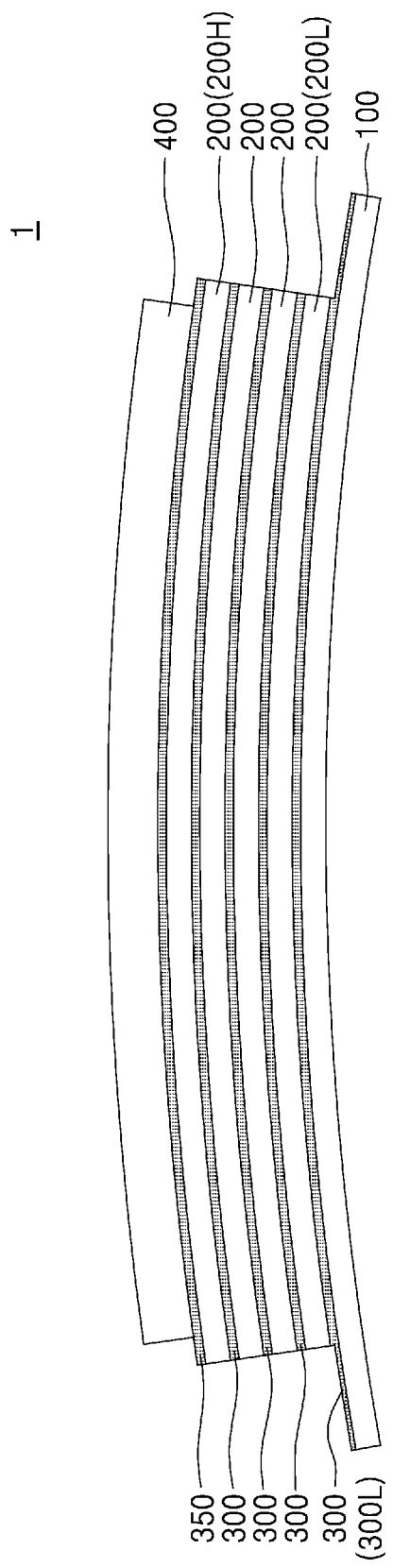
FIG. 15 is a conceptual diagram of the shape of a semiconductor package according to an embodiment.

FIG. 15 is a conceptual diagram of the shape of a semiconductor package according to an embodiment.

Referring to FIG. 15, a semiconductor package 1 may include the first semiconductor chip 100, a plurality of second semiconductor chips 200 stacked on the first semiconductor chip 100, and a supporting dummy substrate 400 attached to the uppermost second semiconductor chip 200H. A chip coupling insulation layer 300 may be disposed between the first semiconductor chip 100 and the lowermost second semiconductor chip 200L and a chip coupling insulation layer 300 may be disposed between two adjacent second semiconductor chips 200. The supporting coupling insulation layer 350 may be disposed between the uppermost second semiconductor chip 200H and the supporting dummy substrate 400.

Instead of including the supporting dummy substrate 400, the semiconductor package 1 may include the supporting dummy substrate 400a in FIGS. 1B and 1D, a plurality of supporting dummy substrates 402 in FIGS. 2A, 2C, 2E, and 2G, a plurality of supporting dummy substrates 402a in FIGS. 2B, 2D, 2F, and 2H, a plurality of supporting dummy substrates 402b in FIGS. 3A, 3C, and 3E, a plurality of supporting dummy substrates 402c in FIGS. 3B, 3D, and 3F, a plurality of supporting dummy substrates 404 in FIGS. 4A, 4C, 4E, and 4G, or a plurality of supporting dummy substrates 404a in FIGS. 4B, 4D, 4F, and 4H; and, instead of the supporting coupling insulation layer 350, the supporting coupling insulation layer 350a in FIGS. 1B and 1D, the supporting coupling insulation layer 352 in FIGS. 2A, 2C, 2E, 2G, 3A, 3C, 3E, 4A, 4C, 4E, and 4G or the supporting coupling insulation layer 352a in FIGS. 2B, 2D, 2F, 2H, 3B, 3D, 3F, 4B, 4D, 4F, and 4H.

In the semiconductor package 1, the first semiconductor chip 100 includes a plurality of first through electrodes 120, each of all the second semiconductor chips 200 including the uppermost second semiconductor chip 200H includes a plurality of second through electrodes 220 as shown in FIGS. 1A to 4H, a plurality of coupling pads 320 are arranged among the first semiconductor chip 100 and the second semiconductor chips 200, and a plurality of thermal coupling pads 320a similar to the coupling pads 320 are disposed between the uppermost second semiconductor chip 200H and the supporting dummy substrate 400. Accordingly, even when warpage occurs in the first semiconductor chip 100 and the second semiconductor chips 200, the first semiconductor chip 100 and the second semiconductor chips 200 may have the same warpage shape bulging in one direction. For example, the first semiconductor chip 100 and the second semiconductor chips 200 may have substantially the same warpage shape bulging upwards, i.e., in a direction from the first semiconductor chip 100 to the second semiconductor chips 200. Accordingly, connection reliability between the first semiconductor chip 100 and the second semiconductor chips 200 may be increased.

While the inventive concept has been particularly shown and described with reference to embodiments thereof, it will be understood that various changes in form and details may be made therein without departing from the spirit and scope of the present disclosure.

What is claimed is:

1. A semiconductor package, comprising:
a first semiconductor chip including a first semiconductor substrate and a plurality of first through electrodes, the first semiconductor substrate having an active surface and an inactive surface, and the plurality of first through electrodes passing through the first semiconductor substrate;
a plurality of second semiconductor chips each including a second semiconductor substrate and a plurality of second through electrodes, the second semiconductor substrate having an active surface and an inactive surface, and the plurality of second through electrodes passing through the second semiconductor substrate, the plurality of second semiconductor chips being stacked on the first semiconductor chip and having a same vertical height as each other, wherein the active surface of the second semiconductor substrate faces the inactive surface of the first semiconductor substrate;
a plurality of coupling pads disposed between the first semiconductor chip and the plurality of second semiconductor chips and configured to electrically connect the plurality of first through electrodes to the plurality of second through electrodes;
a plurality of chip coupling insulation layers disposed between the first semiconductor chip and the plurality of second semiconductor chips and at least partially surrounding the plurality of coupling pads;
at least one supporting dummy substrate stacked on the plurality of second semiconductor chips; and
at least one supporting coupling insulation layer disposed on a bottom surface of the at least one supporting dummy substrate,
wherein each of the plurality of second semiconductor chips has a same warpage shape that bulges in one direction.

2. The semiconductor package of claim 1, further comprising a plurality of top chip connection pads disposed on a top surface of an uppermost second semiconductor chip among the plurality of second semiconductor chips,
wherein a supporting coupling insulation layer among the at least one supporting coupling insulation layer covers the top surface of the uppermost second semiconductor chip and side and top surfaces of the plurality of top chip connection pads.

3. The semiconductor package of claim 1, further comprising a plurality of thermal coupling pads disposed between a top surface of an uppermost second semiconductor chip among the plurality of second semiconductor chips and the bottom surface of the at least one supporting dummy substrate facing the top surface of the uppermost second semiconductor chip,
wherein top surfaces of the plurality of thermal coupling pads are in contact with the bottom surface of the at least one supporting dummy substrate, and bottom surfaces of the plurality of thermal coupling pads are in contact with the plurality of second through electrodes of the uppermost second semiconductor chip.

4. The semiconductor package of claim 1, wherein a total vertical height of the at least one supporting dummy substrate is greater than a vertical height of each of the first semiconductor chip and the plurality of second semiconductor chips.

5. The semiconductor package of claim 4, wherein the at least one supporting dummy substrate includes a plurality of supporting dummy substrates stacked on the plurality of second semiconductor chips, and wherein a vertical height of each of the plurality of supporting dummy substrates is less than or equal to the vertical height of each of the first semiconductor chip and the plurality of second semiconductor chips.

6. The semiconductor package of claim 5, further comprising a plurality of dummy coupling pads disposed between the plurality of supporting dummy substrates,
wherein bottom and top surfaces of each of the plurality of dummy coupling pads are respectively in contact with respective facing top and bottom surfaces of the plurality of supporting dummy substrates, and
wherein the at least one supporting coupling insulation layer covers side surfaces of the plurality of dummy coupling pads.

7. The semiconductor package of claim 6, further comprising a plurality of top dummy pads disposed on a top surface of an uppermost supporting dummy substrate among the plurality of supporting dummy substrates.

8. The semiconductor package of claim 1, wherein a horizontal width of each of the plurality of second semiconductor chips is less than a horizontal width of the first semiconductor chip, and
wherein a horizontal width of the at least one supporting dummy substrate is less than the horizontal width of each of the plurality of second semiconductor chips.

9. The semiconductor package of claim 8, wherein a supporting coupling insulation layer among the at least one supporting coupling insulation layer covers a top surface of an uppermost second semiconductor chip among the plurality of second semiconductor chips, and
wherein a thickness of a portion of the at least one supporting coupling insulation layer overlapping the at least one supporting dummy substrate in a vertical direction is greater than a thickness of a portion of the at least one supporting coupling insulation layer not overlapping the at least one supporting dummy substrate in the vertical direction.

10. The semiconductor package of claim 8, wherein a chip coupling insulation layer among the plurality of chip coupling insulation layers covers a top surface of the first semiconductor chip, and
wherein a thickness of a portion of the first semiconductor chip overlapping the plurality of second semiconductor chips in a vertical direction is greater than a thickness of a portion of the first semiconductor chip not overlapping the plurality of second semiconductor chips in the vertical direction.

11. A semiconductor package, comprising:
a high-bandwidth memory (HBM) controller die including a first semiconductor substrate and a plurality of first through electrodes, the first semiconductor substrate having an active surface and an inactive surface, and the plurality of first through electrodes passing through at least a portion of the first semiconductor substrate;
a plurality of dynamic random access memory (DRAM) dies each including a second semiconductor substrate and a plurality of second through electrodes, the second semiconductor substrate having an active surface and an inactive surface, and the plurality of second through electrodes passing through the second semiconductor substrate, the plurality of DRAM dies being stacked on the HBM controller die and having a same vertical height as each other, wherein the active surface of the second semiconductor substrate faces the inactive surface of the first semiconductor substrate;
a plurality of coupling pads disposed between the HBM controller die and the plurality of DRAM dies and configured to electrically connect the plurality of first through electrodes to the plurality of second through electrodes;
a plurality of chip coupling insulation layers disposed between the HBM controller die and the plurality of DRAM dies and at least partially surrounding the plurality of coupling pads;
a supporting dummy substrate stacked on the plurality of DRAM dies;
a supporting coupling insulation layer disposed on a bottom surface of the supporting dummy substrate; and
a plurality of top chip connection pads disposed on a top surface of an uppermost DRAM die among the plurality of DRAM dies, the plurality of top chip connection pads being in contact with the plurality of second through electrodes of the uppermost DRAM die and being at least partially surrounded by the supporting coupling insulation layer covering the top surface of the uppermost DRAM die.

12. The semiconductor package of claim 11, wherein the plurality of top chip connection pads are separated from the supporting dummy substrate with the supporting coupling insulation layer disposed between the plurality of top chip connection pads and the supporting dummy substrate.

13. The semiconductor package of claim 11, wherein a horizontal width of each of the plurality of DRAM dies is less than a horizontal width of the HBM controller die, and
wherein a chip coupling insulation layer among the plurality of chip coupling insulation layers covers a top surface of the HBM controller die and has a flat bottom surface and a central portion protruding upwards from an edge portion thereof.

14. The semiconductor package of claim 11, wherein a horizontal width of the supporting dummy substrate is less than a horizontal width of each of the plurality of DRAM dies, and
wherein the supporting coupling insulation layer has a flat bottom surface and a central portion protruding upwards from an edge portion thereof.

15. The semiconductor package of claim 11, wherein the supporting dummy substrate is a part of a bare wafer including a semiconductor material, and
wherein a top surface of the supporting coupling insulation layer is in contact with only the semiconductor material.

16. The semiconductor package of claim 11, wherein the HBM controller die and the plurality of DRAM dies have a same warpage shape that bulges in a direction from the HBM controller die to the plurality of DRAM dies.

17. A semiconductor package, comprising:
a base redistribution layer including a plurality of package redistribution line patterns, a plurality of package redistribution vias respectively in contact with and connected to at least two of the plurality of package redistribution line patterns, and a package redistribution insulation layer at least partially surrounding the plurality of package redistribution line patterns and the plurality of package redistribution vias;
a high-bandwidth memory (HBM) controller die including a first semiconductor substrate and a plurality of first through electrodes, the first semiconductor substrate having a first active surface and a first inactive surface, and the plurality of first through electrodes passing through the first semiconductor substrate, the HBM controller die being disposed on the base redistribution layer, wherein the first active surface of the first semiconductor substrate faces the base redistribution layer;

a plurality of dynamic random access memory (DRAM) dies each including a second semiconductor substrate and a plurality of second through electrodes, the second semiconductor substrate having a second active surface and a second inactive surface, and the plurality of second through electrodes passing through the second semiconductor substrate, the plurality of DRAM dies being stacked on the HBM controller die and having a same vertical height as each other and a horizontal width that is less than a horizontal width of the HBM controller die, wherein the second active surface of the second semiconductor substrate faces the first inactive surface of the first semiconductor substrate;

a plurality of coupling pads disposed between the HBM controller die and the plurality of DRAM dies and configured to electrically connect the plurality of first through electrodes to the plurality of second through electrodes;

a plurality of chip coupling insulation layers disposed between the HBM controller die and the plurality of DRAM dies and at least partially surrounding the plurality of coupling pads;

a supporting dummy substrate stacked on an uppermost DRAM die among the plurality of DRAM dies;

a plurality of top chip connection pads disposed on a top surface of the uppermost DRAM die among the plurality of DRAM dies, the plurality of top chip connection pads being in contact with the plurality of second through electrodes of the uppermost DRAM die;

a supporting coupling insulation layer covering the top surface of the uppermost DRAM die, side and top surfaces of the plurality of top chip connection pads, and a bottom surface of the supporting dummy substrate and filling between the uppermost DRAM die and the supporting dummy substrate; and a package molding layer disposed on the HBM controller die, the package molding layer covering a top surface of the HBM controller die, side surfaces of the plurality of DRAM dies, and side surfaces of the supporting dummy substrate and exposing a top surface of the supporting dummy substrate, wherein the HBM controller die and the plurality of DRAM dies have a same warpage shape that bulges in one direction.

18. The semiconductor package of claim 17, wherein the plurality of coupling pads include a material including copper (Cu), and wherein each of the plurality of chip coupling insulation layers and the supporting coupling insulation layer includes silicon oxide.

19. The semiconductor package of claim 17, wherein the vertical height of the plurality of DRAM dies is about 50 μm to about 90 μm, and wherein a thickness of each of the plurality of chip coupling insulation layers and the supporting coupling insulation layer is about 100 nm to about 1 μm.

20. The semiconductor package of claim 17, wherein each of the plurality of coupling pads is formed by diffusion bonding.

* * * * *